(12) United States Patent
Jo et al.

(10) Patent No.: US 12,439,820 B2
(45) Date of Patent: Oct. 7, 2025

(54) ORGANIC ELECTROLUMINESCENCE DEVICE AND AMINE COMPOUND FOR ORGANIC ELECTROLUMINESCENCE DEVICE

(71) Applicant: Samsung Display Co., Ltd., Yongin-si (KR)

(72) Inventors: Sohee Jo, Seoul (KR); Dongjun Kim, Suwon-si (KR); Minji Kim, Hwaseong-si (KR); Eunjae Jeong, Hwaseong-si (KR); Sanghyun Han, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 472 days.

(21) Appl. No.: 16/997,683

(22) Filed: Aug. 19, 2020

(65) Prior Publication Data

US 2021/0175436 A1    Jun. 10, 2021

(30) Foreign Application Priority Data

Dec. 6, 2019  (KR) .......................... 10-2019-0161817

(51) Int. Cl.
*C07C 211/54* (2006.01)
*H10K 50/11* (2023.01)
(Continued)

(52) U.S. Cl.
CPC ........ *H10K 85/6574* (2023.02); *C07C 211/54* (2013.01); *H10K 50/11* (2023.02);
(Continued)

(58) Field of Classification Search
CPC ............ H01L 51/0059; H10K 85/6574; H10K 85/631; H10K 85/633; H10K 85/6572; H10K 50/11; H10K 50/15; C07C 211/15
(Continued)

(56) References Cited

U.S. PATENT DOCUMENTS 11,462,691 B2   10/2022  Galan et al.
2002/0038867 A1*  4/2002  Kobori ................. H10K 85/633
                                                      257/40
(Continued)

FOREIGN PATENT DOCUMENTS

CN    101987822 A  *  3/2011
CN    103601614 A     2/2014
(Continued)

OTHER PUBLICATIONS

G. Cheeseman et al., 6 Organic Magnetic Resonance, 430-432 (1974) (Year: 1974).*
(Continued)

*Primary Examiner* — Ruiyun Zhang
(74) *Attorney, Agent, or Firm* — Womble Bond Dickinson (US) LLP

(57) ABSTRACT

An organic electroluminescence device includes a first electrode and a second electrode facing each other, and a plurality of organic layers between the first electrode and the second electrode, wherein at least one of the organic layers includes an amine compound represented by Formula 1 below. The organic electroluminescence device may have improved luminous efficiency.

(Continued)

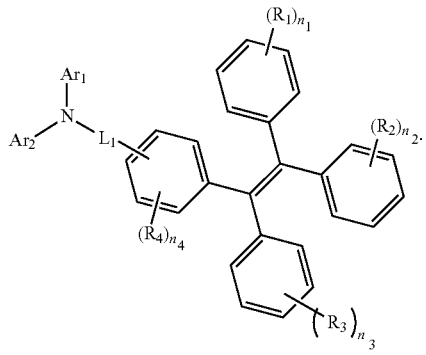

Formula 1

18 Claims, 2 Drawing Sheets

(51) Int. Cl.
*H10K 85/60* (2023.01)
*H10K 50/15* (2023.01)

(52) U.S. Cl.
CPC ......... *H10K 85/631* (2023.02); *H10K 85/633* (2023.02); *H10K 85/6572* (2023.02); *H10K 50/15* (2023.02)

(58) Field of Classification Search
USPC .................................. 257/40; 428/690, 917
See application file for complete search history.

(56) References Cited

U.S. PATENT DOCUMENTS

| | | | | |
|---|---|---|---|---|
| 2002/0136924 A1* | 9/2002 | Higashi | ................ | H01L 51/006 428/917 |
| 2010/0081846 A1* | 4/2010 | Kim | ................ | H05B 33/14 564/429 |
| 2011/0183246 A1 | 7/2011 | Zhu et al. | | |
| 2012/0184755 A1 | 7/2012 | Osaka et al. | | |
| 2012/0299474 A1* | 11/2012 | Tang | ................ | C07D 209/86 546/144 |
| 2013/0113367 A1* | 5/2013 | Jung | ................ | C07D 401/12 546/276.7 |
| 2016/0211470 A1* | 7/2016 | Tang | ................ | C09B 57/00 |
| 2018/0093996 A1* | 4/2018 | Ozturk | ................ | C07D 495/04 |
| 2020/0299290 A1 | 9/2020 | Son et al. | | |

FOREIGN PATENT DOCUMENTS

| | | | | | |
|---|---|---|---|---|---|
| CN | 104031077 | A | | 9/2014 | |
| CN | 104341311 | A | | 2/2015 | |
| CN | 110092858 | A | | 8/2019 | |
| CN | 110128632 | A | * | 8/2019 | .......... C08G 61/124 |
| CN | 110386930 | A | * | 10/2019 | .......... C07D 285/14 |
| JP | 3-4231 | A | | 1/1991 | |
| JP | 2007270153 | A | * | 10/2007 | |
| JP | 2012-158587 | A | | 8/2012 | |
| JP | 2014-129347 | A | | 7/2014 | |
| KR | 10-2013-0142687 | A | | 12/2013 | |
| KR | 10-1973030 | B1 | | 4/2019 | |
| WO | WO 93/06189 | A1 | | 4/1993 | |
| WO | WO 2010/007930 | A1 | | 1/2010 | |
| WO | WO-2014101178 | A1 | * | 7/2014 | .......... C07C 211/54 |
| WO | WO 2015/163817 | A1 | | 10/2015 | |
| WO | WO 2019/072856 | A1 | | 4/2019 | |
| WO | WO 2019/216573 | A1 | | 11/2019 | |

OTHER PUBLICATIONS

T. Strom et al., 87 Journal of the American Chemical Society, 3326-3329 (1965) (Year: 1965).*
IUPAC. Compendium of Chemical Terminology, version 2.3.2. "thio" (the "Gold Book") (2012) (Year: 2012).*
CAS Abstract and Indexed Compounds, B. Tang et al., CN 110386930 (2019) (Year: 2019).*
Partial European Search Report dated Mar. 25, 2021 for corresponding European Patent Application No. EP 20205997.8, 12 pages.
Sohrab Nasiri et al., Carbazole derivatives containing one or two tetra-/triphenylethenyl units as efficient hole-transporting OLED emitters, Dyes and Pigments, 2019, pp. 93-102, vol. 168, Elsevier Ltd.
Extended European Search Report Dated Jun. 8, 2021 for Corresponding European Patent Application No. EP 20205997.8, 17 Pages.
Carrie Y.K. Chan et al., Aggregation-induced emission, mechanochromism and blue electroluminescence of carbazole and triphenylamine-substituted ethenes, Journal of Materials Chemistry C, 2014, pp. 4320-4327, vol. 2, The Royal Society of Chemistry.
Answer 3 of 4 and 4 of 4 Registry Copyright, 2024 ACS on STN, May 22, 2019, 2 pages.
Xu, L., et al. "Highly efficient nondoped blue organic light-emitting diodes based on a star-group tetraphenylethylene-substituted aggregation-induced-emission-active organic fluorescent small molecules", Dyes and Pigments 175, 2020, 8 pages, vol. 108082, Elsevier.
Lin, G., et al., "Improving Electron Mobility of Tetraphenylethene-Based AIEgens to Fabricate Nondoped Organic Light-Emitting Diodes with Remarkably High Luminance and Efficiency", ACS Applied Materials & Interfaces, Jun. 14, 2016, pp. 16799-16808, vol. 8, ACS Publications.

* cited by examiner

ORGANIC ELECTROLUMINESCENCE DEVICE AND AMINE COMPOUND FOR ORGANIC ELECTROLUMINESCENCE DEVICE

CROSS-REFERENCE TO RELATED APPLICATION

This application claims priority to and the benefit of Korean Patent Application No. 10-2019-0161817, filed on Dec. 6, 2019, in the Korean Intellectual Property Office, the entire content of which is hereby incorporated by reference.

BACKGROUND

1. Field

The present disclosure herein relates to an organic electroluminescence device and an amine compound utilized therein.

2. Description of the Related Art

Recently, the development of organic electroluminescence displays, as image display apparatuses, is being actively conducted. Unlike liquid crystal displays and/or the like, organic electroluminescence displays are so-called self-luminescent display apparatuses in which holes and electrons respectively injected from a first electrode and a second electrode recombine in an emission layer, and a luminescent material including an organic compound in the emission layer emits light to thereby implement display.

In the application of an organic electroluminescence display (device) to a display apparatus, an organic electroluminescence device having a low driving voltage, high luminous efficiency, and/or a long life (long lifespan or lifetime) is desired, and development on materials for an organic electroluminescence device capable of stably attaining such characteristic(s) is being continuously pursued.

In addition, materials of a hole transport layer are being developed to implement highly efficient organic electroluminescence devices.

SUMMARY

An aspect according to one or more embodiments is directed toward an organic electroluminescence device having improved luminous efficiency and lifetime.

An aspect according to one or more embodiments is directed toward an amine compound capable of improving luminous efficiency and lifetime of an organic electroluminescence device.

An aspect according to one or more embodiments is directed toward an amine compound utilized as a hole transport material and an organic electroluminescence device including the same.

According to an embodiment of the present disclosure, an organic electroluminescence device includes a first electrode, a second electrode facing the first electrode, and a plurality of organic layers between the first electrode and the second electrode. At least one organic layer of the plurality of organic layers includes an amine compound, the amine compound includes an amine group and a tetraphenylethenyl group substituted in the amine group, and the amine group is linked to one phenyl group included in the tetraphenylethenyl group.

The tetraphenylethenyl group may be bonded through a linker or directly to the amine group.

The plurality of organic layers may include a hole transport region on the first electrode, an emission layer on the hole transport region, and an electron transport region on the emission layer. The hole transport region may include the amine compound.

The hole transport region may include a hole injection layer on the first electrode and a hole transport layer on the hole injection layer. The hole transport layer may include the amine compound.

The hole transport region may include a plurality of organic layers. An organic layer adjacent to the emission layer from among the plurality of organic layers included in the hole transport region may include the amine compound.

An organic electroluminescence device according to an embodiment of the present disclosure includes a first electrode, a second electrode facing the first electrode, and a plurality of organic layers between the first electrode and the second electrode, wherein at least one of the organic layers includes an amine compound represented by Formula 1.

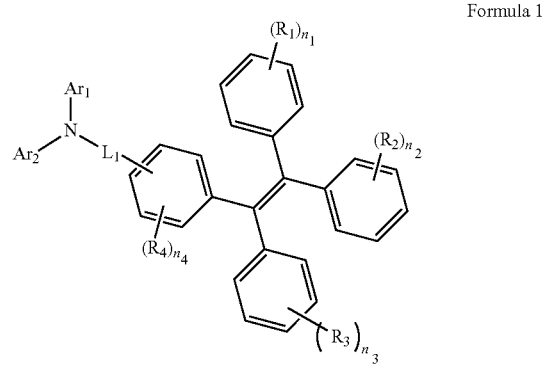

Formula 1

In Formula 1, $Ar_1$ and $Ar_2$ may be each independently a substituted or unsubstituted aryl group having 6 to 30 ring-forming carbon atoms, or a substituted or unsubstituted heteroaryl group having 2 to 30 ring-forming carbon atoms; $L_1$ may be a direct linkage, a substituted or unsubstituted arylene group having 6 to 30 ring-forming carbon atoms, or a substituted or unsubstituted heteroarylene group having 2 to 30 ring-forming carbon atoms; $R_1$ to $R_4$ may be each independently a hydrogen atom, a deuterium atom, a halogen atom, a substituted or unsubstituted alkyl group having 1 to 20 carbon atoms, a substituted or unsubstituted aryl group having 6 to 60 ring-forming carbon atoms, or a substituted or unsubstituted heteroaryl group having 2 to 60 ring-forming carbon atoms; $n_1$ to $n_3$ may be each independently an integer of 0 to 5; and $n_4$ may be an integer of 0 to 4.

The amine compound represented by Formula 1 may be a monoamine compound.

The amine compound represented by Formula 1 may be represented by Formula 2-1 or Formula 2-2.

Formula 2-1

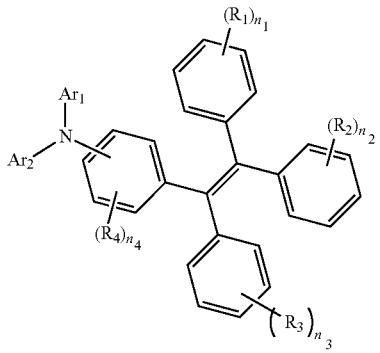

Formula 2-2

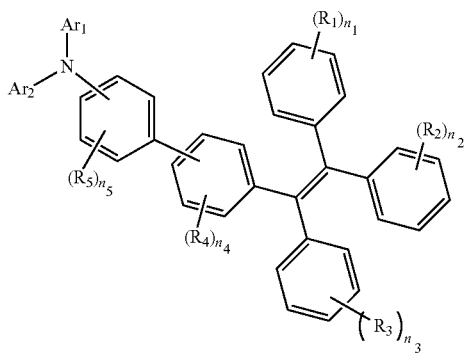

In Formulas 2-1 and 2-2, $R_5$ may be a hydrogen atom, a deuterium atom, a halogen atom, a substituted or unsubstituted alkyl group having 1 to 20 carbon atoms, a substituted or unsubstituted aryl group having 6 to 60 ring-forming carbon atoms, or a substituted or unsubstituted heteroaryl group having 2 to 60 ring-forming carbon atoms, and $n_5$ may be an integer of 0 to 4.

In Formulas 2-1 and 2-2, $Ar_1$ and $Ar_2$, $R_1$ to $R_4$, and $n_1$ to $n_4$ may have the same description as respectively defined in Formula 1.

The amine compound represented by Formula 1 may be represented by any one of Formulas 3-1 to 3-3.

Formula 3-1

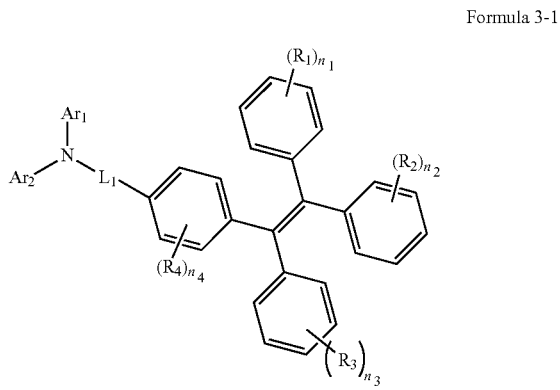

Formula 3-2

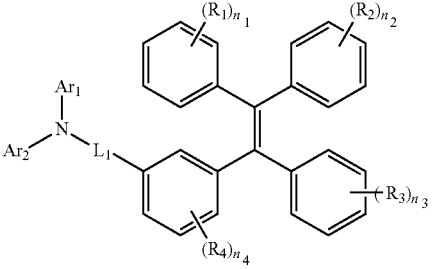

Formula 3-3

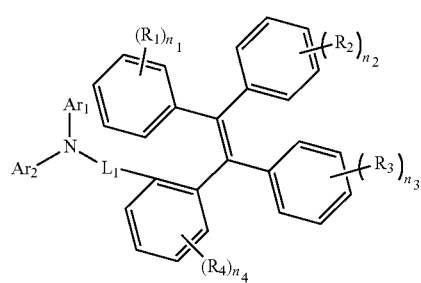

In Formulas 3-1 to 3-3, $Ar_1$ and $Ar_2$, $R_1$ to $R_4$, and $n_1$ to $n_4$ may have the same description as respectively defined in Formula 1.

$Ar_1$ and $Ar_2$ may be each independently a substituted or unsubstituted phenyl group, a substituted or unsubstituted biphenyl group, a substituted or unsubstituted naphthyl group, a substituted or unsubstituted fluorenyl group, a substituted or unsubstituted carbazole group, or a substituted or unsubstituted dibenzofuran group.

$Ar_1$ and $Ar_2$ may be different from each other.

$Ar_1$ may be a substituted or unsubstituted aryl group having 6 to 12 ring-forming carbon atoms, and $Ar_2$ may be a substituted or unsubstituted aryl group in which two or more rings are condensed, or a substituted or unsubstituted heteroaryl group in which two or more rings are condensed.

An amine compound according to an embodiment of the present disclosure may be represented by Formula 1 above.

BRIEF DESCRIPTION OF THE DRAWINGS

The accompanying drawings are included to provide a further understanding of the subject matter of the present disclosure, and are incorporated in and constitute a part of this specification. The drawings illustrate exemplary embodiments of the present disclosure and, together with the description, serve to explain principles of the present disclosure. In the drawings.

DETAILED DESCRIPTION

Figure 1:
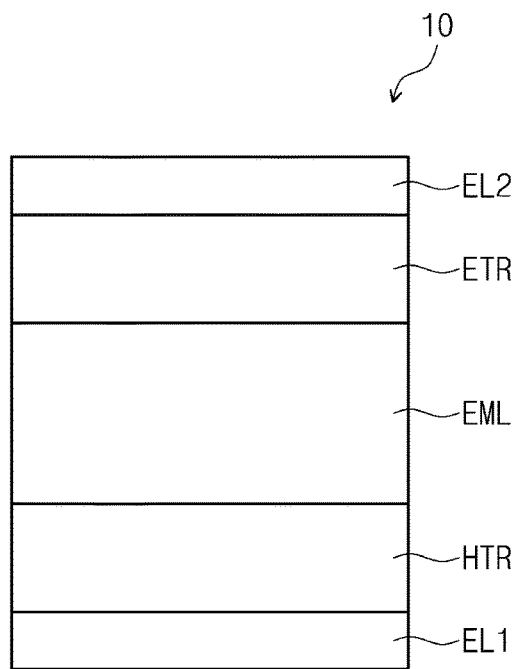
FIG. 1 is a cross-sectional view schematically illustrating an organic electroluminescence device according to an embodiment of the present disclosure.

The subject matter of the present disclosure may have various suitable modifications and may be embodied in different forms, and example embodiments will be explained in more detail with reference to the accompany drawings. The subject matter of the present disclosure may, however, be embodied in different forms and should not be construed as limited to the embodiments set forth herein. Rather, all modifications, equivalents, and substituents which are included in the spirit and technical scope of the present disclosure should be included in the present disclosure.

It will be understood that when an element or layer is referred to as being "on", "connected to" or "coupled to" another element or layer, it can be directly on, connected or coupled to the other element or layer, or intervening elements or layers may be present.

Like numbers refer to like elements throughout. Also, in the drawings, the thickness, the ratio, and the dimensions of elements may be exaggerated for an effective description of technical contents.

The term "and/or" includes all combinations of one or more of which associated configurations may define.

It will be understood that, although the terms "first", "second", etc., may be used herein to describe various elements, these elements should not be limited by these terms. These terms are only used to distinguish one element from another. For example, a first element could be termed a second element, and, similarly, a second element could be termed a first element, without departing from the scope of example embodiments of the present disclosure. The terms of a singular form may include plural forms unless the context clearly indicates otherwise.

In addition, terms such as "below," "lower," "above," "upper," and the like are used to describe the relationship of the configurations shown in the drawings. The terms are used as a relative concept and are described with reference to the direction indicated in the drawings.

Unless otherwise defined, all terms (including technical and scientific terms) used herein have the same meaning as commonly understood by one of ordinary skill in the art to which the present disclosure pertains. It is also to be understood that terms defined in commonly used dictionaries should be interpreted as having meanings consistent with the meanings in the context of the related art, and unless expressly defined herein, they are not to be interpreted in an ideal or overly formal sense.

It should be understood that the terms "comprise", and/or "have" are intended to specify the presence of stated features, integers, steps, operations, elements, components, or combinations thereof in the disclosure, but do not preclude the presence or addition of one or more other features, integers, steps, operations, elements, components, or combinations thereof.

Hereinafter, an organic electroluminescence device according to an embodiment of the present disclosure will be described with reference to the accompanying drawings.

FIGS. 1 to 4 are cross-sectional views, each schematically illustrating an organic electroluminescence device according to an embodiment of the present disclosure. Referring to FIGS. 1 to 4, in an organic electroluminescence device 10 according to an embodiment, a first electrode EL1 and a second electrode EL2 are disposed to face each other, and a plurality of organic layers may be disposed between the first electrode EL1 and the second electrode EL2. The plurality of organic layers may include a hole transport region HTR, an emission layer EML, and an electron transport region ETR. That is, the organic electroluminescence device 10 according to an embodiment may include the first electrode EL1, the hole transport region HTR, the emission layer EML, the electron transport region ETR, and the second electrode EL2 that are sequentially stacked. A capping layer CPL may be further disposed on the second electrode EL2.

The organic electroluminescence device 10 of an embodiment may include an amine compound of an embodiment, which will be described later, in at least one of a plurality of organic layers disposed between the first electrode EL1 and the second electrode EL2. For example, the organic electroluminescence device 10 of an embodiment may include an amine compound of an embodiment, which will be described later, in the emission layer EML disposed between the first electrode EL1 and the second electrode EL2. However, the embodiments of the present disclosure are not limited thereto, and the organic electroluminescence device 10 of an embodiment may include an amine compound according to an embodiment, which will be described later, not only in the emission layer EML, but also in at least one organic layer included in the hole transport region HTR and/or the electron transport region ETR, which are a plurality of organic layers disposed between the first electrode EL1 and the second electrode EL2, or in the capping layer CPL disposed on the second electrode EL2.

Figure 2:
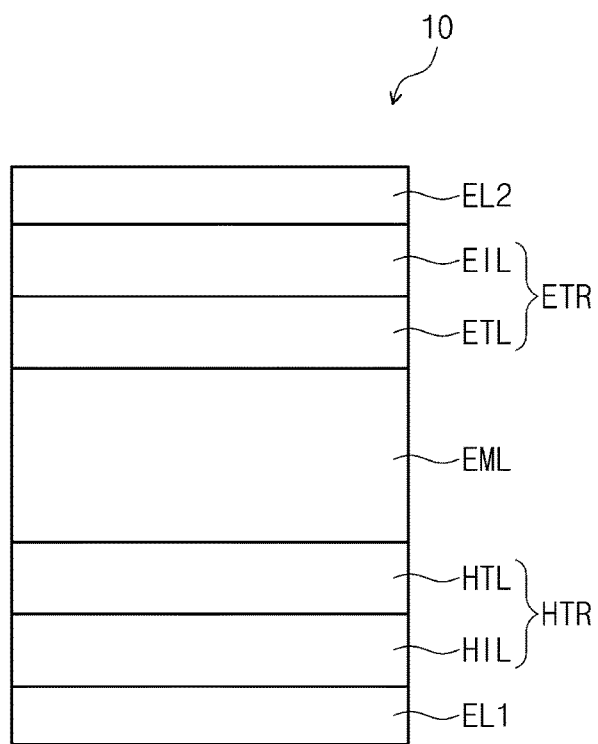
FIG. 2 is a cross-sectional view schematically illustrating an organic electroluminescence device according to an embodiment of the present disclosure.
Figure 3:
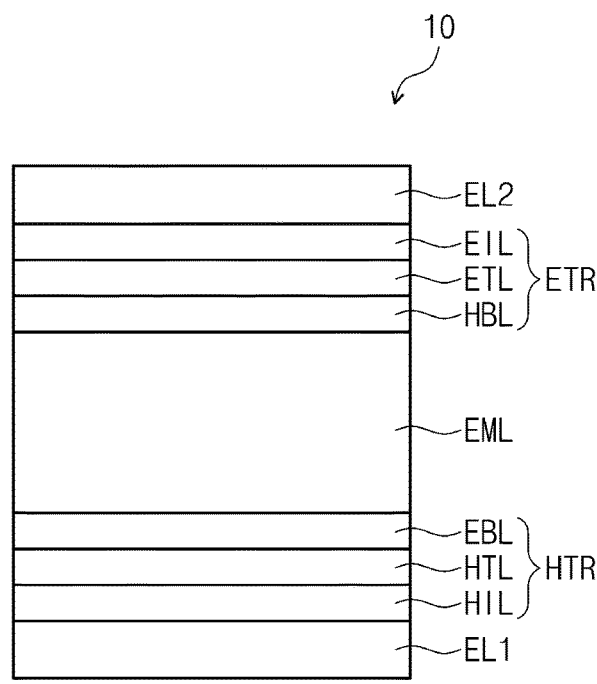
FIG. 3 is a cross-sectional view schematically illustrating an organic electroluminescence device according to an embodiment of the present disclosure.
Figure 4:
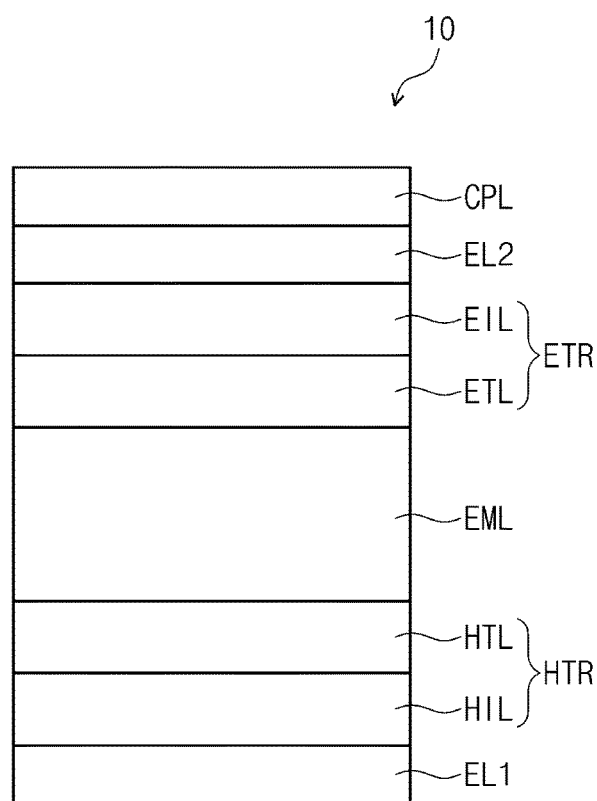
FIG. 4 is a cross-sectional view schematically illustrating an organic electroluminescence device according to an embodiment of the present disclosure.

Compared with FIG. 1, FIG. 2 illustrates a cross-sectional view of an organic electroluminescence device 10 of an embodiment, in which a hole transport region HTR includes a hole injection layer HIL and a hole transport layer HTL, and an electron transport region ETR includes an electron injection layer EIL and an electron transport layer ETL. In addition, compared with FIG. 1, FIG. 3 illustrates a cross-sectional view of an organic electroluminescence device 10 of an embodiment, in which a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. Compared with FIG. 2, FIG. 4 illustrates a cross-sectional view of an organic electroluminescence device 10 of an embodiment including a capping layer CPL disposed on the second electrode EL2.

Hereinafter, the description of the organic electroluminescence device 10 of an embodiment will include an amine compound according to an embodiment, which will be described later, in the hole transport region HTR, but the embodiments of the present disclosure are not limited thereto, and the amine compound according to an embodiment, which will be described later, may be included in the emission layer EML and/or the electron transport region ETR.

The first electrode EL1 may have conductivity. The first electrode EL1 may be formed of a metal alloy or a conductive compound. The first electrode EL1 may be an anode. In addition, the first electrode EL1 may be a pixel electrode. The first electrode EL1 may be a transmissive electrode, a transflective electrode, or a reflective electrode. When the first electrode EL1 is the transmissive electrode, the first electrode EL1 may include a transparent metal oxide such as indium tin oxide (ITO), indium zinc oxide (IZO), zinc oxide (ZnO), and/or indium tin zinc oxide (ITZO). When the first electrode EL1 is the transflective electrode or the reflective electrode, the first electrode EL1 may include silver (Ag), magnesium (Mg), copper (Cu), aluminum (Al), platinum (Pt), palladium (Pd), gold (Au), nickel (Ni), neodymium (Nd), iridium (Ir), chromium (Cr), lithium (Li), calcium (Ca), LiF/Ca, LiF/Al, molybdenum (Mo), titanium (Ti), ytterbium (Yb), a compound thereof, or a mixture thereof (e.g., a mixture of Ag and Mg). In some embodiments, the first electrode EL1 may have a multilayer structure including a reflective film or a transflective film formed of the above-described materials, and a transparent conductive film formed of indium tin oxide (ITO), indium zinc oxide (IZO), zinc oxide (ZnO), indium tin zinc oxide (ITZO), etc. For example, the first electrode EL1 may have a three-layer structure of ITO/Ag/ITO, but the present disclosure is not limited thereto. The thickness of the first electrode EL1 may be from about 1,000 Å to about 10,000 Å, for example, from about 1,000 Å to about 3,000 Å.

The hole transport region HTR is provided on the first electrode EL1. The hole transport region HTR may include a hole injection layer HIL, a hole transport layer HTL, a hole buffer layer, and/or an electron blocking layer EBL. The thickness of the hole transport region HTR may be, for example, from about 50 Å to about 1,500 Å.

The hole transport region HTR may have a single layer formed of a single material, a single layer formed of a plurality of different materials, or a multilayer structure including a plurality of layers formed of a plurality of different materials.

For example, the hole transport region HTR may have a single layer structure of a hole injection layer HIL or a hole transport layer HTL, or may have a single layer structure formed of a hole injection material and a hole transport material. In some embodiments, the hole transport region HTR may have a single layer structure formed of a plurality of different materials, or a structure in which a hole injection layer HIL/hole transport layer HTL, a hole injection layer HIL/hole transport layer HTL/hole buffer layer, a hole injection layer HIL/hole buffer layer, a hole transport layer HTL/hole buffer layer, or a hole injection layer HIL/hole transport layer HTL/electron blocking layer EBL are stacked in the stated order from the first electrode EL1, but the embodiments of the present disclosure are not limited thereto.

The hole transport region HTR may be formed utilizing various suitable methods such as a vacuum deposition method, a spin coating method, a cast method, a Langmuir-Blodgett (LB) method, an inkjet printing method, a laser printing method, and/or a laser induced thermal imaging (LITI) method.

In the organic electroluminescence device 10 of an embodiment, the hole transport region HTR may include an amine compound of an embodiment.

In the description, the term "substituted or unsubstituted" may refer to a state of being unsubstituted, or substituted with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkoxy group, a hydrocarbon ring group, an aryl group, and a heterocyclic group. In addition, each of the example substituents above may be substituted or unsubstituted. For example, a biphenyl group may be interpreted as an aryl group or a phenyl group substituted with a phenyl group.

In the description, the term "bonded to an adjacent group to form a ring" may refer to a state of being bonded to an adjacent group to form a substituted or unsubstituted hydrocarbon ring, or a substituted or unsubstituted heterocycle. The hydrocarbon ring may include an aliphatic hydrocarbon ring and an aromatic hydrocarbon ring. The heterocycle may include an aliphatic heterocycle and an aromatic heterocycle. Rings formed by being bonded to an adjacent group may be monocyclic or polycyclic. In addition, the rings formed by being bonded to each other may be connected to another ring to form a spiro structure.

In the description, the term "an adjacent group" may refer to a substituent substituted for an atom which is directly connected to an atom substituted with a corresponding substituent, another substituent substituted for an atom which is substituted with a corresponding substituent, or a substituent sterically positioned at the nearest position to a corresponding substituent. For example, two methyl groups in 1,2-dimethylbenzene may be interpreted as mutually "adjacent groups" and two ethyl groups in 1,12-diethylcyclopentane may be interpreted as mutually "adjacent groups".

In the description, the term "a direct linkage" may refer to a single bond.

In the description, the term "halogen atom" may refer to a fluorine atom, a chlorine atom, a bromine atom or an iodine atom.

In the description, the term "alkyl group" may refer to a linear, branched or cyclic alkyl group. The number of carbon atoms in the alkyl group may be 1 to 50, 1 to 30, 1 to 20, 1 to 10, or 1 to 6. Non-limiting examples of the alkyl group may include a methyl group, an ethyl group, an n-propyl group, an isopropyl group, an n-butyl group, an s-butyl group, a t-butyl group, an i-butyl group, a 2-ethylbutyl group, a 3,3-dimethylbutyl group, an n-pentyl group, an i-pentyl group, a neopentyl group, a t-pentyl group, a cyclopentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, a cyclohexyl group, a 4-methylcyclohexyl group, a 4-t-butylcyclohexyl group, an n-heptyl group, a 1-methylheptyl group, a 2,2-dimethylheptyl group, a 2-ethylheptyl group, a 2-butylheptyl group, an n-octyl group, a t-octyl group, a 2-ethyloctyl group, a 2-butyloctyl group, a 2-hexyloctyl group, a 3,7-dimethyloctyl group, a cyclooctyl group, an n-nonyl group, an n-decyl group, an adamantyl group, a 2-ethyldecyl group, a 2-butyldecyl group, a 2-hexyldecyl group, a 2-octyldecyl group, an n-undecyl group, an n-dodecyl group, a 2-ethyldodecyl group, a 2-butyldodecyl group, a 2-hexyldocecyl group, a 2-octyldodecyl group, an n-tridecyl group, an n-tetradecyl group, an n-pentadecyl group, an n-hexadecyl group, a 2-ethylhexadecyl group, a 2-butylhexadecyl group, a 2-hexylhexadecyl group, a 2-octylhexadecyl group, an n-heptadecyl group, an n-octadecyl group, an n-nonadecyl group, an n-eicosyl group, a 2-ethyleicosyl group, a 2-butyleicosyl group, a 2-hexyleicosyl group, a 2-octyleicosyl group, an n-henicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, an n-triacontyl group, etc.

In the description, a hydrocarbon ring may include an aliphatic hydrocarbon ring and an aromatic hydrocarbon ring. A heterocycle may include an aliphatic heterocycle and an aromatic heterocycle. The hydrocarbon ring and the heterocycle may be monocyclic or polycyclic.

In the description, the term "hydrocarbon ring group" may refer to any functional group or substituent derived from an aliphatic hydrocarbon ring, or any functional group or substituent derived from an aromatic hydrocarbon ring. The number of ring-forming carbon atoms in the hydrocarbon ring group may be 5 to 60.

In the description, the term "heterocyclic group" may refer to any functional group or substituent derived from a heterocycle containing at least one hetero atom as a ring-forming atom. The number of ring-forming carbon atoms in the heterocyclic group may be 5 to 60.

In the description, the term "aryl group" may refer to any functional group or substituent derived from an aromatic hydrocarbon ring. The aryl group may be a monocyclic aryl group or a polycyclic aryl group. The number of ring-forming carbon atoms in the aryl group may be 6 to 30, 6 to 20, or 6 to 15. Non-limiting examples of the aryl group may include a phenyl group, a naphthyl group, a fluorenyl group, an anthracenyl group, a phenanthryl group, a biphenyl group, a terphenyl group, a quaterphenyl group, a quinqphenyl group, a sexiphenyl group, a triphenylenyl group, a pyrenyl group, a benzofluoranthenyl group, a chrysenyl group, etc.

In the description, a fluorenyl group may be substituted, and two substituents may be bonded to each other to form a spiro structure. Non-limiting examples of the substituted fluorenyl group are shown below. However, the embodiments of the present disclosure are not limited thereto.

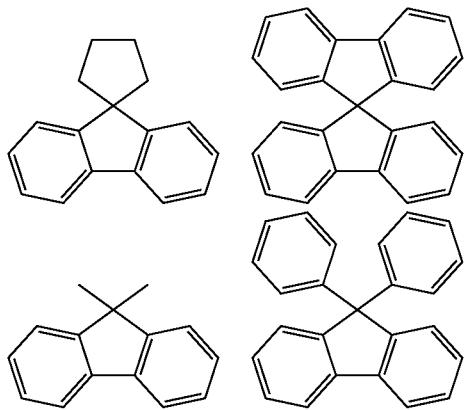

In the description, a heteroaryl group may include B, O, N, P, Si, and/or S as a hetero atom. When the heteroaryl group contains two or more hetero atoms, the two or more hetero atoms may be the same as or different from each other. The heteroaryl group may be a monocyclic heteroaryl group or a polycyclic heteroaryl group. The number of ring-forming carbon atoms in the heteroaryl group may be 2 to 30, 2 to 20, or 2 to 10. Non-limiting examples of the heteroaryl group may include a thiophene group, a furan group, a pyrrole group, an imidazole group, a thiazole group, an oxazole group, an oxadiazole group, a triazole group, a pyridine group, a bipyridine group, a pyrimidine group, a triazine group, a triazole group, an acridyl group, a pyridazine group, a pyrazinyl group, a quinoline group, a quinazoline group, a quinoxaline group, a phenoxazine group, a phthalazine group, a pyrido pyrimidine group, a pyrido pyrazine group, a pyrazino pyrazine group, an isoquinoline group, an indole group, a carbazole group, an N-arylcarbazole group, an N-heteroarylcarbazole group, an N-alkylcarbazole group, a benzoxazole group, a benzoimidazole group, a benzothiazole group, a benzocarbazole group, a benzothiophene group, a dibenzothiophene group, a thienothiophene group, a benzofuran group, a phenanthroline group, a thiazole group, an isoxazole group, an oxazole group, an oxadiazole group, a thiadiazole group, a phenothiazine group, a dibenzosilole group, a dibenzofuran group, etc.

In the description, the above description on the aryl group may be applied to an arylene group, except that the arylene group is a divalent group. The above description on the heteroaryl group may be applied to a heteroarylene group, except that the heteroarylene group is a divalent group.

In the description, an alkenyl group may be linear or branched. Although the number of carbon atoms is not specifically limited, it may be 2 to 30, 2 to 20, or 2 to 10. Non-limiting examples of the alkenyl group may include a vinyl group, a 1-butenyl group, a 1-pentenyl group, a 1,3-butadienyl aryl group, a styrenyl group, a styryl vinyl group, etc.

In the description, a silyl group may include an alkyl silyl group and an aryl silyl group. Non-limiting examples of the silyl group may include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, etc.

In the description, a boron group may include an alkyl boron group and an aryl boron group. Non-limiting examples of the boron group may include a trimethylboron group, a triethylboron group, a t-butyldimethylboron group, a triphenylboron group, a diphenylboron group, a phenylboron group, etc.

In the description, the number of carbon atoms in an amine group is not particularly limited, but may be 1 to 30. The amine group may include an alkyl amine group and an aryl amine group. Non-limiting examples of the amine group may include a methylamine group, a dimethylamine group, a phenylamine group, a diphenylamine group, a naphthylamine group, a 9-methyl-anthracenylamine group, etc.

In the description, a hydrocarbon ring group may be any functional group or substituent derived from an aliphatic hydrocarbon ring. The hydrocarbon ring group may be a saturated hydrocarbon ring group having 5 to 20 ring-forming carbon atoms.

In the description, the heterocyclic group may include B, O, N, P, Si and/or S as a hetero atom. When the heterocyclic group contains two or more hetero atoms, the two or more hetero atoms may be the same as or different from each other. The heterocyclic group may be a monocyclic heterocyclic group or a polycyclic heterocyclic group, and may include a heteroaryl group. The number of ring-forming carbon atoms in the heterocyclic group may be 2 to 30, 2 to 20, or 2 to 10.

An amine compound of an embodiment includes a tetraphenylethenyl group as a substituent. The amine compound of an embodiment includes an amine group and a tetraphenylethenyl group substituted in the amine group (e.g., the amine compound of an embodiment includes a tetraphenylethenyl group substituted amine group). The tetraphenylethenyl group has a structure in which two phenyl groups are substituted in each of the two carbons respectively, centered on ethene. The amine group has a structure linked to one phenyl group included in the tetraphenylethenyl group. The tetraphenylethenyl group included in the amine compound may be directly bonded to the amine group or may be bonded to the amine group through a linker.

An amine compound of an embodiment may be a mono-amine compound. The amine compound may include one (e.g., only one) amine group in the compound structure.

An amine compound of an embodiment may be represented by Formula 1 below.

Formula 1

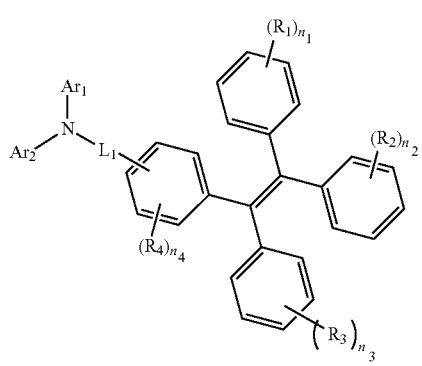

In Formula 1, $Ar_1$ and $Ar_2$ may be each independently a substituted or unsubstituted aryl group having 6 to 30 ring-forming carbon atoms, or a substituted or unsubstituted heteroaryl group having 2 to 30 ring-forming carbon atoms. $Ar_1$ and $Ar_2$ may be each independently a substituted or unsubstituted phenyl group, a substituted or unsubstituted biphenyl group, a substituted or unsubstituted naphthyl group, a substituted or unsubstituted fluorenyl group, a substituted or unsubstituted carbazole group, or a substituted or unsubstituted dibenzofuran group. $Ar_1$ and $Ar_2$ may be different from each other. $Ar_1$ may be a substituted or unsubstituted aryl group having 6 to 12 ring-forming carbon atoms, $Ar_2$ may be a substituted or unsubstituted aryl group in which two or more rings are condensed, or a substituted or unsubstituted heteroaryl group in which two or more rings are condensed. The substituted or unsubstituted aryl group in which two or more rings are condensed may be, for example, a substituted or unsubstituted fluorenyl group. The substituted or unsubstituted heteroaryl group in which two or more rings are condensed may be, for example, a substituted or unsubstituted carbazole group, or a substituted or unsubstituted dibenzofuran group. In an embodiment, $Ar_1$ may be a substituted or unsubstituted phenyl group, a substituted or unsubstituted biphenyl group, or a substituted or unsubstituted naphthyl group; and $Ar_2$ may be a substituted or unsubstituted fluorenyl group, a substituted or unsubstituted carbazole group, or a substituted or unsubstituted dibenzofuran group.

In Formula 1, $L_1$ may be a direct linkage, a substituted or unsubstituted arylene group having 6 to 30 ring-forming carbon atoms, or a substituted or unsubstituted heteroarylene group having 2 to 30 ring-forming carbon atoms. In an embodiment, $L_1$ may be a direct linkage, or a substituted or unsubstituted phenylene group. For example, $L_1$ may be a direct linkage or an unsubstituted phenylene group.

In Formula 1, $R_1$ to $R_4$ may be each independently a hydrogen atom, a deuterium atom, a halogen atom, a substituted or unsubstituted alkyl group having 1 to 20 carbon atoms, a substituted or unsubstituted aryl group having 6 to 60 ring-forming carbon atoms, or a substituted or unsubstituted heteroaryl group having 2 to 60 ring-forming carbon atoms. In Formula 1, a case where each (or any) of $R_1$ to $R_4$ is linked to an adjacent group to form a ring may be excluded. That is, in the amine compound represented by Formula 1, a tetraphenylethenyl moiety may not form an additional ring other than four benzene rings. In an embodiment, $R_1$ to $R_4$ each may be a hydrogen atom.

In Formula 1, $n_1$ to $n_3$ may be each independently an integer of 0 to 5, and $n_4$ may be an integer of 0 to 4. When $n_1$ is 0 in Formula 1, the amine compound of an embodiment may not be substituted with $R_1$. In Formula 1, when $n_1$ is 2 and each $R_1$ is a hydrogen atom, the case may be the same as when $n_1$ is 0 in Formula 1. When $n_1$ is 2 or more in Formula 1, a plurality of $R_1$'s may be the same as or different from each other. When $n_2$ is 0 in Formula 1, the amine compound of an embodiment may not be substituted with $R_2$. In Formula 1, when $n_2$ is 2 and each $R_2$ is a hydrogen atom, the case may be the same as when $n_2$ is 0 in Formula 1. When $n_2$ is 2 or more in Formula 1, a plurality of $R_2$'s may be the same as or different from each other. When $n_3$ is 0 in Formula 1, the amine compound of an embodiment may not be substituted with $R_3$. In Formula 1, when $n_3$ is 2 and each $R_3$ is a hydrogen atom, the case may be the same as when $n_3$ is 0 in Formula 1. When $n_3$ is 2 or more in Formula 1, a plurality of $R_3$'s may be the same as or different from each other. When $n_4$ is 0 in Formula 1, the amine compound of an embodiment may not be substituted with $R_4$. In Formula 1, when $n_4$ is 2 and each $R_4$ is a hydrogen atom, the case may be the same as when $n_4$ is 0 in Formula 1. When $n_4$ is 2 or more in Formula 1, a plurality of $R_4$'s may be the same as or different from each other.

An amine compound of an embodiment includes a tetraphenylethenyl group as a substituent linked to an amine group. The amine compound may include a tetraphenylethenyl group having no additional ring as a substituent. As the amine compound of an embodiment includes a tetraphenylethenyl group as a substituent, the stabilization of the compound structure may improve an intermolecular hole transport capability. Therefore, an organic electroluminescence device including the amine compound of an embodiment as a hole transport material may have a long life because material damage due to extra charge is reduced or prevented, and the organic electroluminescence device may further have high luminous efficiency, low driving voltage, and high luminance.

The amine compound represented by Formula 1 may be represented by Formula 2-1 or Formula 2-2 below.

Formula 2-1

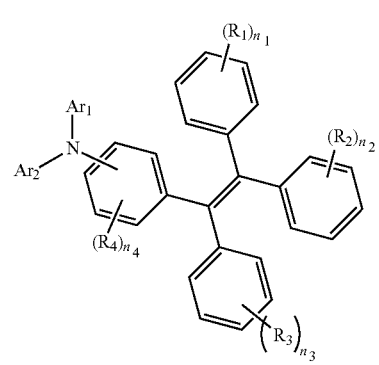

Formula 2-2

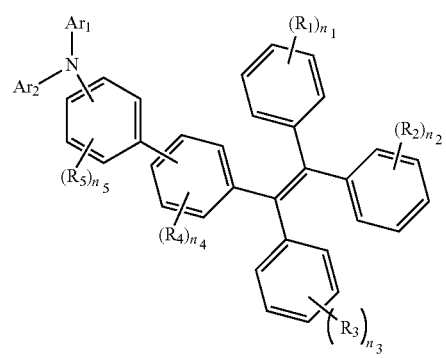

Formula 2-1 is a case where $L_1$ is a direct linkage in Formula 1. Formula 2-2 is a case where $L_1$ is a substituted or unsubstituted phenylene group in Formula 1.

In Formula 2-2, $R_5$ may be a hydrogen atom, a deuterium atom, a halogen atom, a substituted or unsubstituted alkyl group having 1 to 20 carbon atoms, a substituted or unsubstituted aryl group having 6 to 60 ring-forming carbon atoms, or a substituted or unsubstituted heteroaryl group having 2 to 60 ring-forming carbon atoms. In Formula 2-2, a case where $R_5$ is linked to an adjacent group to form a ring may be excluded. In an embodiment, $R_5$ may be a hydrogen atom.

In Formula 2-2, $n_5$ may be an integer of 0 to 4. In Formula 2-2, when $n_5$ is 0, the amine compound of an embodiment may not be substituted with $R_5$. In Formula 2-2, when $n_5$ is 2 and each $R_5$ is a hydrogen atom, the case may be the same as when $n_5$ is 0 in Formula 2-2. When $n_5$ is 2 or more in Formula 2-2, a plurality of $R_5$'s may be the same as or different from each other.

In Formulas 2-1 and 2-2, $Ar_1$ and $Ar_2$, $R_1$ to $R_4$, and $n_1$ to $n_4$ may have the same description as respectively defined in Formula 1 above.

The amine compound represented by Formula 1 may be represented by any one of Formulas 3-1 to 3-3 below.

para-position of the phenyl group. Formula 3-2 is a case where one phenyl group included in a tetraphenylethenyl group in Formula 1 is linked to the amine group (e.g., the N atom of the amine group) at a meta-position of the phenyl group. Formula 3-3 is a case where one phenyl group included in a tetraphenylethenyl group in Formula 1 is linked to the amine group (e.g., the N atom of the amine group) at an ortho-position of the phenyl group.

In Formulas 3-1 to 3-3, $Ar_1$ and $Ar_2$, $R_1$ to $R_4$, and $n_1$ to $n_4$ may have the same description as respectively defined in Formula 1 above.

The amine compound represented by Formula 2-2 may be represented by any one of Formulas 4-1 to 4-3 below.

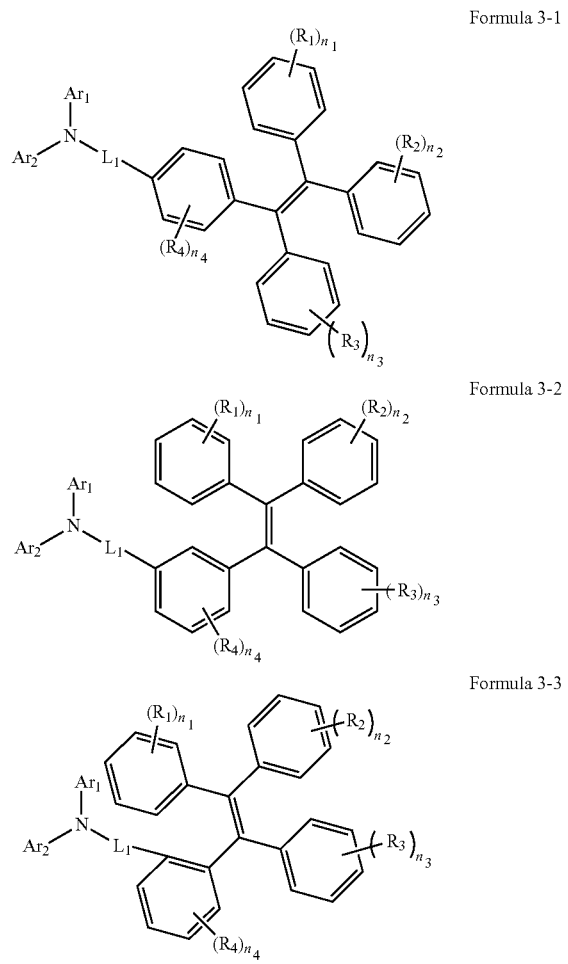

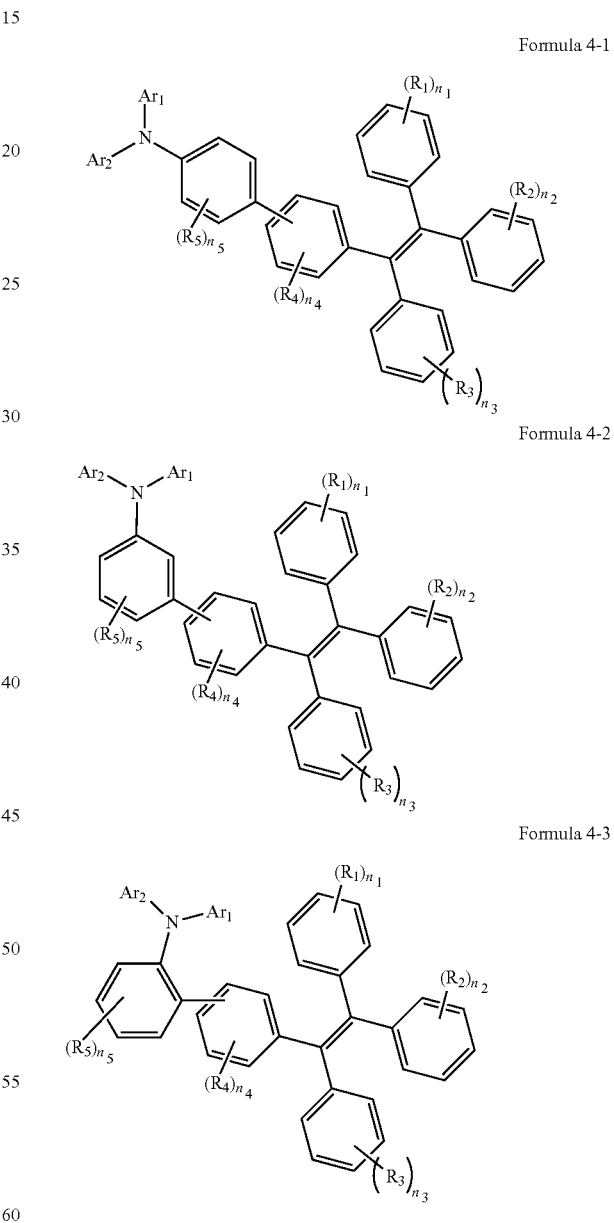

Formula 3-1 is a case where one phenyl group included in a tetraphenylethenyl group in Formula 1 is linked to the amine group (e.g., the N atom of the amine group) at a Formula 4-1 is a case where an amine group and a tetraphenylethenyl group are linked at a para-position of a phenylene linker in Formula 2-2. Formula 4-2 is a case where an amine group and a tetraphenylethenyl group are linked at a meta-position of a phenylene linker in Formula 2-2. Formula 4-3 is a case where an amine group and a tetraphenylethenyl group are linked at an ortho-position of a phenylene linker in Formula 2-2.

In Formulas 4-1 to 4-3, $Ar_1$ and $Ar_2$, $R_1$ to $R_5$, and $n_1$ to $n_5$ may have the same description as respectively defined in Formula 1 and Formula 2-2 above.

An amine compound of an embodiment may be any one of the compounds represented by Compound Group 1 below. In an embodiment, an organic electroluminescence device 10 of an embodiment may include at least one amine compound of the compounds represented by Compound Group 1 in a hole transport region HTR. In an embodiment, an organic electroluminescence device 10 of an embodiment may include at least one amine compound of the compounds represented by Compound Group 1 in a hole transport layer HTL.

Compound Group 1

1
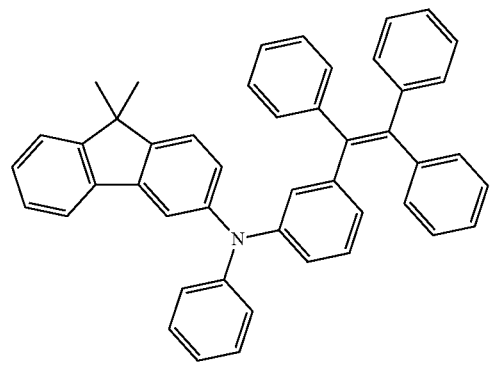

2
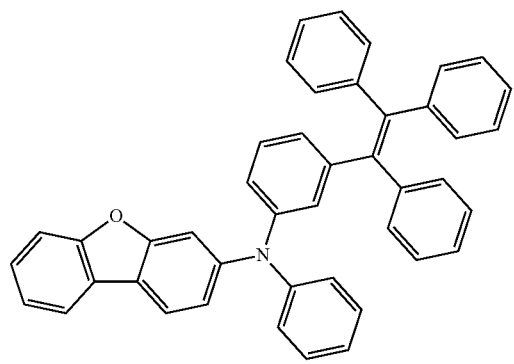

3
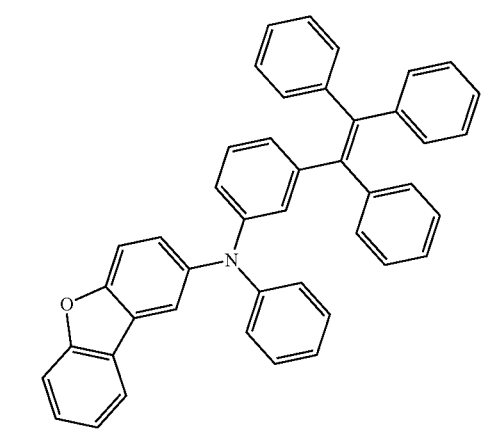

-continued

4
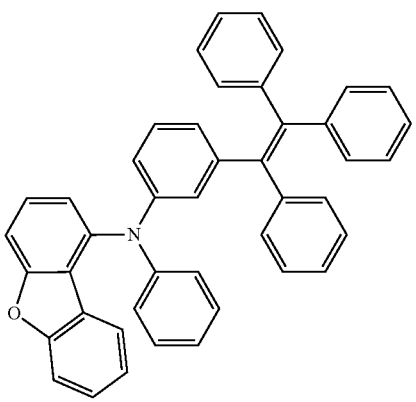

5
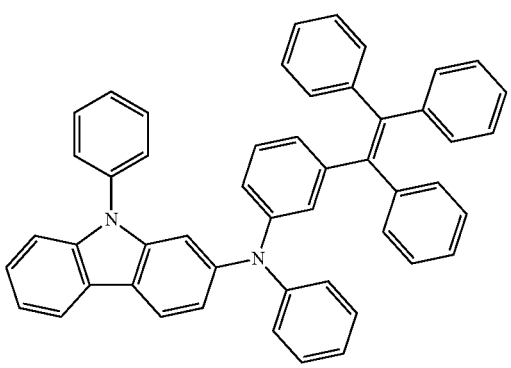

6
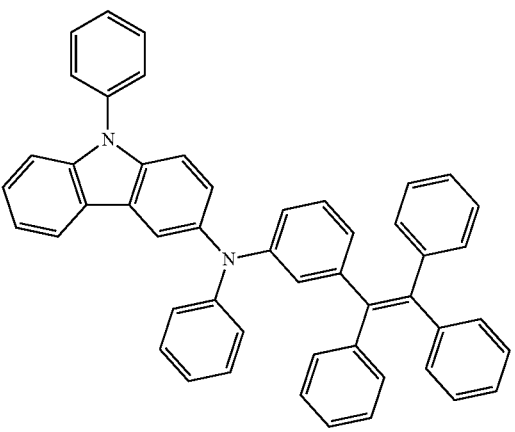

7
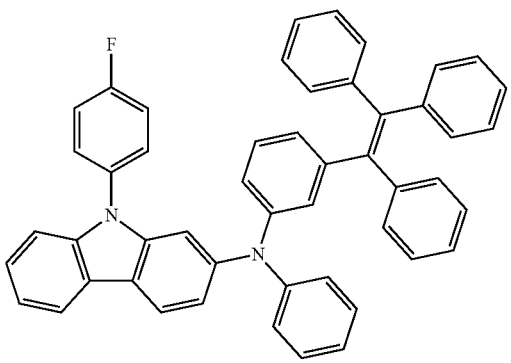

8
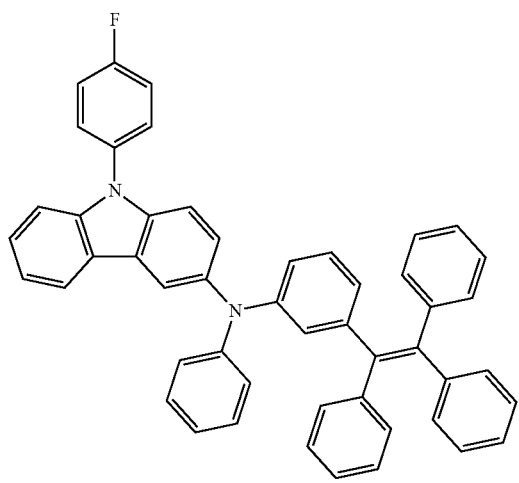
9
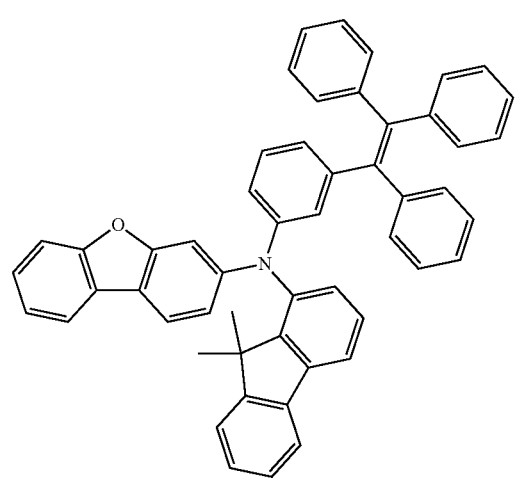
10
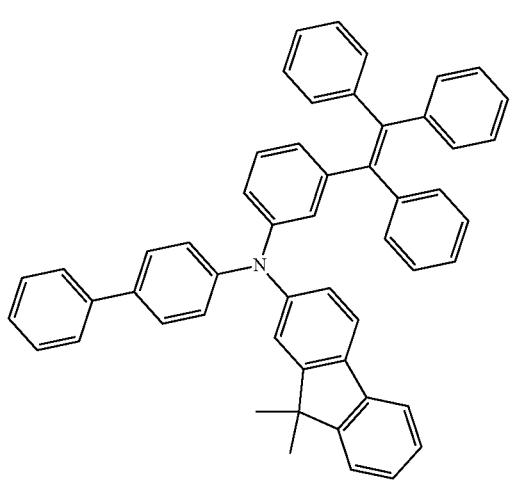
11
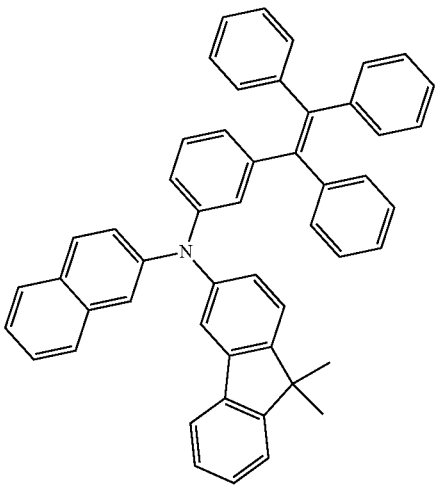
12
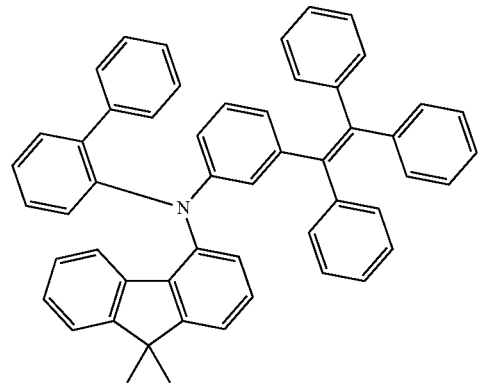
13
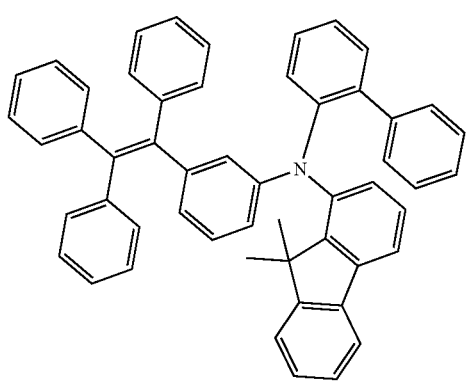

14
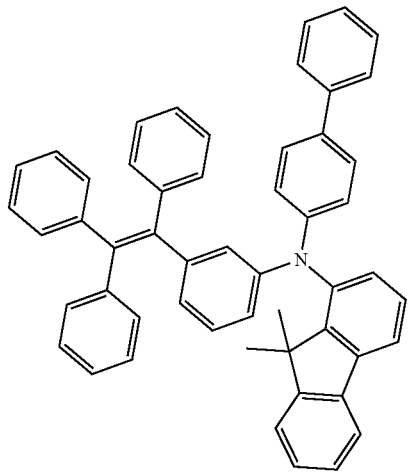
17
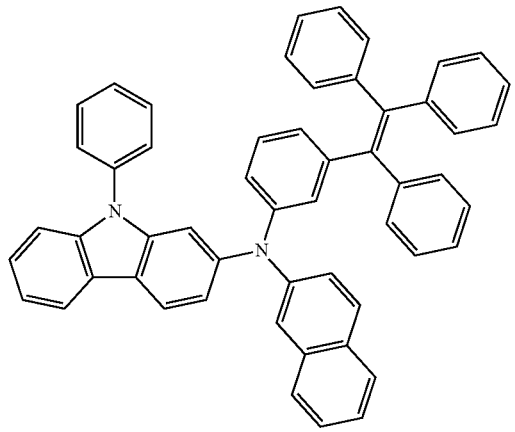
15
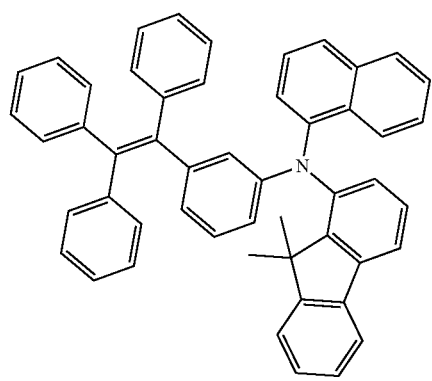
18
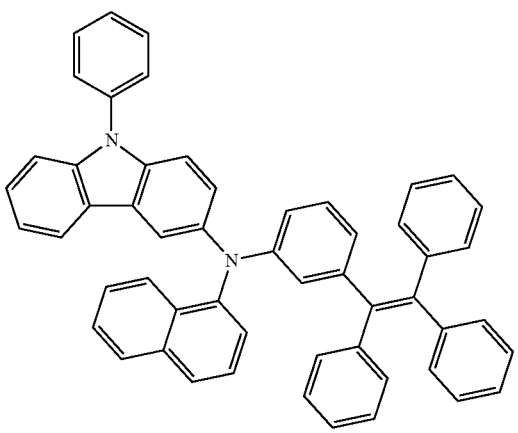
16
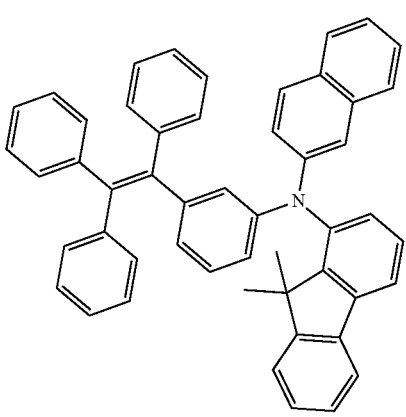 [SMILES: CC1(C)c2ccccc2-c2cccc(N(c3cccc(C(=C(c4ccccc4)c4ccccc4)c4ccccc4)c3)c3ccc4ccccc4c3)c21]
19
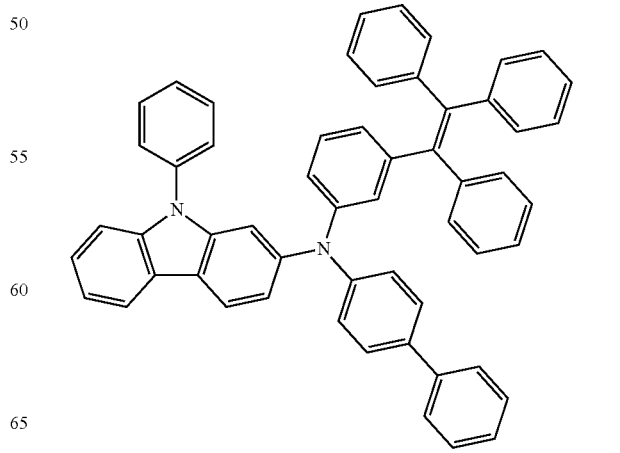

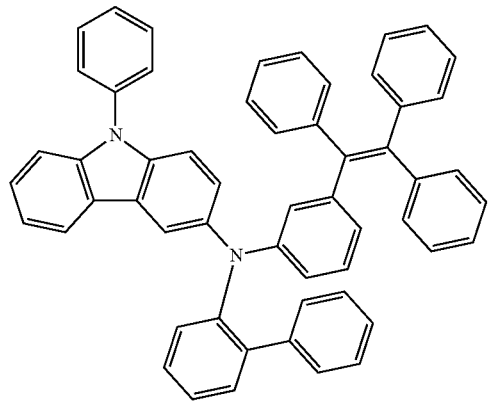
20
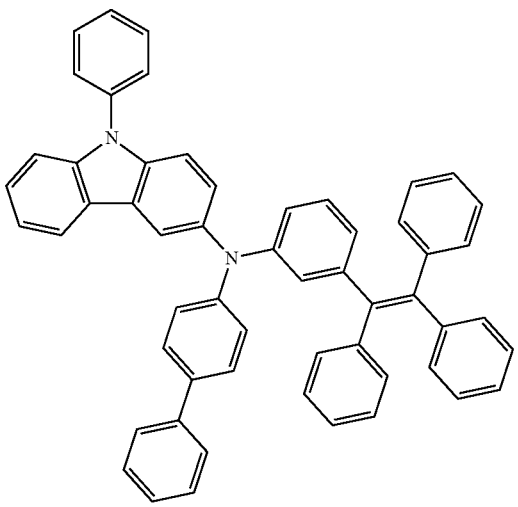
23
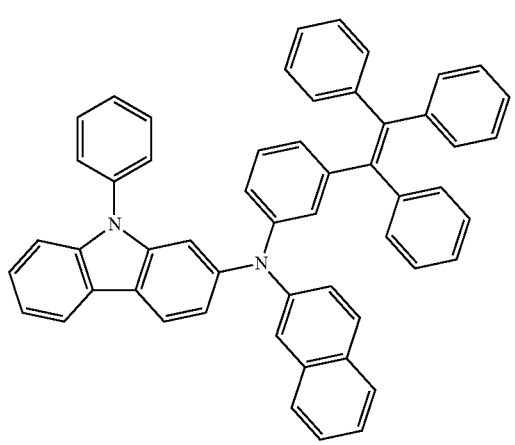
21
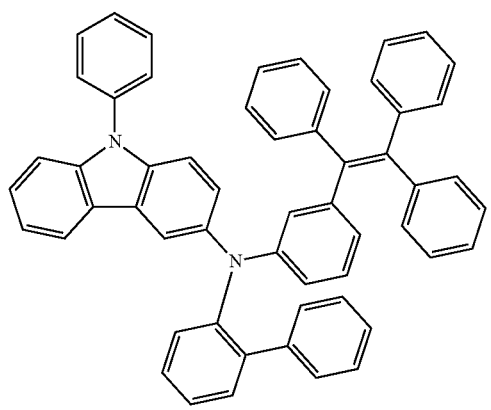
24
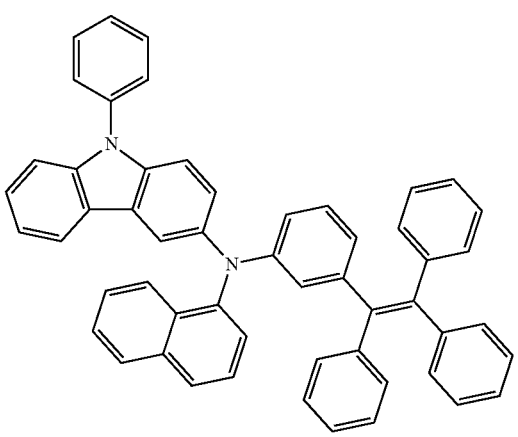
22
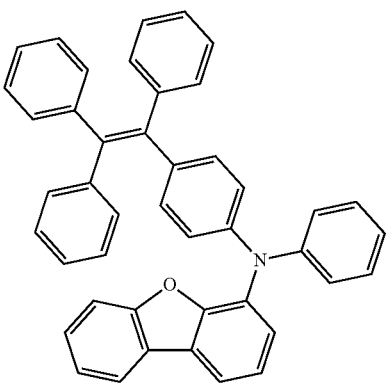
25

26
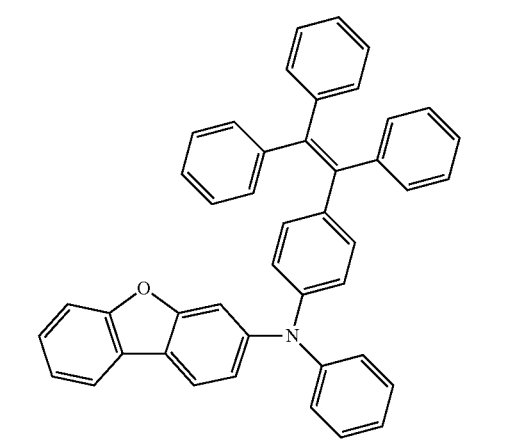
27
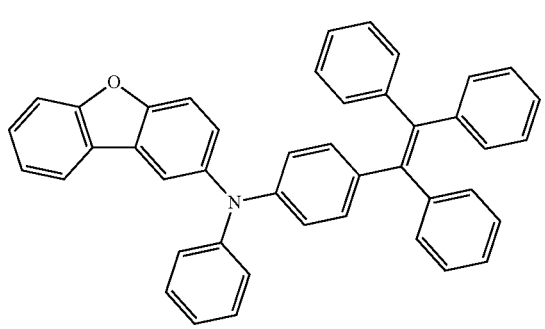
28
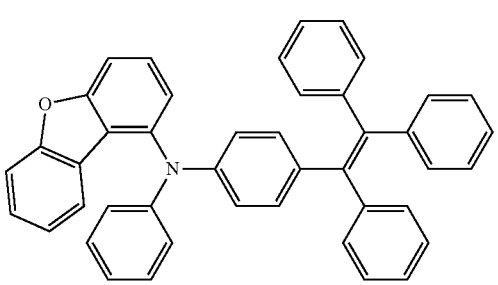
29
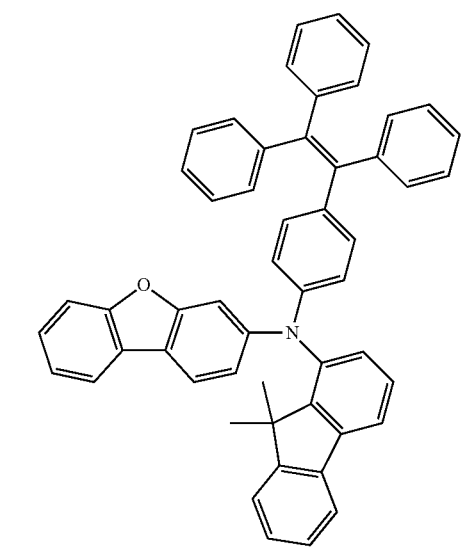
30
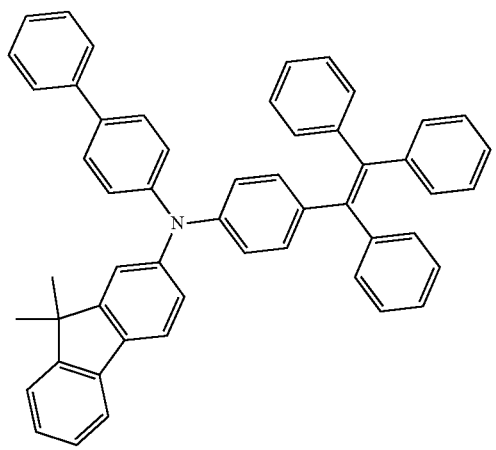
31
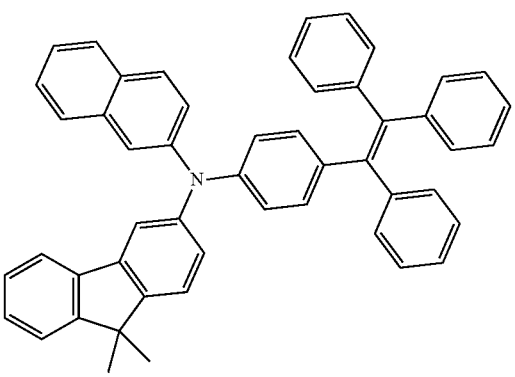
32
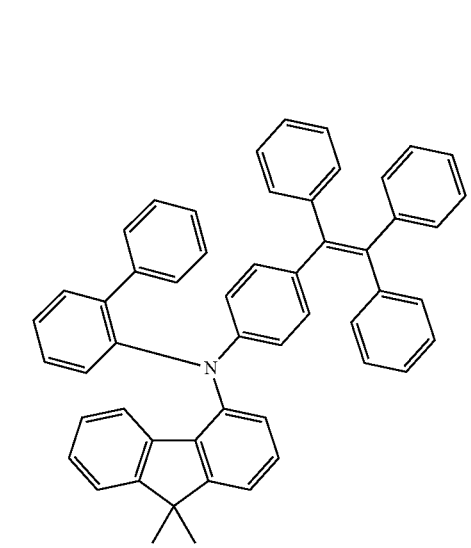

33
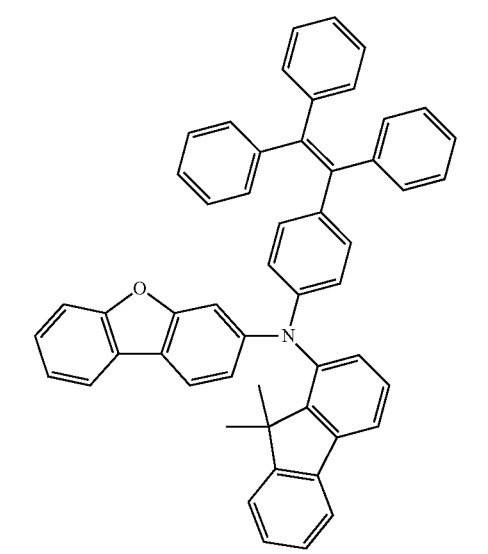
34
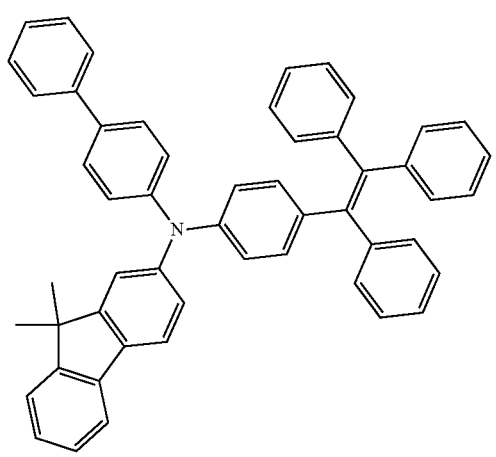
35
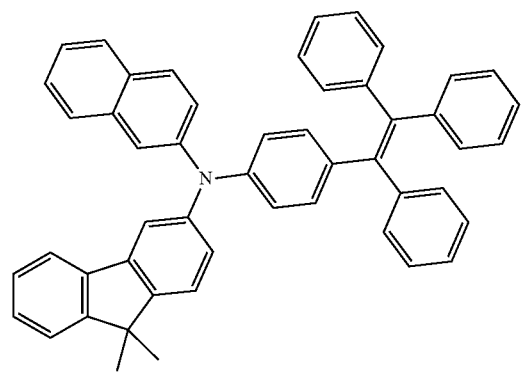
36
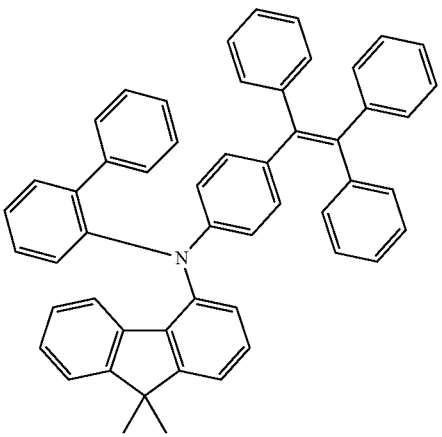
37
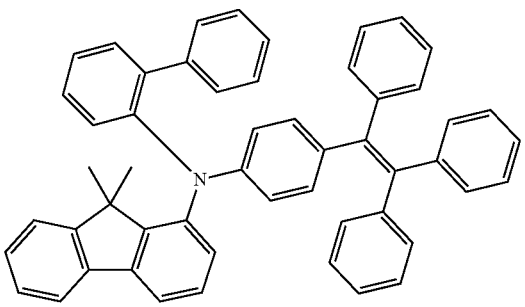
38
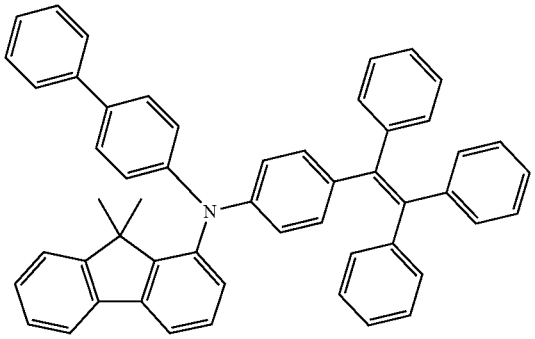
39
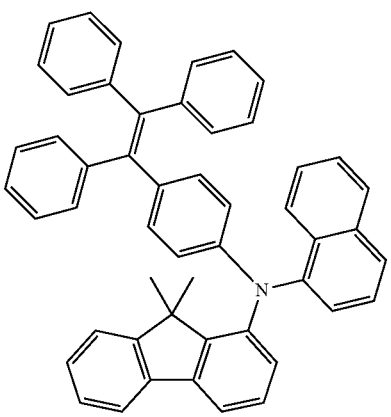

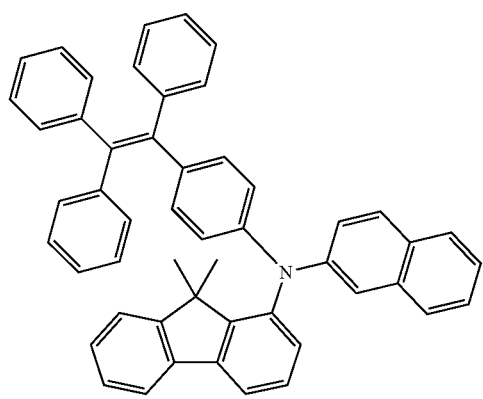
40
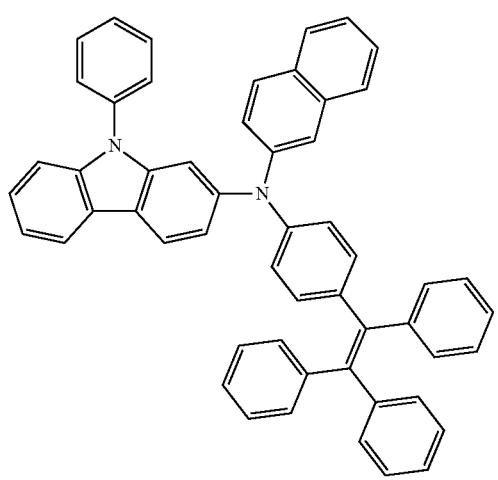
41
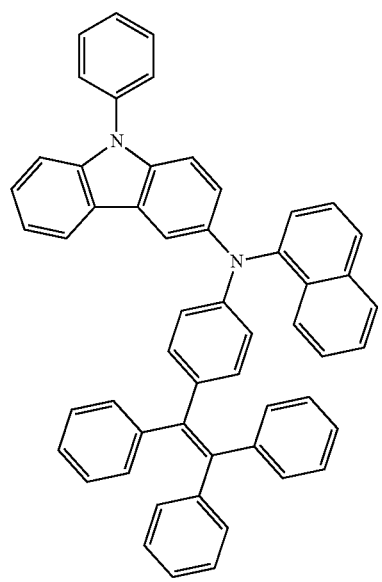
42
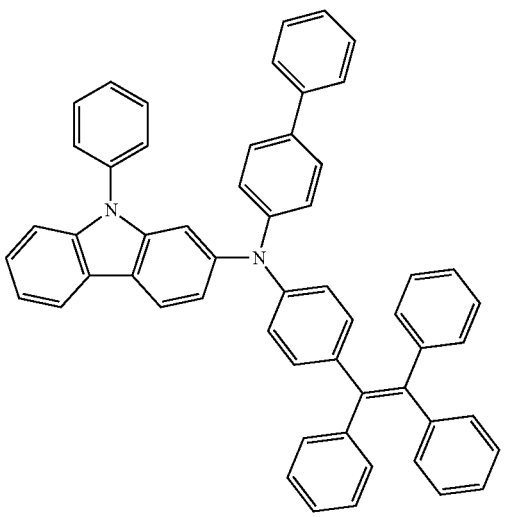
43
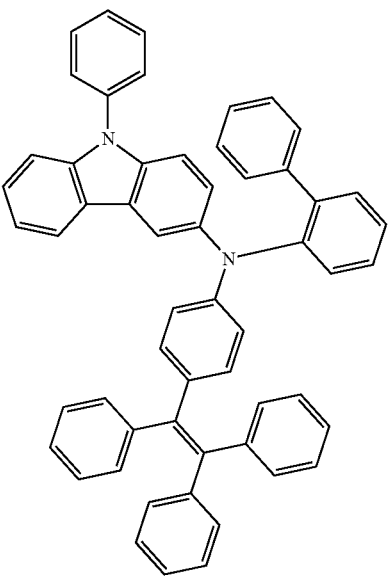
44
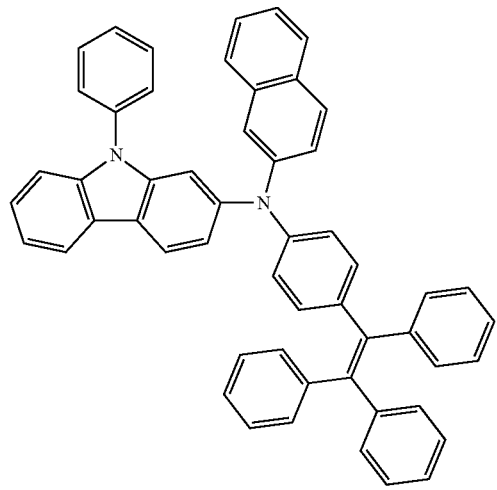
45

46
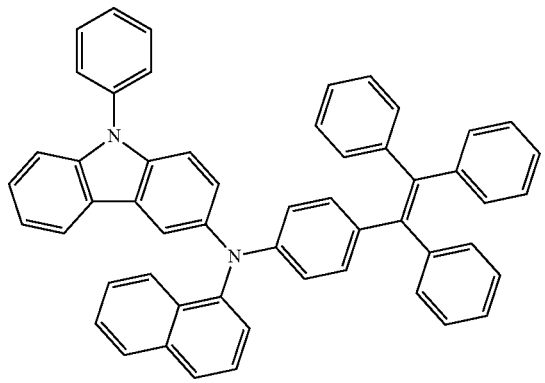
47
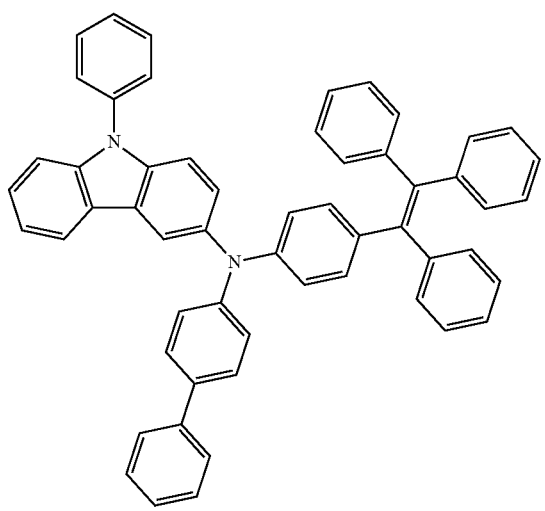
48
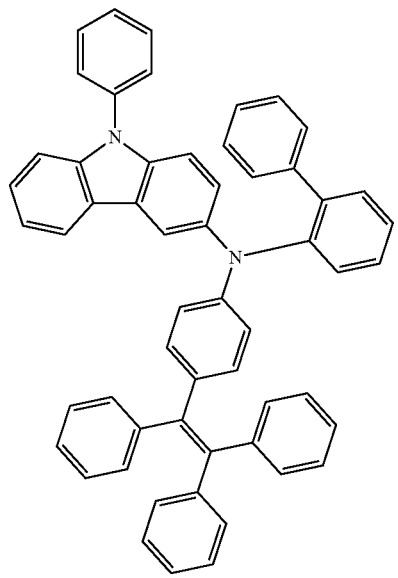
49
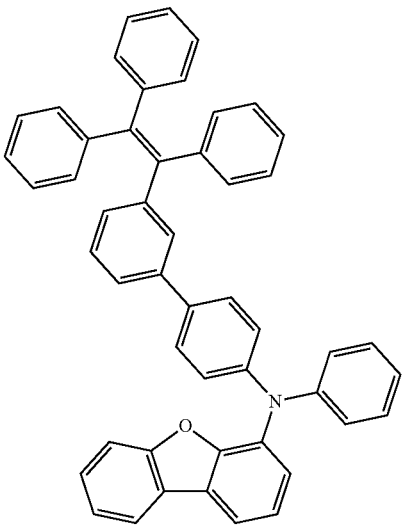
50
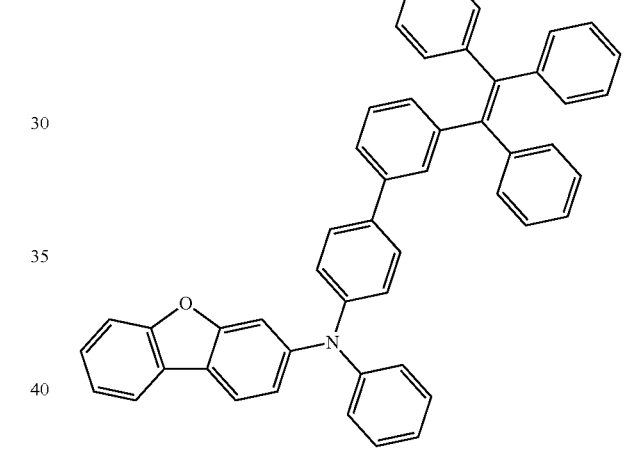
51
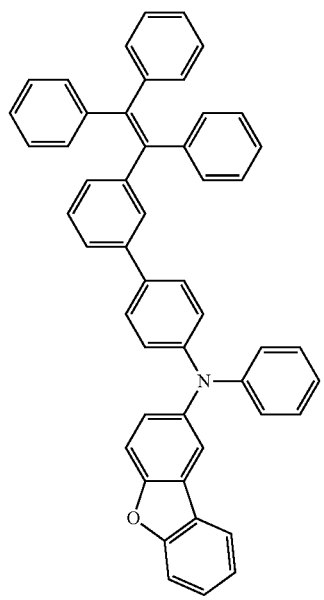

52
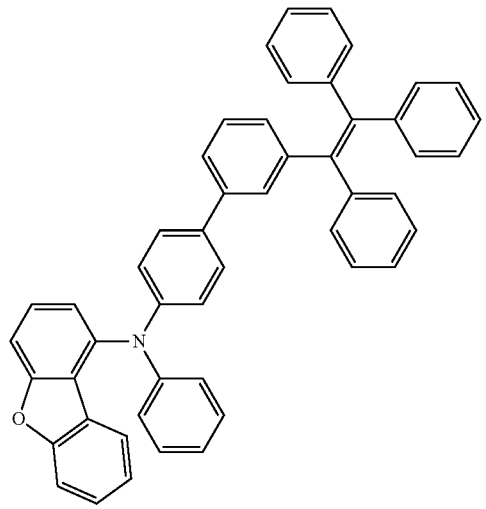
53
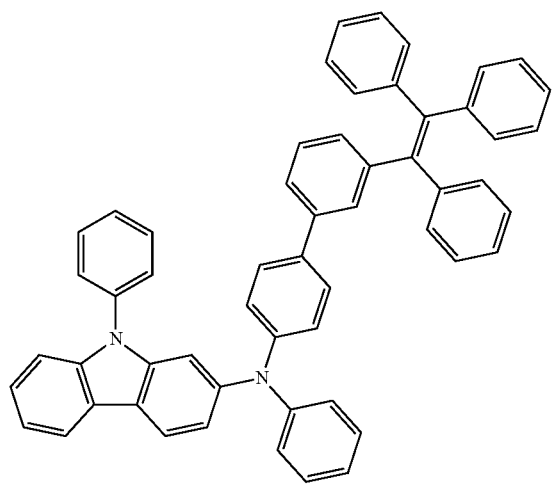
54
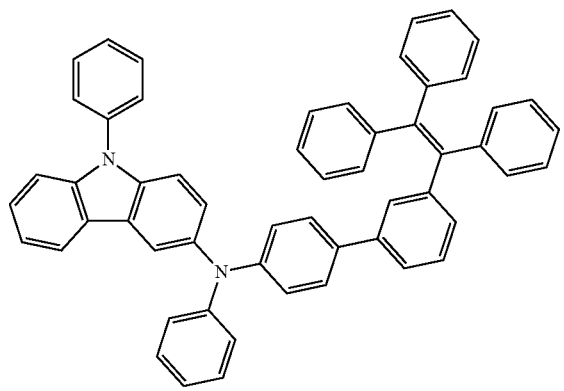
55
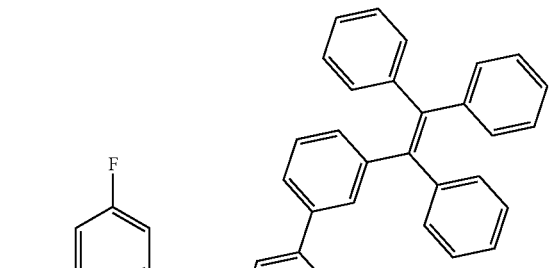
56
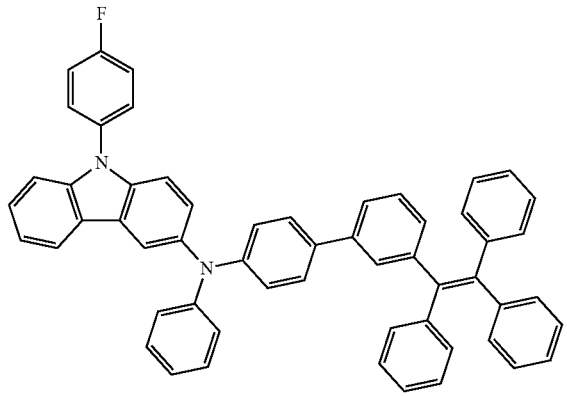
57
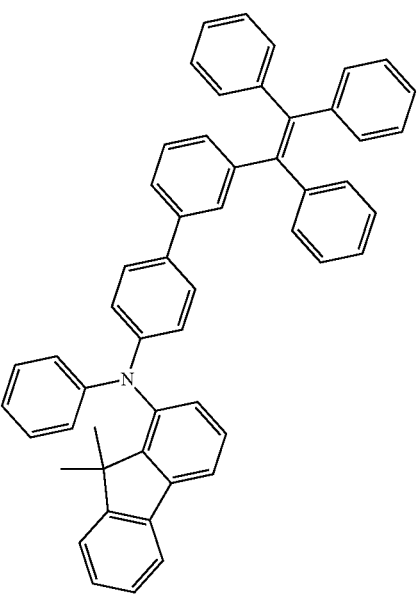

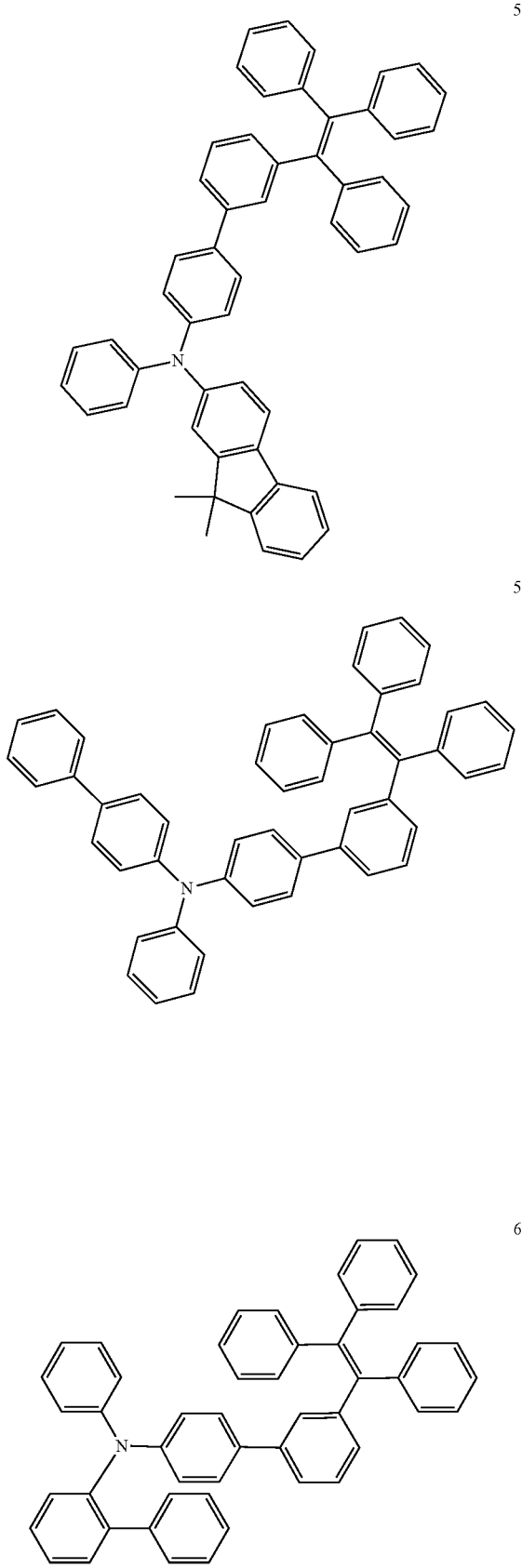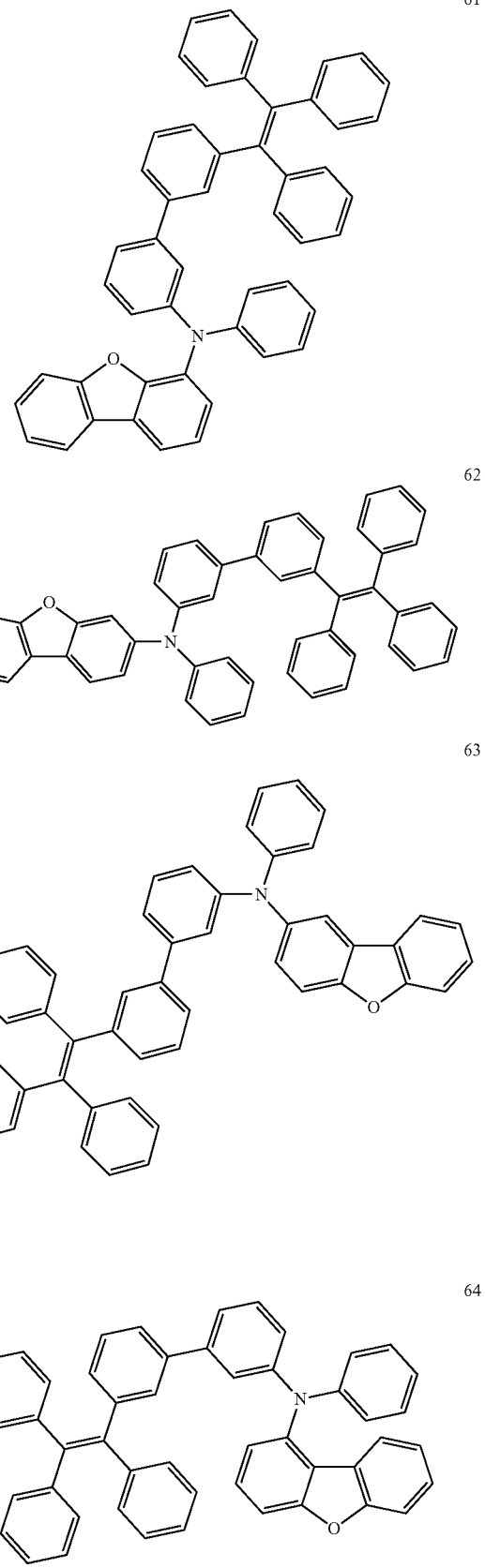

-continued
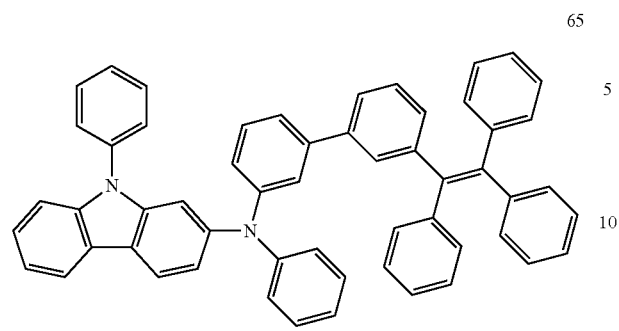
65
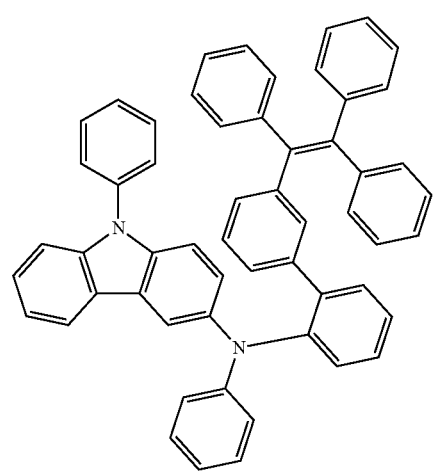
66
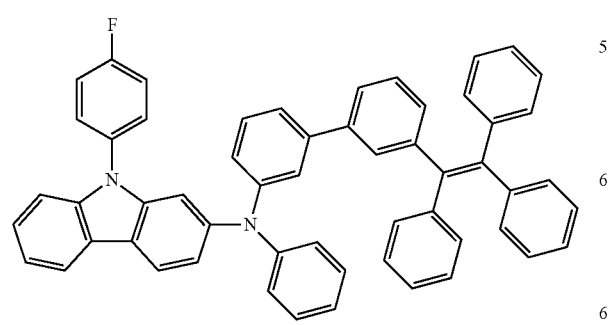
67
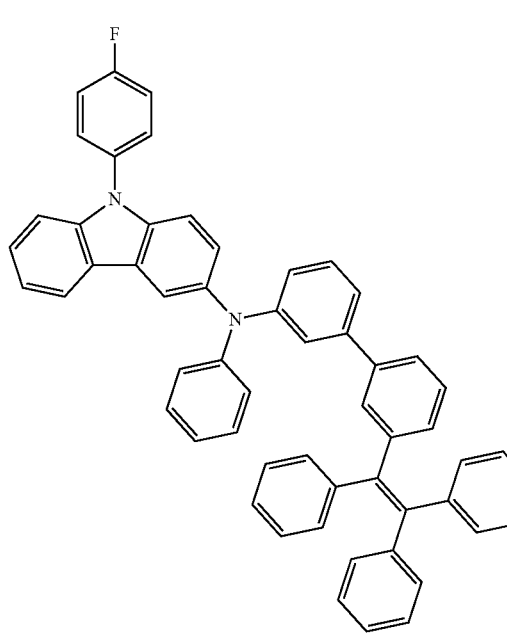
68
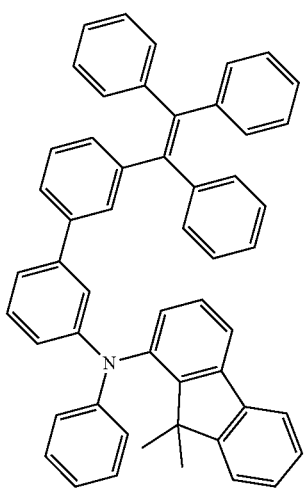
69
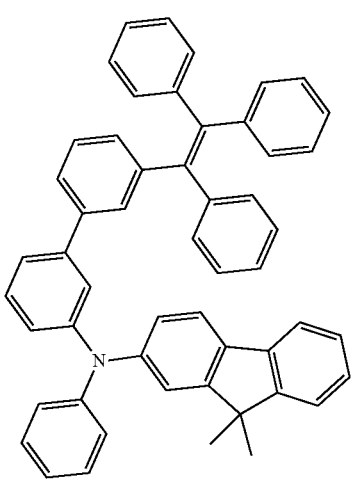
70

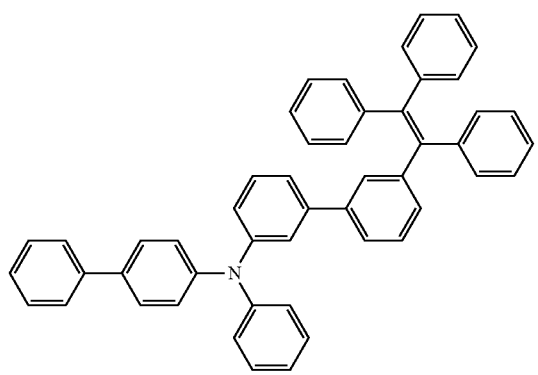
71
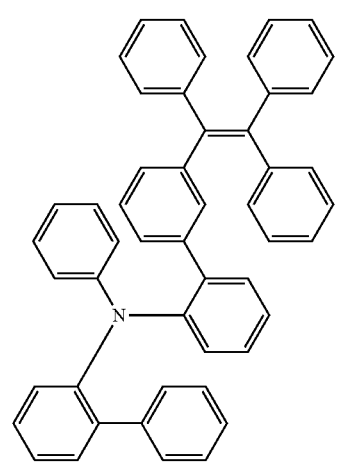
72
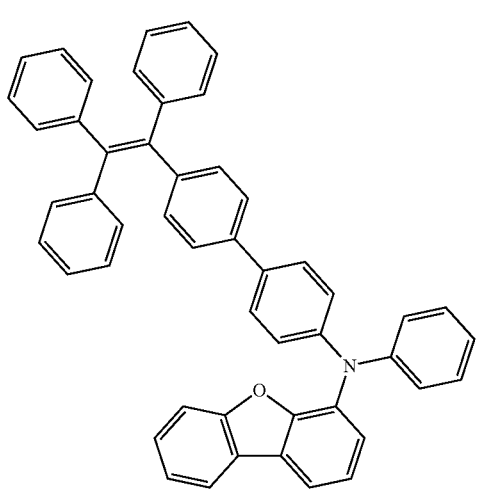
73
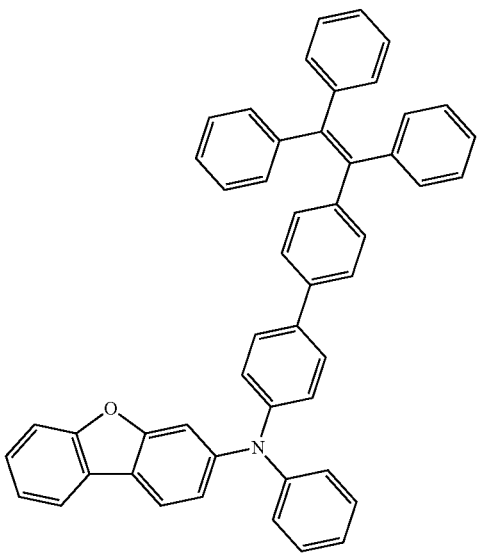
74
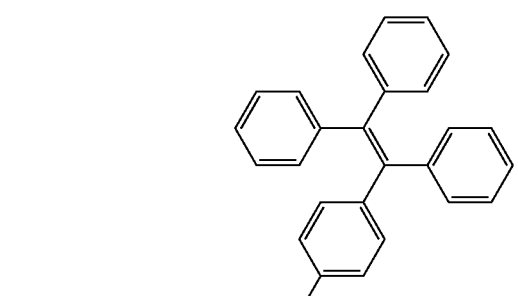
75
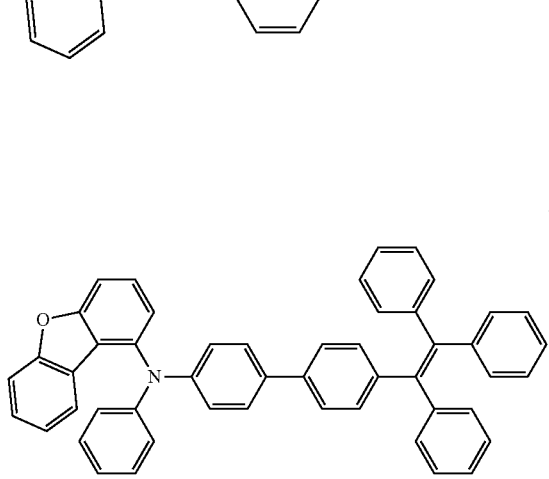
76

77
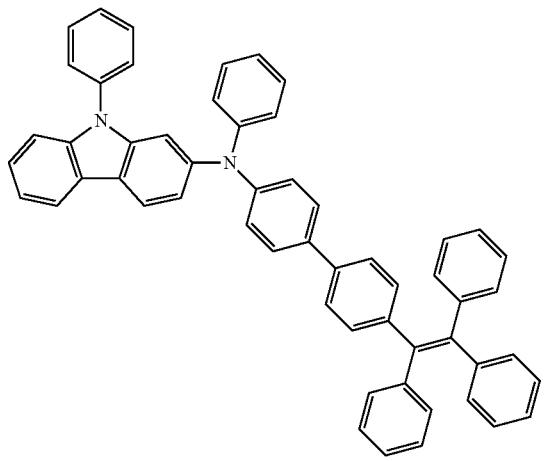
78
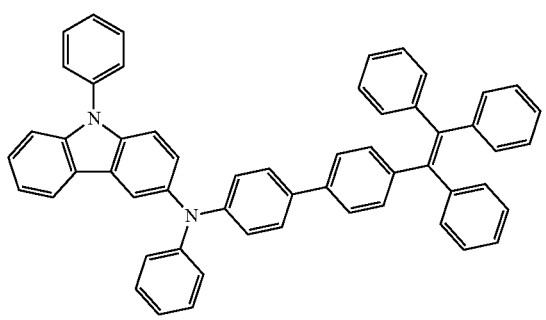
79
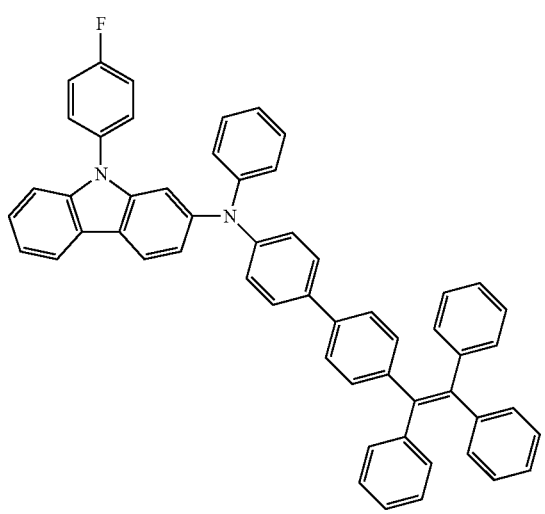
80
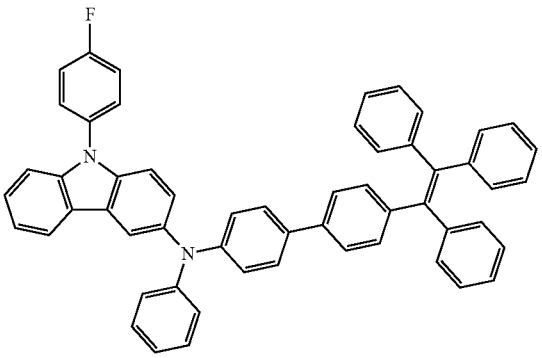
81
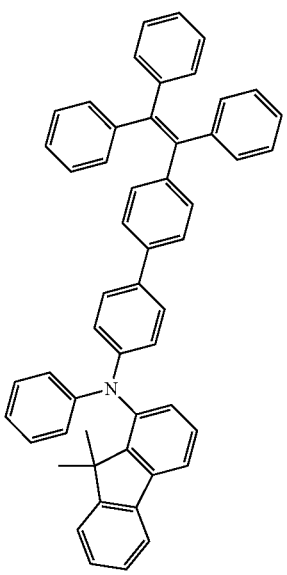
82
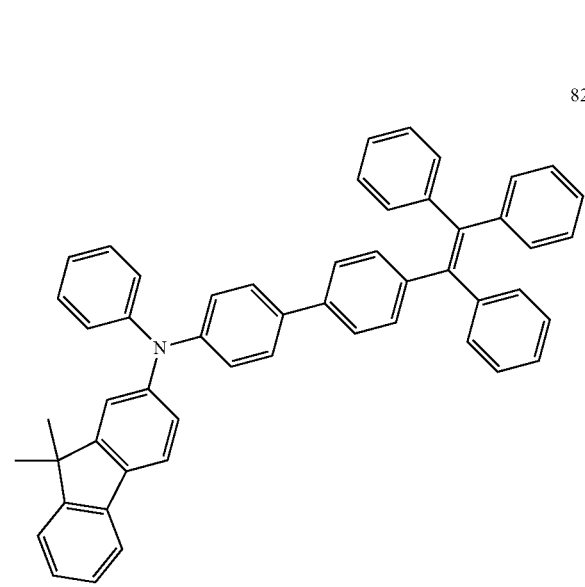

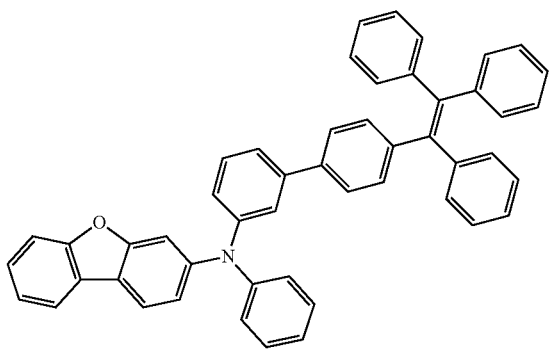
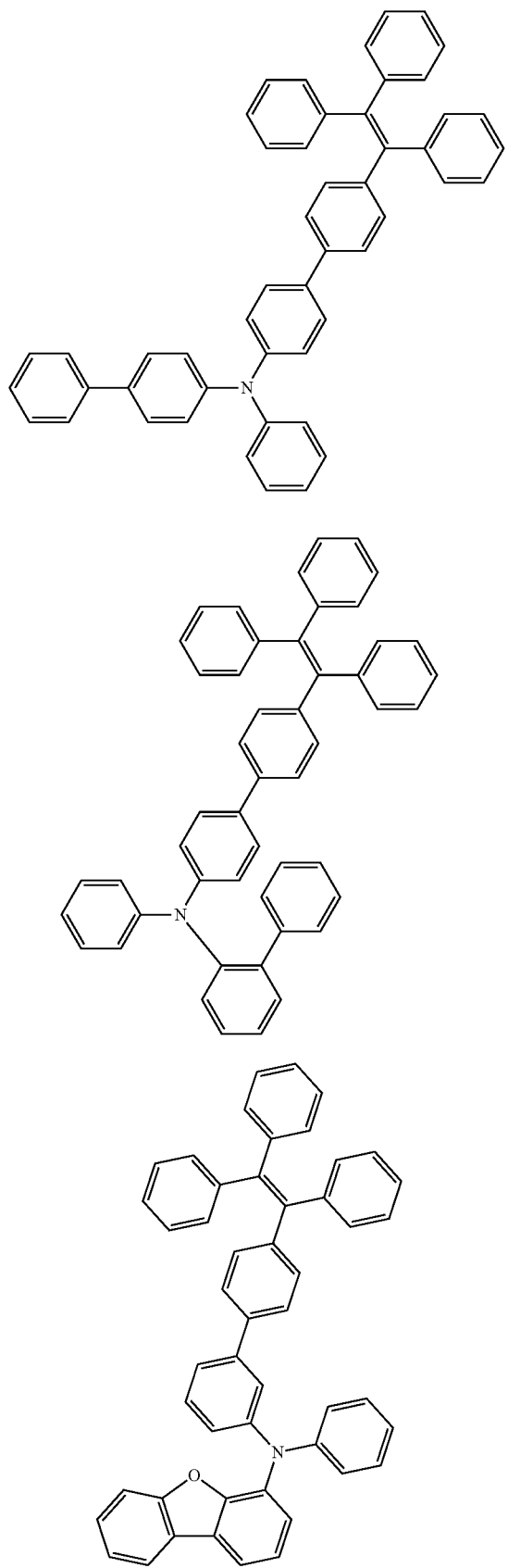

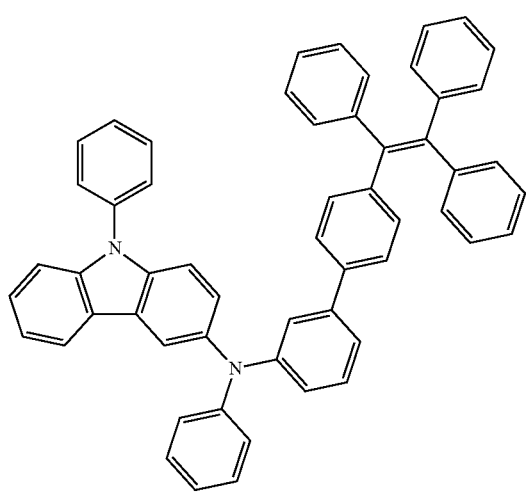
90
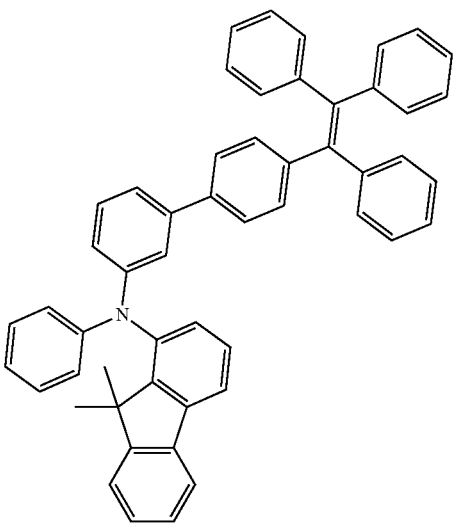
93
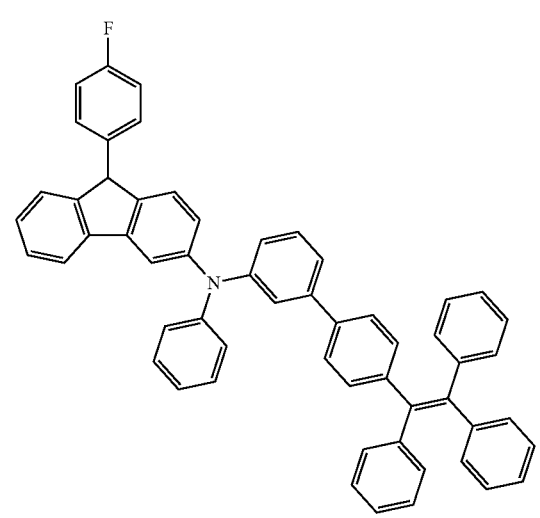
91
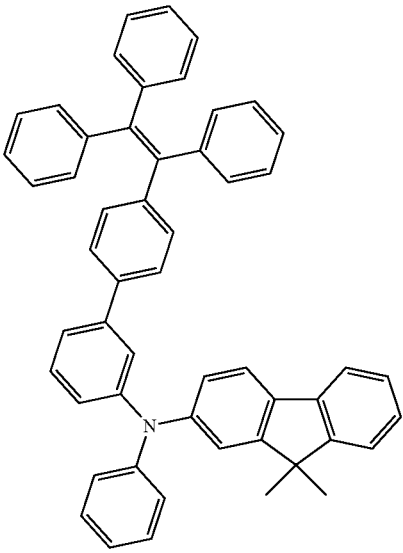
94
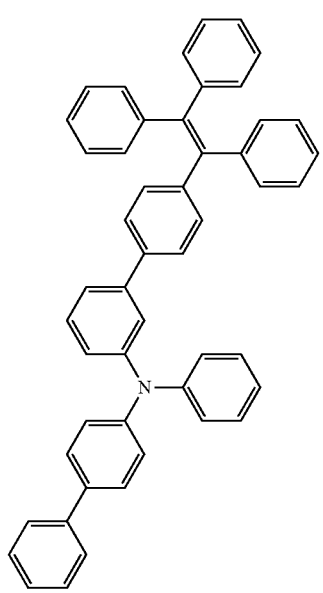
92
95

96
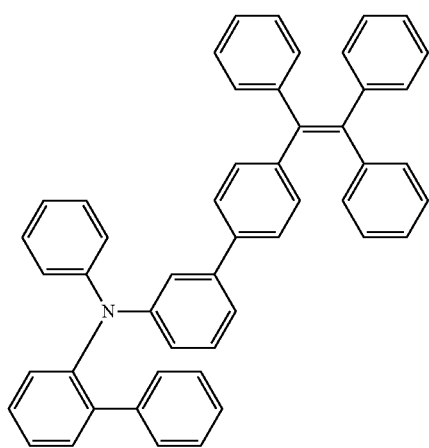
97
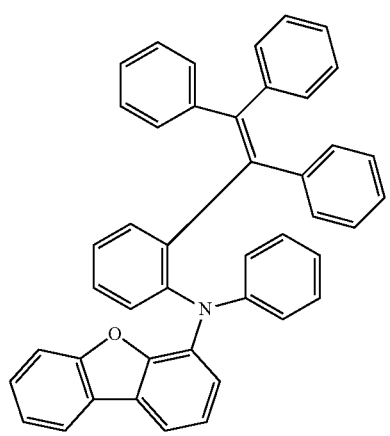
98
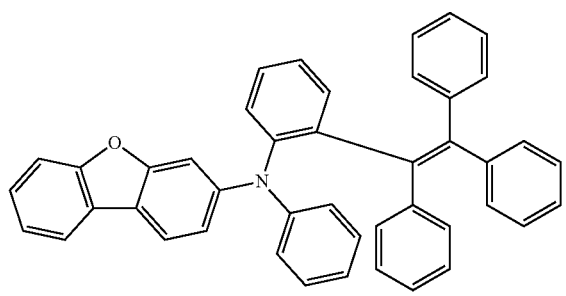
99
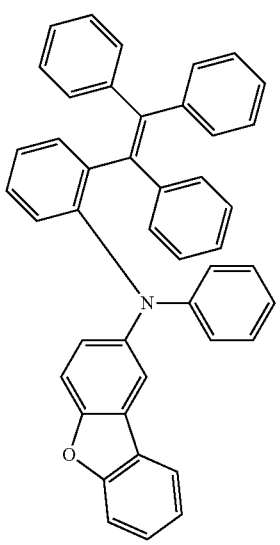
100
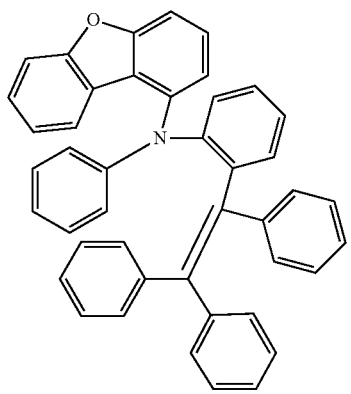
101
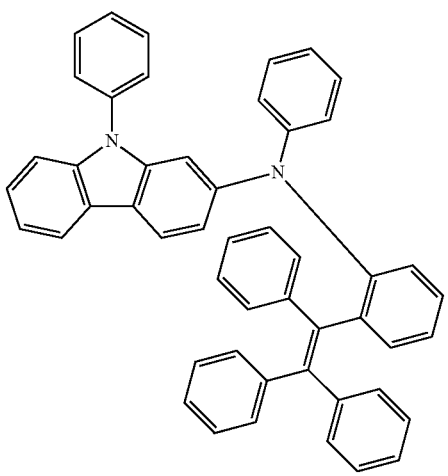

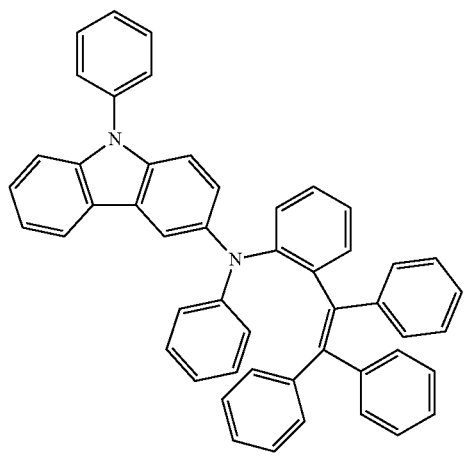
102
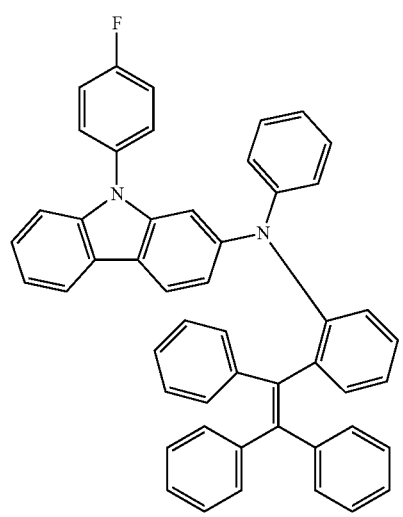
103
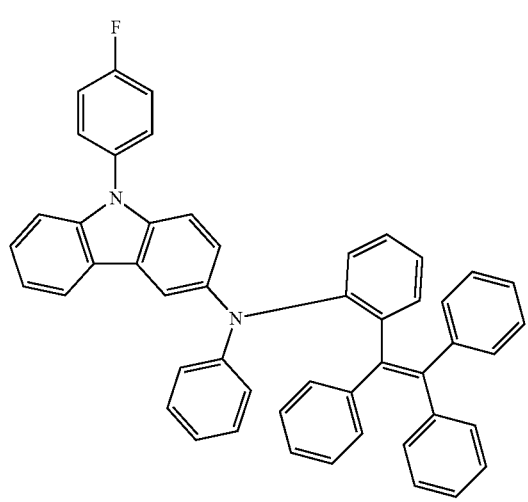
104
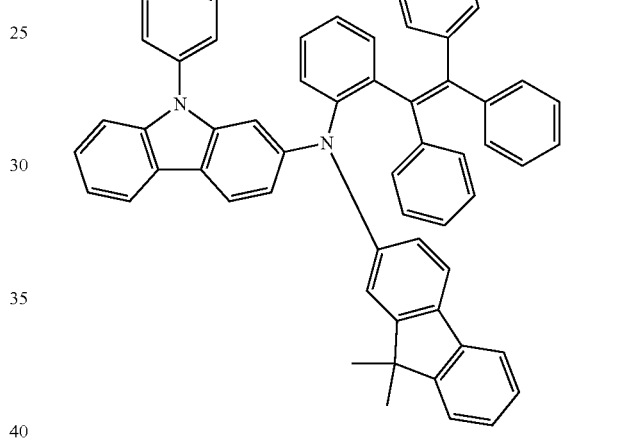
105
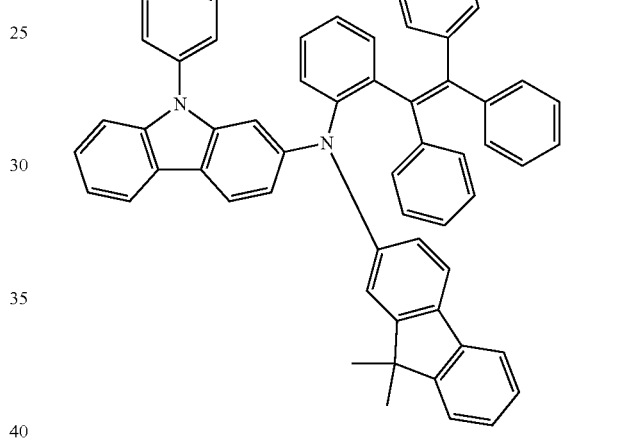
106
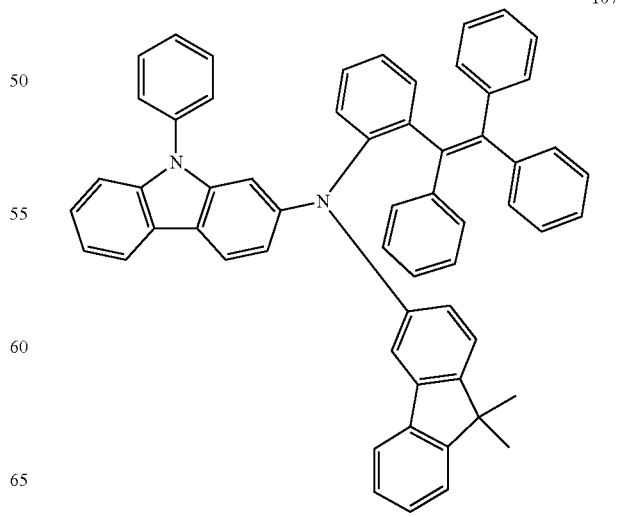
107

108
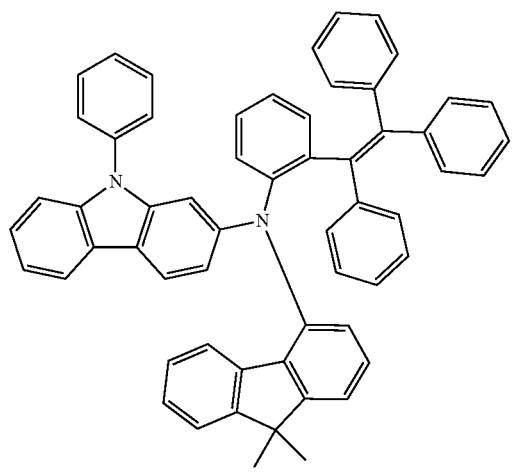
109
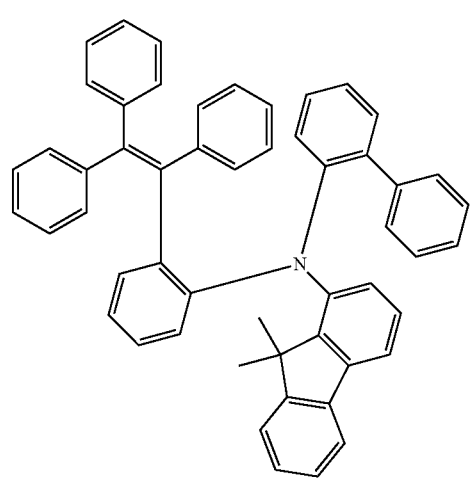
110
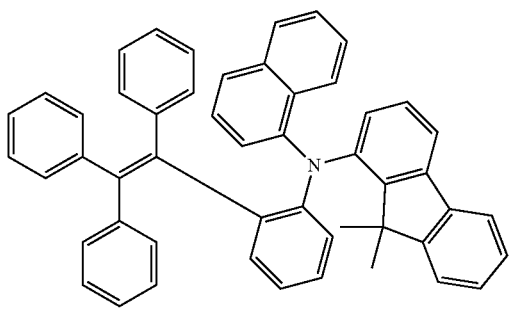
111
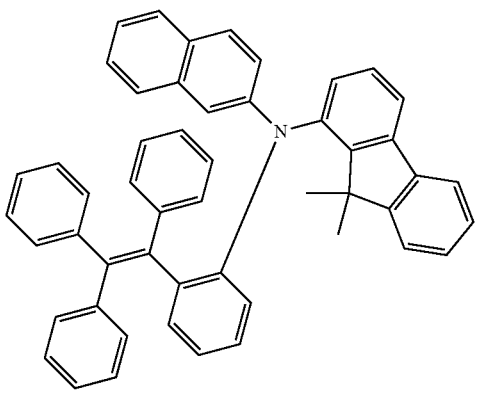
112
113
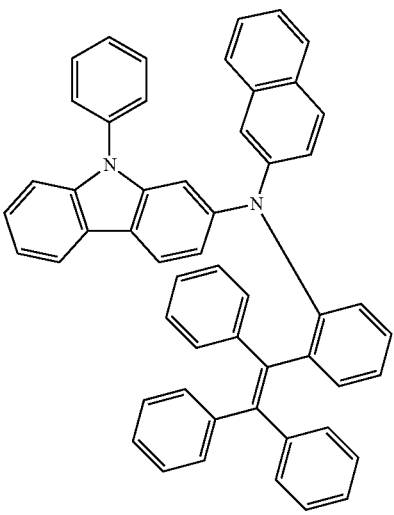

114
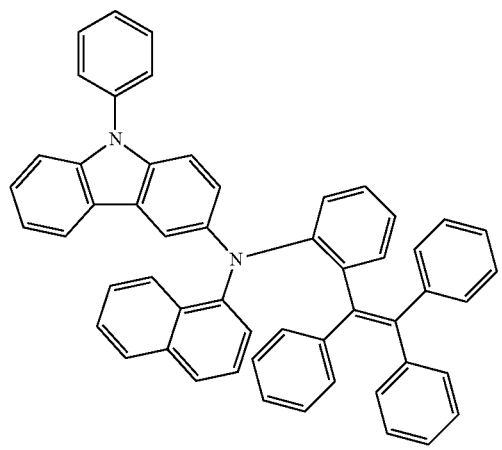
115
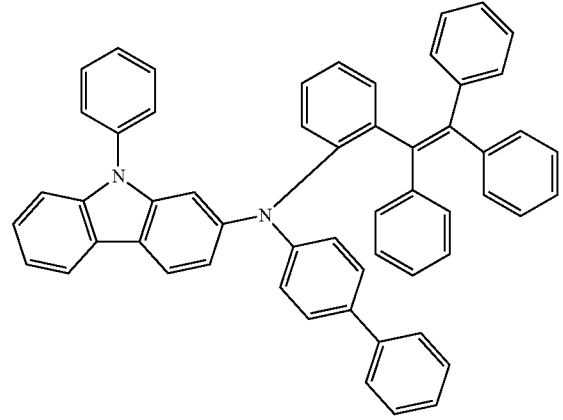
116
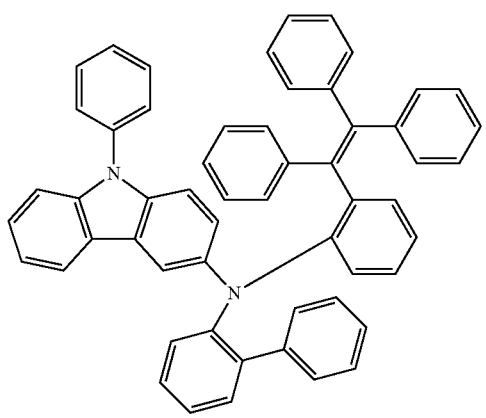
117
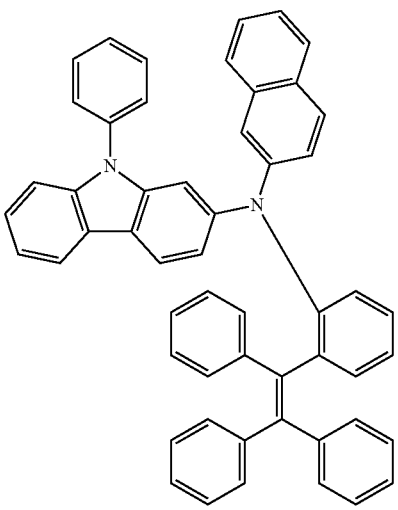
118
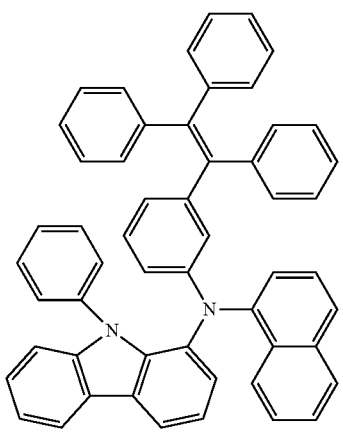
119
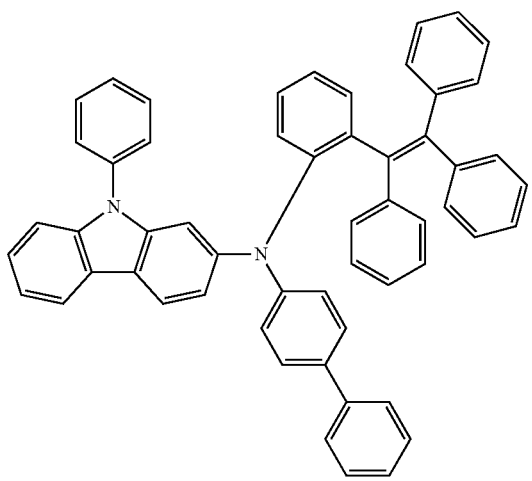

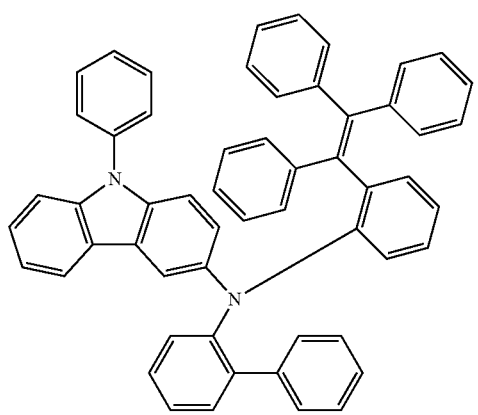

120

In the organic electroluminescence device 10 of an embodiment, the hole transport region HTR may further include a suitable (e.g., known) material.

The hole injection layer HIL may include, for example, a phthalocyanine compound (such as copper phthalocyanine), N,N'-diphenyl-N,N'-bis-[4-(phenyl-m-tolyl-amino)-phenyl]-biphenyl-4,4'-diamine (DNTPD), 4,4',4''-[tris(3-methylphenyl)phenylamino]triphenylamine (m-MTDATA), 4,4',4''-tris(N,N-diphenylamino)triphenylamine (TDATA), 4,4',4''-tris{N,-(2-naphthyl)-N-phenylamino}-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-I-yl)-N,N'-diphenyl-benzidine (NPB), triphenylamine-containing polyetherketone (TPAPEK), 4-isopropyl-4'-methyldiphenyliodonium tetrakis(pentafluorophenyl)borate, dipyrazino[2,3-f: 2',3'-h]quinoxaline-2,3,6,7,10,11-hexacarbonitrile (HAT-CN), etc.

The hole transport layer HTL may further include, for example, carbazole derivatives (such as N-phenyl carbazole and/or polyvinyl carbazole), fluorene derivatives, N,N'-bis(3-methylphenyl)-N,N'-diphenyl-[1,1'-biphenyl]-4,4'-diamine (TPD), triphenylamine derivatives (such as 4,4',4''-tris (N-carbazolyl) triphenylamine (TCTA)), N,N'-di (1-naphthalene-1-yl)-N, N'-diphenyl-benzidine (NPB), 4,4'-cyclohexylidene bis [N, N-bis(4-methylphenyl) benzenamine] (TAPC), 4,4'-bis [N,N'-(3-tolyl) amino]-3,3'-dimethylbiphenyl (HMTPD), 1,3-bis(N-carbazolyl) benzene (mCP), etc.

The thickness of the hole transport region HTR may be from about 50 Å to about 10,000 Å, for example, from about 100 Å to about 5,000 Å. The thickness of the hole injection layer HIL may be, for example, from about 30 Å to about 1,000 Å, and the thickness of the hole transport layer HTL may be, for example, from about 30 Å to about 1,000 Å. For example, the thickness of the electron blocking layer EBL may be from about 10 Å to about 1,000 Å. When the thicknesses of the hole transport region HTR, the hole injection layer HIL, the hole transport layer HTL and the electron blocking layer EBL satisfy the above-described ranges, satisfactory hole transport properties may be achieved without a substantial increase in driving voltage.

The hole transport region HTR may further include, in addition to the above-described materials, a charge generating material to increase conductivity. The charge generating material may be dispersed uniformly or non-uniformly in the hole transport region HTR. The charge generating material may be, for example, a p-dopant. The p-dopant may be one of quinone derivatives, metal oxides, or cyano group-containing compounds, but the present disclosure is not limited thereto. For example, non-limiting examples of the p-dopant may include quinone derivatives (such as tetracyanoquinodimethane (TCNQ) and/or 2,3,5,6-tetrafluoro-7,7,8,8-tetracyanoquinodimethane (F4-TCNQ)), metal oxides (such as tungsten oxide and/or molybdenum oxide), etc.

As described above, the hole transport region HTR may further include a hole buffer layer and/or an electron blocking layer EBL in addition to the hole injection layer HIL and the hole transport layer HTL. The hole buffer layer may compensate a resonance distance according to the wavelength of light emitted from an emission layer EML and may increase light emission efficiency. Materials which may be included in the hole transport region HTR may be utilized as materials which may be included in the hole buffer layer. The electron blocking layer EBL is a layer that serves to prevent or substantially prevent electrons from being injected from the electron transport region ETR to the hole transport region HTR. When the hole transport region HTR includes, at least one of the hole buffer layer or the electron blocking layer, adjacent to the emission layer EML, the amine compound according to an embodiment may be included, in the hole buffer layer and/or electron blocking layer, adjacent to the emission layer EML.

The emission layer EML is provided on the hole transport region HTR. The thickness of the emission layer EML may be, for example, from about 100 Å to about 1000 Å, or from about 100 Å to about 300 Å. The emission layer EML may have a single layer formed of a single material, a single layer formed of a plurality of different materials, or a multilayer structure having a plurality of layers formed of a plurality of different materials.

In addition, the emission layer EML of the organic electroluminescence device 10 may emit blue light. For example, the emission layer EML of the organic electroluminescence device 10 may emit blue light in a region (e.g., wavelength region) of 490 nm or more. However, the embodiments of the present disclosure are not limited thereto, and the emission layer EML may emit green light or red light.

In an embodiment, the organic electroluminescence device 10 of an embodiment may include a plurality of emission layers. The plurality of emission layers may be sequentially stacked, for example, the organic electroluminescence device 10 including the plurality of emission layers may emit white light. The organic electroluminescence device including the plurality of emission layers may be an organic electroluminescence device having a tandem structure.

In an embodiment, the emission layer EML may be a delayed fluorescence emission layer, a fluorescence emission layer, a phosphorescent emission layer, etc., and the emission layer EML may include suitable (e.g., known) host materials and dopants. For example, the emission layer EML may emit thermally activated delayed fluorescence (TADF).

A suitable (e.g., known) material may be utilized as a host material of the emission layer EML. Non-limiting examples of the host material of the emission layer EML may be selected from a fluoranthene derivative, a pyrene derivative, an arylacetylene derivative, an anthracene derivative, a fluorene derivative, a perylene derivative, a chrysene derivative, etc. In an embodiment, the host material of the emission layer EML may be a pyrene derivative, a perylene derivative, and/or an anthracene derivative. For example, an anthracene derivative represented by Formula 5 below may be utilized as the host material of the emission layer EML.

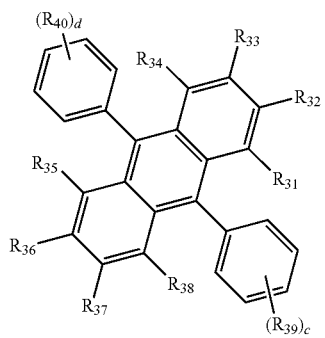

Formula 5

In Formula 5, $R_{31}$ to $R_{40}$ may be each independently a hydrogen atom, a deuterium atom, a halogen atom, a substituted or unsubstituted silyl group, a substituted or unsubstituted alkyl group having 1 to 10 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring. Also, $R_{31}$ to $R_{40}$ may be optionally bonded to an adjacent group to form a saturated hydrocarbon ring or an unsaturated hydrocarbon ring.

In Formula 5, c and d may be each independently an integer of 0 to 5.

The anthracene derivative represented by Formula 5 may be represented by any one of Compounds 5-1 to 5-16 below.

5-1

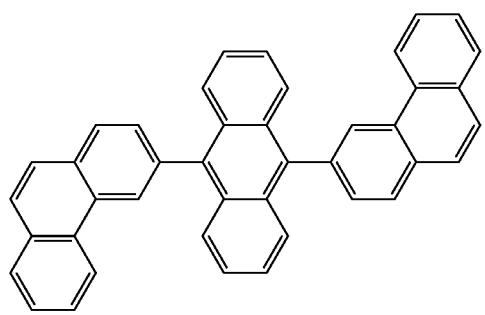

5-2

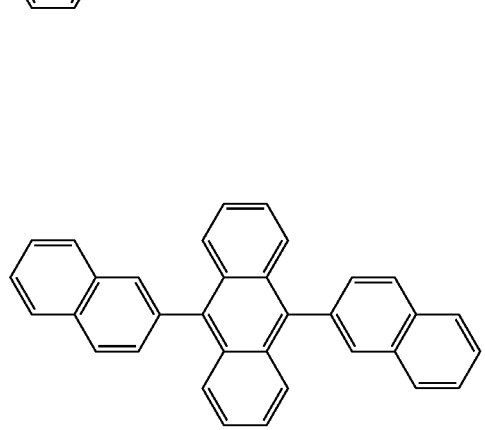

5-3

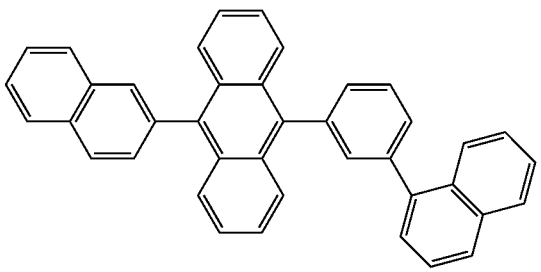

5-4

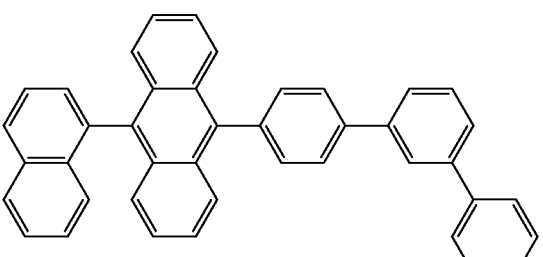

5-5

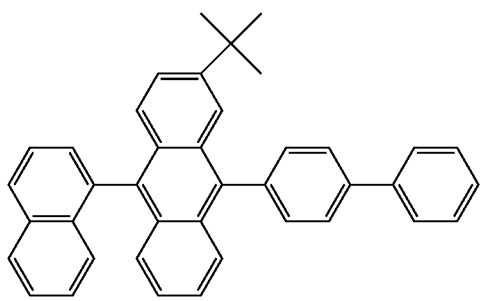

5-6

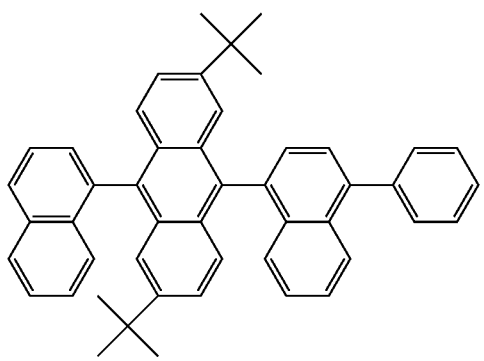

5-7

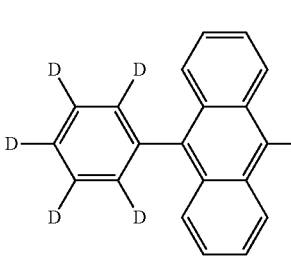

5-8
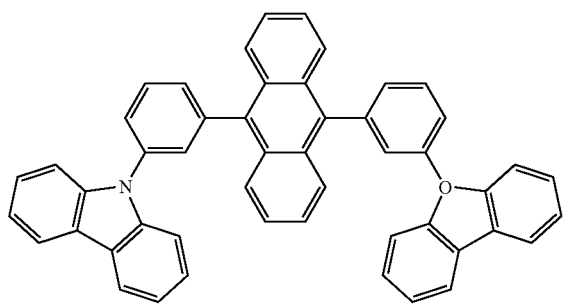

5-9
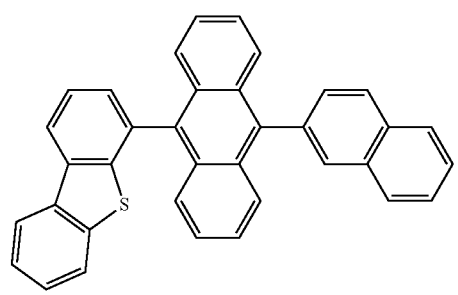

5-10
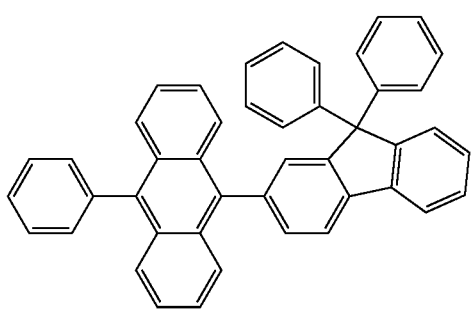

5-11
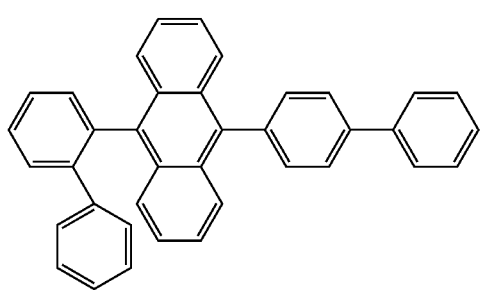

5-12
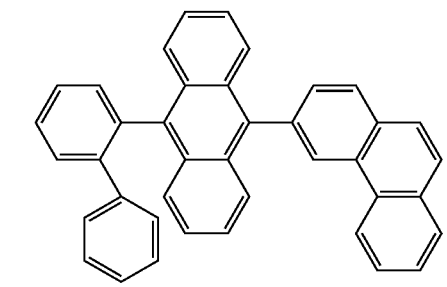

5-13
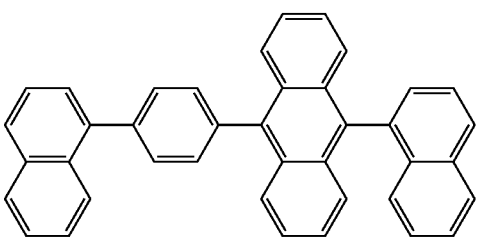

5-14
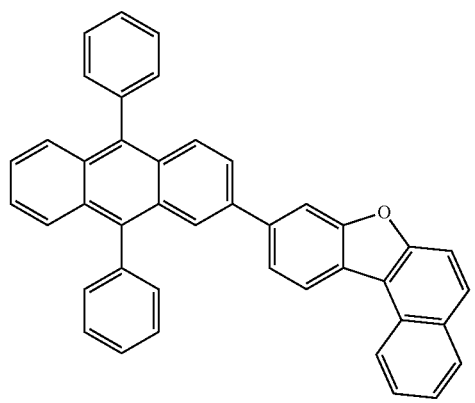

5-15
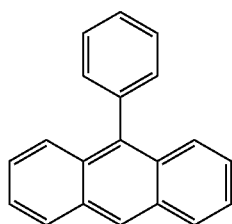

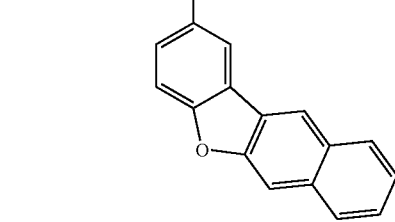

5-16
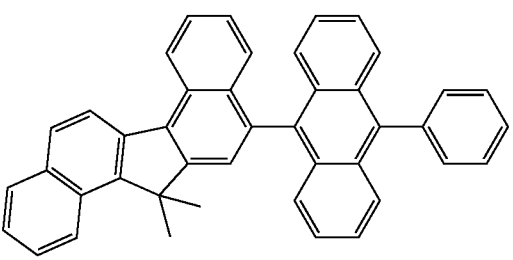

In an embodiment, the emission layer EML may include, as a host material, tris(8-hydroxyquinolino)aluminum ($Alq_3$), 4,4'-bis(N-carbazolyl)-1,1'-biphenyl (CBP), poly(N-vinylcarbazole) (PVK), 9,10-di(naphthalene-2-yl)anthracene (ADN), 4,4',4"-tris (carbazol sol-9-yl) triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), bis[2-(diphenylphosphino)

phenyl]ether oxide (DPEPO), hexaphenyl cyclotriphosphazene (CP1), 1,4-bis(triphenylsilyl)benzene (UGH2), hexaphenylcyclotrisiloxane (DPSiO$_3$), octaphenylcyclotetrasiloxane (DPSiO$_4$), 2,8-bis(diphenylphosphoryl)dibenzofuran (PPF), 3,3'-bis(N-carbazolyl)-1,1'-biphenyl (mCBP), 1,3-bis(carbazolyl-9-yl)benzene (mCP), 9,10-di(naphthalen-2-yl)anthracene (DNA), etc. However, the embodiments of the present disclosure are not limited thereto, and in addition to the presented host materials, suitable (e.g., known) delayed fluorescence host materials may be included.

In an embodiment, the emission layer EML may include, as a dopant, styryl derivatives (e.g., 1,4-bis [2-(3-N-ethylcarbazoryl) vinyl] benzene (BCzVB), 4-(di-p-tolylamino)-4''-[(di-p-tolylamino) styryl] stilbene (DPAVB), and/or N-(4-((E)-2-(6-((E)-4-(diphenylamino) styryl) naphthalen-2-yl) vinyl) phenyl)-N-phenylbenzenamine (N-BDAVBi), perylene and/or derivatives thereof (e.g., 2,5,8,11-tetra-t-butylperylene (TBP)), pyrene and/or derivatives thereof (e.g., 1,12-dipyrene, 1,4-dipyrenylbenzene, and/or 1,4-bis (N,N-diphenylamino) pyrene), etc.

In addition, in an embodiment, the emission layer EML may include two dopant materials having different lowest triplet excitation energy levels (T1 level). In the organic electroluminescence device 10 of an embodiment, the emission layer EML may include a host having a first lowest triplet excitation energy level, a first dopant having a second lowest triplet excitation energy level lower than the first lowest triplet excitation energy level, and a second dopant having a third lowest triplet excitation energy level lower than the second lowest triplet excitation energy level.

In the organic electroluminescence device 10 of an embodiment including a host, a first dopant, and a second dopant in the emission layer EML, the first dopant may be a delayed fluorescence dopant, and the second dopant may be a fluorescence dopant.

For example, when the emission layer EML of the organic electroluminescence device 10 of an embodiment includes a plurality of dopants, the emission layer EML may include a first dopant and a second dopant which are different from each other. For example, when the emission layer EML emits blue light, the emission layer EML may further include any one selected from the group consisting of spiro-DPVBi, spiro-6P, distyryl-benzene (DSB), distyryl-arylene (DSA), polyfluorene-based polymer (PFO), and poly(p-phenylene vinylene)-based polymer (PPV) as the second dopant. In addition, a metal complex such as (4,6-F$_2$ppy)$_2$Irpic, an organometallic complex, perylene and derivatives thereof, etc., may be utilized as the second dopant.

In the organic electroluminescence device 10 of an embodiment illustrated in FIGS. 1 to 4, an electron transport region ETR is provided on the emission layer EML. The electron transport region ETR may include a hole blocking layer HBL, an electron transport layer ETL, and/or an electron injection layer EIL, but the embodiments of the present disclosure are not limited thereto.

The electron transport region ETR may have a single layer formed of a single material, a single layer formed of a plurality of different materials, or a multilayer structure including a plurality of layers formed of a plurality of different materials.

For example, the electron transport region ETR may have a single layer structure of an electron injection layer EIL or an electron transport layer ETL, or may have a single layer structure formed of an electron injection material and an electron transport material. In addition, the electron transport region ETR may have a single layer structure formed of a plurality of different materials, or may have a structure in which an electron transport layer ETL/electron injection layer EIL or a hole blocking layer HBL/electron transport layer ETL/electron injection layer EIL are stacked in the stated order from the emission layer EML, but the present disclosure is not limited thereto. The thickness of the electron transport region ETR may be, for example, from about 1,000 Å to about 1,500 Å.

The electron transport region ETR may be formed utilizing various suitable methods such as a vacuum deposition method, a spin coating method, a cast method, a Langmuir-Blodgett (LB) method, an inkjet printing method, a laser printing method, a laser induced thermal imaging (LITI) method, etc.

When the electron transport region ETR includes the electron transport layer ETL, the electron transport region ETR may include an anthracene-based compound. However, the embodiments of the present disclosure are not limited thereto, and the electron transport region may include, for example, tris(8-hydroxyquinolinato)aluminum (Alq$_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate) (Bebq2), 9,10-di(naphthalene-2-yl) anthracene (ADN), or a mixture thereof. The thickness of the electron transport layer ETL may be from about 100 Å to about 1,000 Å, or may be, for example, from about 150 Å to about 500 Å. When the thickness of the electron transport layer ETL satisfies the above-described ranges, satisfactory electron transport properties may be obtained without a substantial increase in driving voltage.

When the electron transport region ETR includes the electron injection layer EIL, the electron injection layer EIL may be formed of a halogenated metal (such as LiF, NaCl, CsF, RbCl, RbI, and/or CuI), a lanthanide metal (such as Yb), a metal oxide (such as Li$_2$O and/or BaO), or lithium quinolate (LiQ), but the present disclosure is not limited thereto. The electron injection layer EIL may also be formed of a mixture material of an electron transport material and an insulating organo-metal salt. The organo-metal salt may be a material having an energy band gap of about 4 eV or more. In one embodiment, the organo-metal salt may include, for example, metal acetates, metal benzoates, metal acetoacetates, metal acetylacetonates, and/or metal stearates. The thickness of the electron injection layers EIL may be from about 1 Å to about 100 Å, or from about 3 Å to about 90 Å. When the thickness of the electron injection layers EIL satisfies the above-described ranges, satisfactory electron injection properties may be obtained without a substantial increase in driving voltage.

As described above, the electron transport region ETR may include a hole blocking layer HBL. The hole blocking layer HBL may include, for example, 2,9-dimethyl-4,7-diphenyl-1,10-phenanthroline (BCP) and/or 4,7-diphenyl-1,10-phenanthroline (Bphen), but the present disclosure is not limited thereto.

The second electrode EL2 is provided on the electron transport region ETR. The second electrode EL2 may be a common electrode or a cathode. The second electrode EL2 may be a transmissive electrode, a transflective electrode or a reflective electrode. When the second electrode EL2 is the transmissive electrode, the second electrode EL2 may include a transparent metal oxide, for example, indium tin oxide (ITO), indium zinc oxide (IZO), zinc oxide (ZnO), and/or indium tin zinc oxide (ITZO).

When the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, a compound thereof, or a mixture thereof (e.g., a mixture of Ag and Mg). In some embodiments, the second electrode EL2 may have a multi-layer structure including a reflective film or a transflective film formed of the above-described materials, and a transparent conductive film formed of indium tin oxide (ITO), indium zinc oxide (IZO), zinc oxide (ZnO), indium tin zinc oxide (ITZO), etc.

In an embodiment, the second electrode EL2 may be connected with an auxiliary electrode. When the second electrode EL2 is connected with the auxiliary electrode, the resistance of the second electrode EL2 may decrease.

In an embodiment, the organic electroluminescence device 10 of an embodiment may further include a buffer layer between the emission layer EML and the electron transport region ETR. The buffer layer may adjust the concentration of excitons generated in the emission layer EML. For example, the buffer layer may include some of the emission layer EML material. The buffer layer may include a host material from among the emission layer EML materials. The lowest triplet excitation energy level of the buffer layer material may be adjusted above the lowest triplet excitation energy level of the second dopant or below the lowest triplet excitation energy level of the second dopant, depending on the combination of host and dopant materials included in the emission layer EML.

In an embodiment, a capping layer CPL may be further disposed on the second electrode EL2 of the organic electroluminescence device 10 of an embodiment. The capping layer CPL may include, for example, α-NPD, NPB, TPD, m-MTDATA, Alq$_3$, CuPc, N4,N4,N4',N4'-tetra(biphenyl-4-yl) biphenyl-4,4'-diamine (TPD15), 4,4',4''-tris(carbazol sol-9-yl)triphenylamine (TCTA), etc.

The organic electroluminescence device 10 according to an embodiment of the present disclosure includes the amine compound of an embodiment described above in the hole transport region HTR disposed between the first electrode EL1 and the second electrode EL2 to achieve high luminous efficiency and long device life characteristics.

In an embodiment, the amine compound of an embodiment described above may be included as a material for the organic electroluminescence device 10 in an organic layer other than the hole transport region HTR. For example, the organic electroluminescence device 10 according to an embodiment of the present disclosure may include the amine compound described above in at least one organic layer disposed between the first electrode EL1 and the second electrode EL2 or in the capping layer CPL disposed on the second electrode EL2.

The amine compound of an embodiment described above includes a tetraphenylethenyl group linked to an amine group, thereby improving an intermolecular hole transport capability as compared to related art (e.g., conventional) compounds, and when the amine compound is utilized as a hole transport material of an organic electroluminescence device, the organic electroluminescence device may have a long life and high efficiency.

Hereinafter, with reference to Examples and Comparative Examples, a compound according to an embodiment of the present disclosure and an organic electroluminescence device of an embodiment will be described in more detail. In addition, Examples shown below are illustrated only for the understanding of the subject matter of the present disclosure, and the scope of the present disclosure is not limited thereto.

Examples

1. Synthesis of Amine Compounds

First, a method for synthesizing an amine compound according to an embodiment will be specifically described by exemplarily illustrating methods for synthesizing Compounds 1, 3, 6, 30, 43, 82, and 83. In addition, a below-described synthesis method for an amine compound is one example, and the synthesis method for an amine compound according to an embodiment of the present disclosure is not limited to the Examples below.

(1) Synthesis of Compound 1

Amine compound 1 according to an embodiment, for example, may be synthesized by the following reaction.

Reaction Formula 1-1

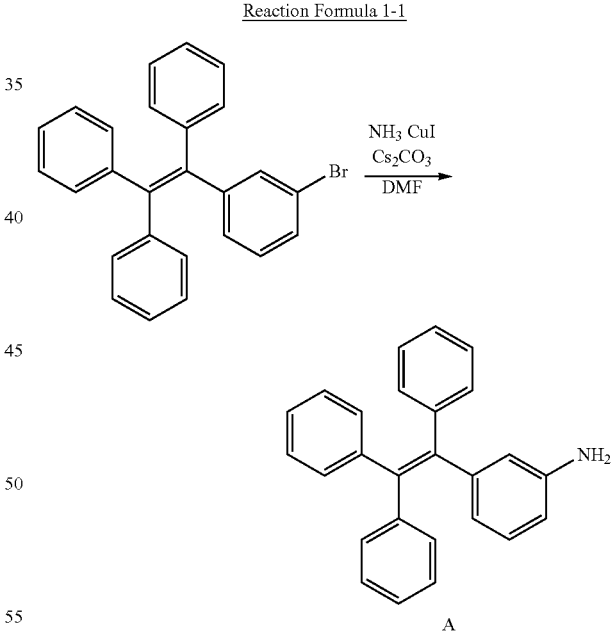

1-Bromo-4-(1,2,2-triphenylethenyl) benzene (12.5 g) dissolved in NH$_3$ (5 ml), and CuI (5.7 g), acetylacetaone (1.8 g), and Cs$_2$CO$_3$ (1.0 g) dissolved in DMF (300 ml) were stirred at 120° C. for 24 hours. The reaction solution was cooled to room temperature, terminated with water, and extracted three times utilizing ethyl ether. The separated organic layer was dried over anhydrous magnesium sulfate and distilled under reduced pressure, and the residue was separated and purified by column chromatography to obtain Compound A (7.0 g, yield: 68%).

Reaction Formula 1-2

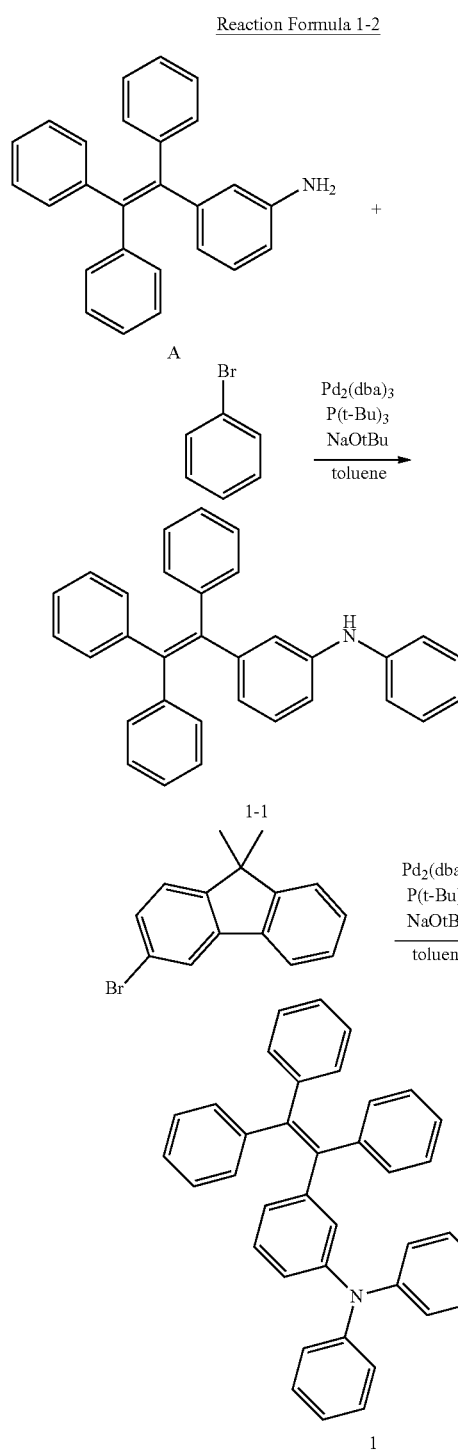

Reactant Compound A (6.2 g), bromobenzene (2.3 g), Pd$_2$(dba)$_3$ (0.68 g), P(t-Bu)$_3$ (0.30 g), and NaOtBu (4.32 g) were dissolved in 200 ml toluene and stirred at 90° C. for 2 hours. The reaction solution was cooled to room temperature, terminated with water, and extracted three times utilizing ethyl ether. The organic layer was dried over anhydrous magnesium sulfate and distilled under reduced pressure, and the residue was separated and purified by column chromatography to obtain Intermediate 1-1 (3.8 g, Yield: 63%).

Compound 1 (2.6 g, yield: 54%) was obtained in the same manner as utilized for the synthesis of Intermediate 1-1, except that 3-bromo-9,9-dimethyl-9H-Fluorene (2.7 g) and Intermediate 1-1 (3.38 g) were utilized instead of Compound A and bromobenzene. The molecular weight of Compound 1 was 615 as measured by FAB-MS. The above results confirmed that the obtained compound was Compound 1.

(2) Synthesis of Compound 6

Amine compound 6 according to an embodiment, for example, may be synthesized by the following reaction.

Reaction Formula 2

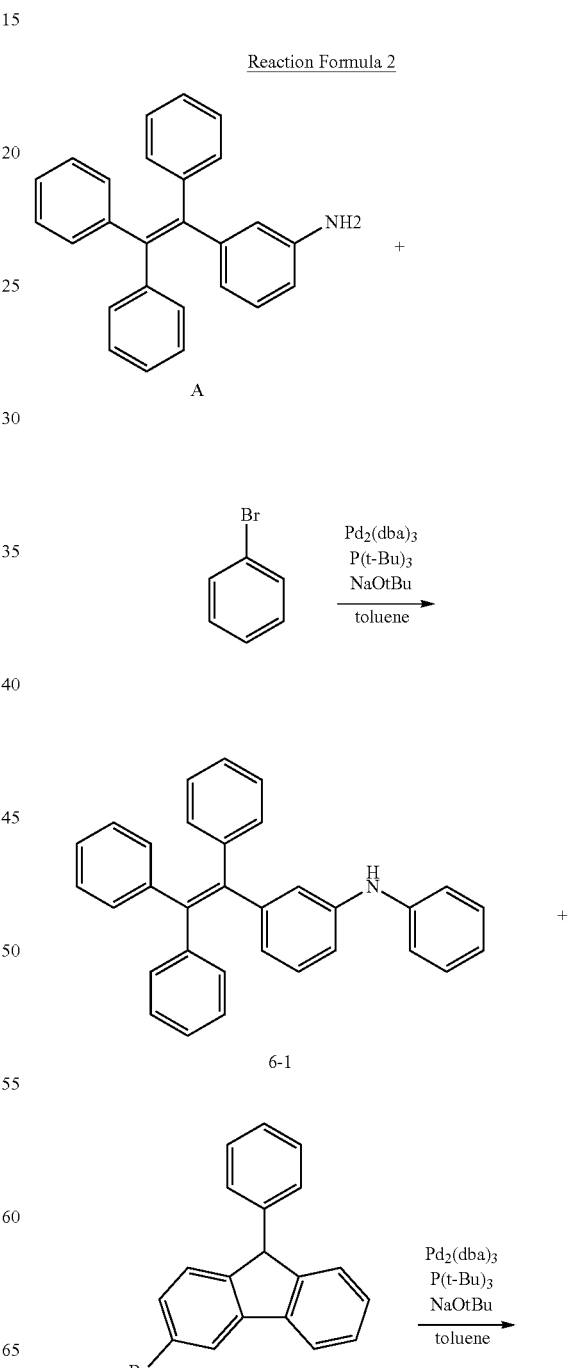

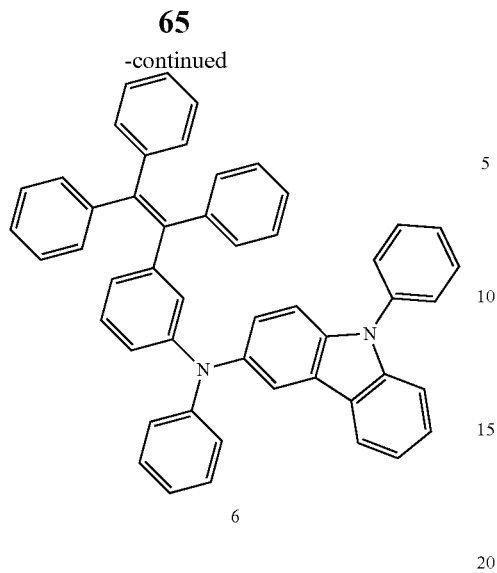

6

Compound 6 (2.5 g, yield: 48%) was obtained in the same manner as utilized for the synthesis of Compound 1, except that 3-bromo-9-phenyl-9H-Carbazole (3.0 g) was utilized instead of 3-bromo-9,9-dimethyl-9H-Fluorene. The molecular weight of Compound 6 was 664 as measured by FAB-MS. The above results confirmed that the obtained compound was Compound 6.

(3) Synthesis of Compound 3

Amine compound 3 according to an embodiment, for example, may be synthesized by the following reaction.

Reaction Formula 3

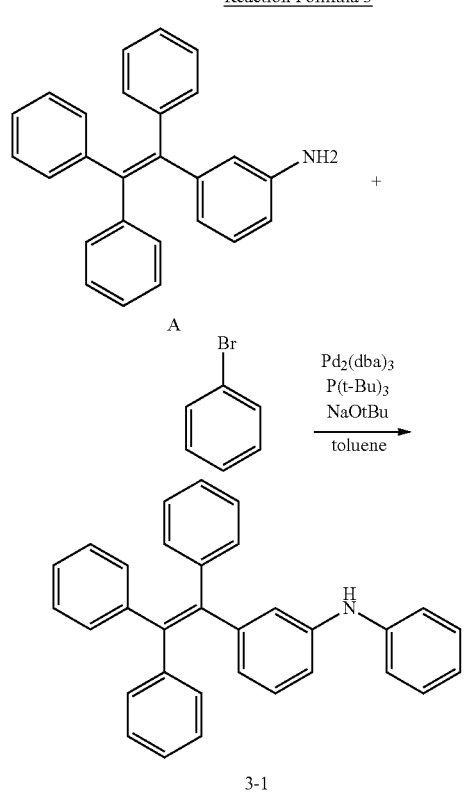

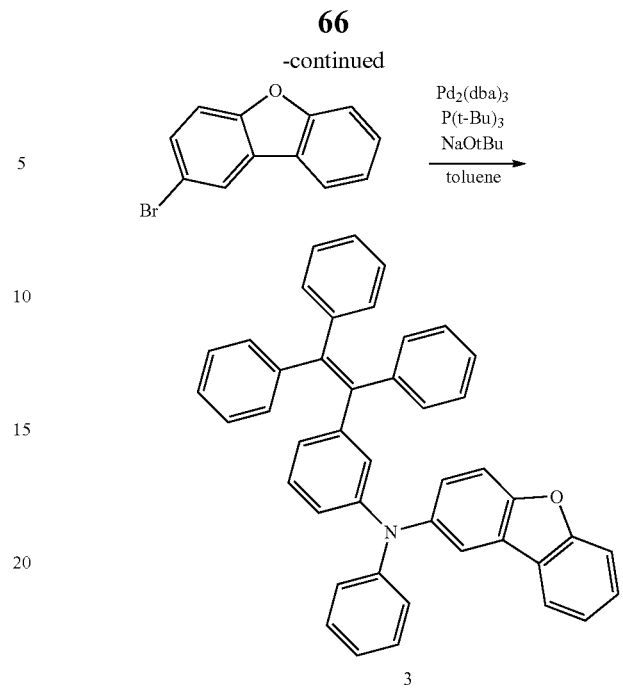

3

Compound 3 (2.3 g, yield: 49%) was obtained in the same manner as utilized for the synthesis of Compound 6, except that 2-bromodibenzo [b, d] furan (2.4 g) was utilized instead of 3-bromo-9-phenyl-9H-Carbazole. The molecular weight of Compound 3 was 589 as measured by FAB-MS. The above results confirmed that the obtained compound was Compound 3.

(4) Synthesis of Compound 30

Amine compound 30 according to an embodiment, for example, may be synthesized by the following reaction.

Reaction Formula 4

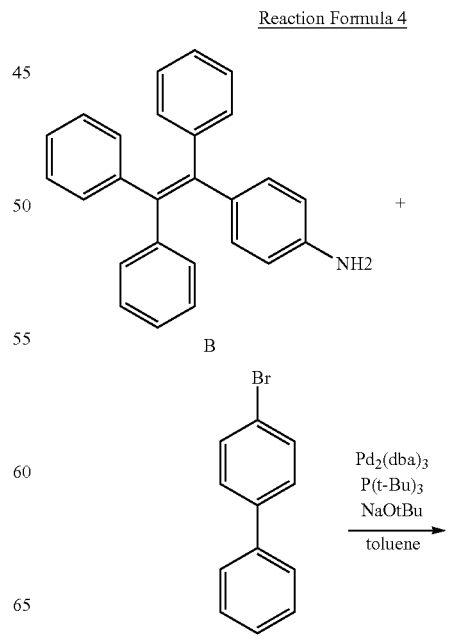

67

-continued

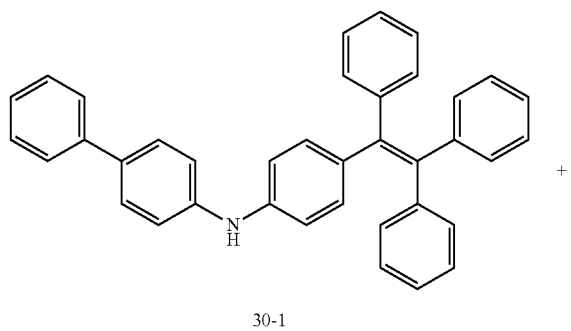

30-1

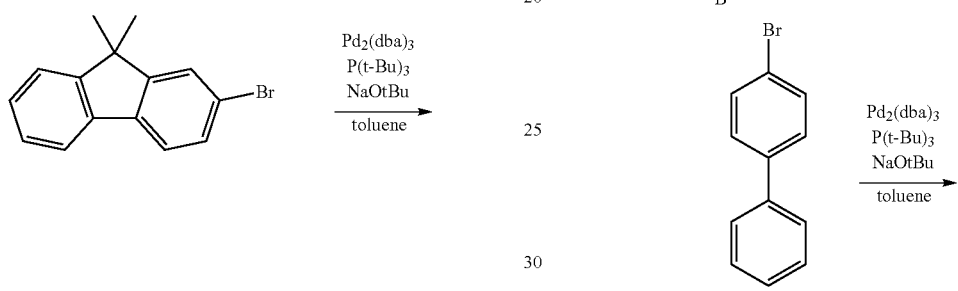

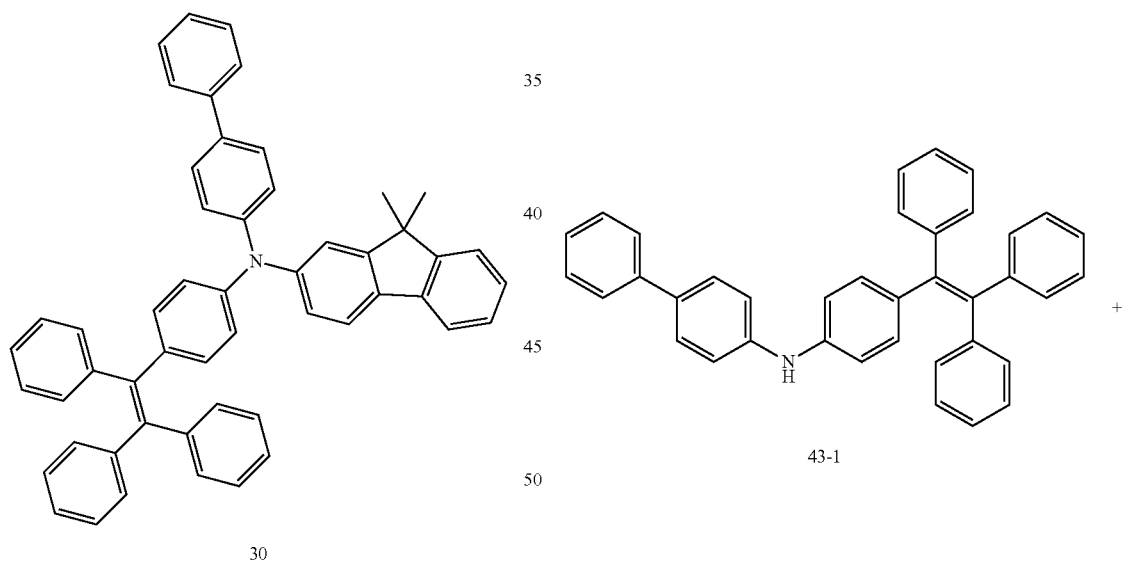

30

Compound 30 (2.8 g, yield: 52%) was obtained in the same manner as utilized for the synthesis of Compound 1, except that Compound B instead of Compound A, 4-bromo-1,1'-Biphenyl instead of bromobenzene, and 2-bromo-9,9-dimethyl-9H-Fluorene (2.6 g) instead of 3-bromo-9,9-dimethyl-9H-Fluorene were utilized. The molecular weight of Compound 30 was 692 as measured by FAB-MS. The above results confirmed that the obtained compound was Compound 30.

68

(5) Synthesis of Compound 43

Amine compound 43 according to an embodiment, for example, may be synthesized by the following reaction.

Reaction Formula 5

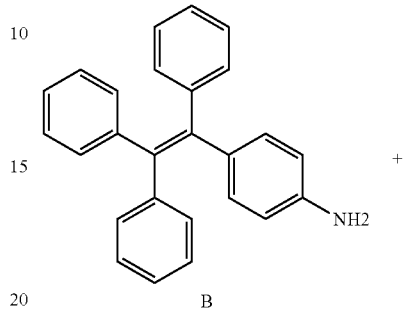

B

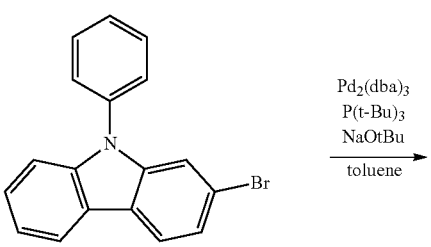

43-1

-continued

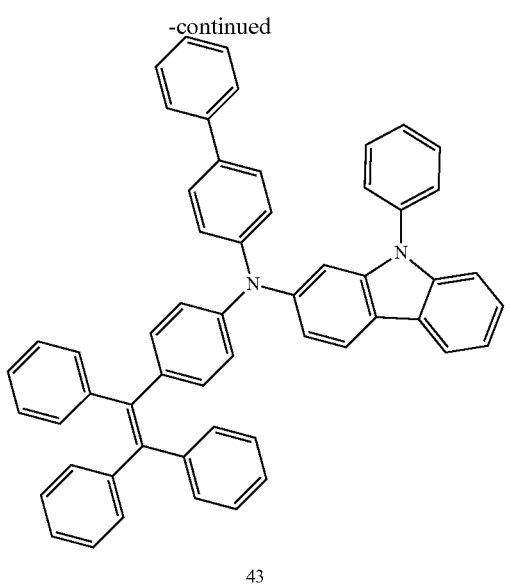

43

Compound 43 (2.5 g, yield: 48%)) was obtained in the same manner as utilized for the synthesis of Compound 30, except that 2-bromo-9-phenyl-9H-Carbazole (3.0 g) was utilized instead of 2-bromo-9,9-dimethyl-9H-Fluorene. The molecular weight of Compound 43 was 741 as measured by FAB-MS. The above results confirmed that the obtained compound was Compound 43.

Amine compound 82 according to an embodiment, for example, may be synthesized by the following reaction.

Reaction Formula 6-1

Reactant 4-(1,2,2-triphenylethenyl) phenyl boronic acid (11.2 g), 1-bromo-4-iodobenzene (8.48 g), Pd (PPh3)4 (1.6 g), and $K_2CO_3$ (11 g) were dissolved in THF (150 ml)/H2O (150 ml), and stirred at 90° C. for 2 hours. The reaction solution was cooled to room temperature, terminated with water, and extracted three times utilizing ethyl ether. The organic layer was dried over anhydrous magnesium sulfate and distilled under reduced pressure, and the residue was separated and purified by column chromatography to obtain Compound C (8.1 g, yield: 56%).

Reaction Formula 6-2

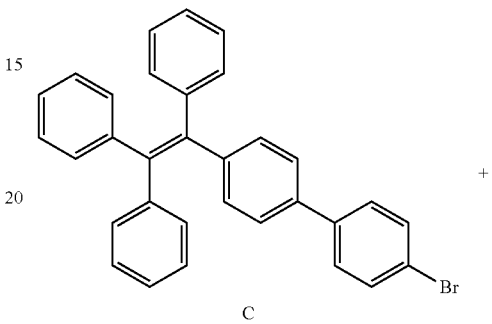

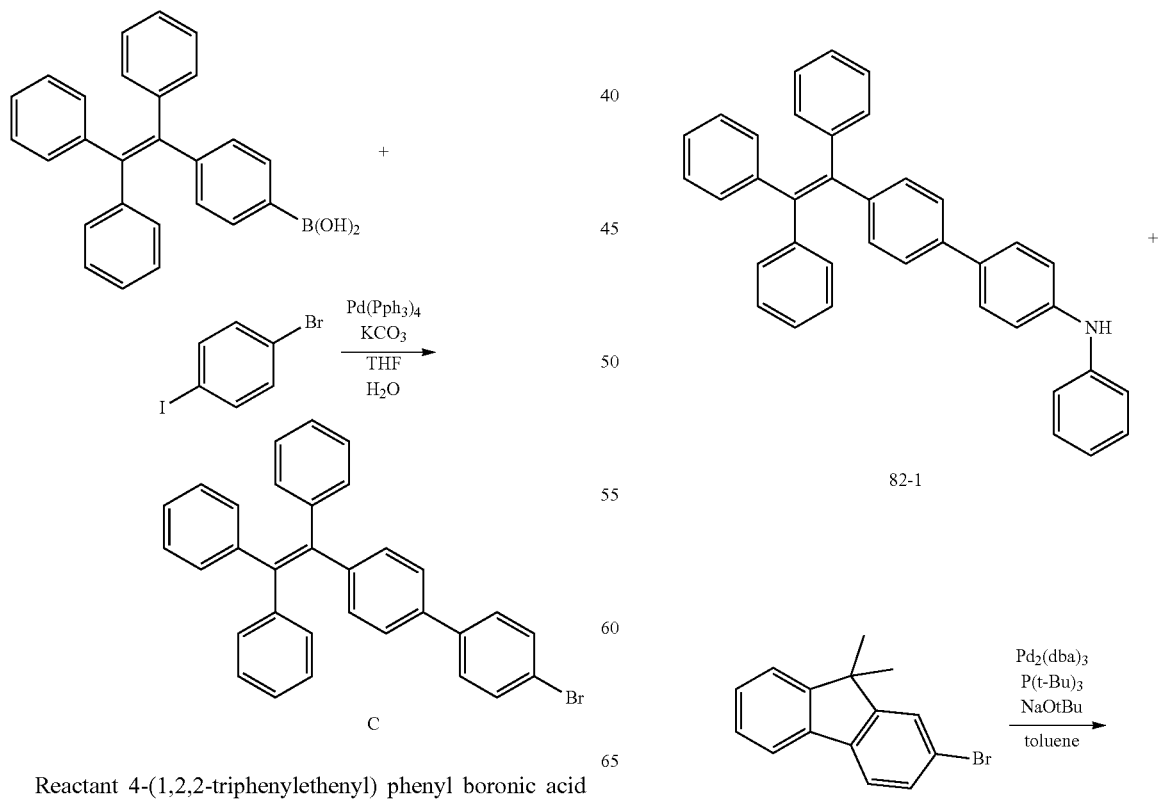

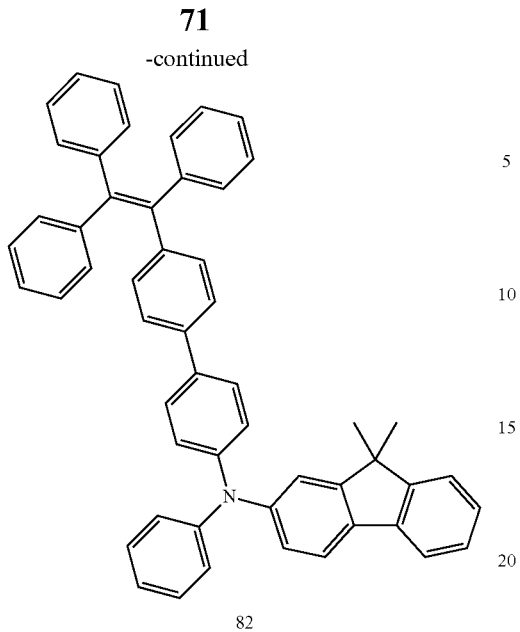

82

Reactant Compound C (7.3 g), aniline (1.6 g), Pd$_2$(dba)$_3$ (0.68 g), P(t-Bu)$_3$ (0.30 g), and NaOtBu (4.32 g) were dissolved in toluene (200 ml) and stirred at 90° C. for 2 hours. The reaction solution was cooled to room temperature, terminated with water, and extracted three times utilizing ethyl ether. The separated organic layer was dried over anhydrous magnesium sulfate and distilled under reduced pressure, and the residue was separated and purified by column chromatography to obtain Intermediate 82-1 (4.0 g, yield: 54%). Compound 82 (2.6 g, Yield: 48) was obtained in the same manner as utilized for the synthesis of Intermediate 82-1, except that Intermediate 82-1 (4.0 g) and 2-bromo-9,9-dimethylfluorene (2.6 g) were utilized instead of Compound C and aniline. The molecular weight of Compound 82 was 692 as measured by FAB-MS. The above results confirmed that the obtained compound was Compound 82.

7) Synthesis of Compound 83

Amine compound 83 according to an embodiment, for example, may be synthesized by the following reaction.

Reaction Formula 7

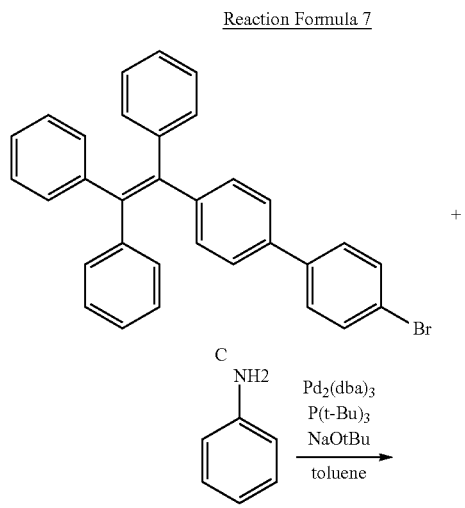

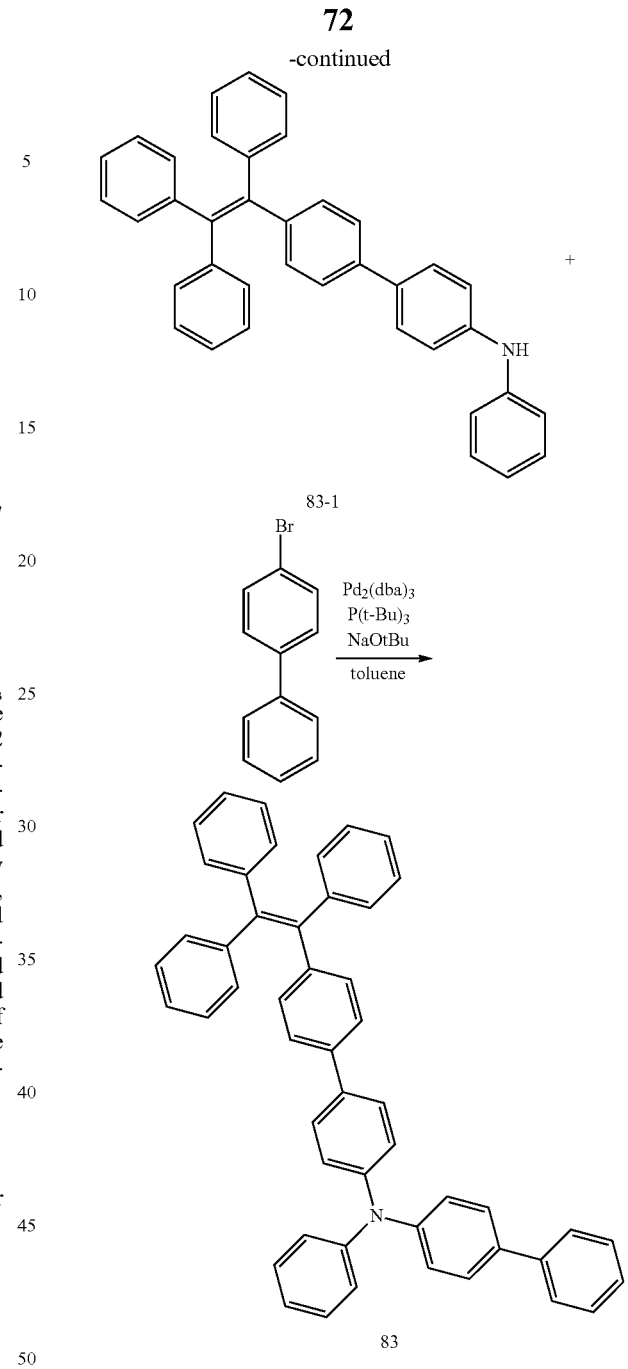

Compound 83 (2.2 g, yield: 44%) was obtained in the same manner as utilized for the synthesis of Compound 82, except that 4-bromobiphenyl (2.2 g) was utilized instead of 2-bromo-9,9-dimethylfluorene. The molecular weight of Compound 83 was 652 as measured by FAB-MS. The above results confirmed that the obtained compound was Compound 83.

2. Structures of Example Compounds and Comparative Example Compounds

The energy levels of Compounds 1, 3, 6, 30, 43, 82, and 83, and Comparative Compounds C1 to C4 below were evaluated. Example Compounds and Comparative Example Compounds in which the energy levels were evaluated are as follows.

1
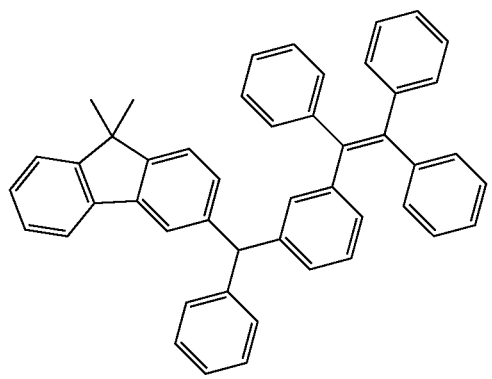
3
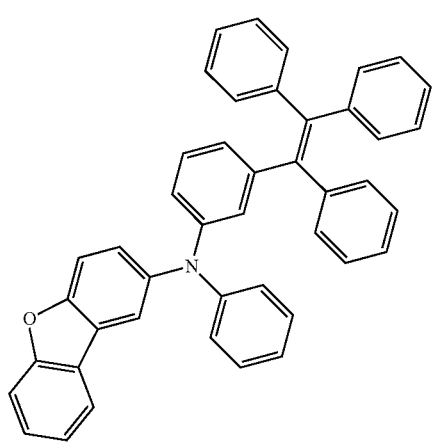
6
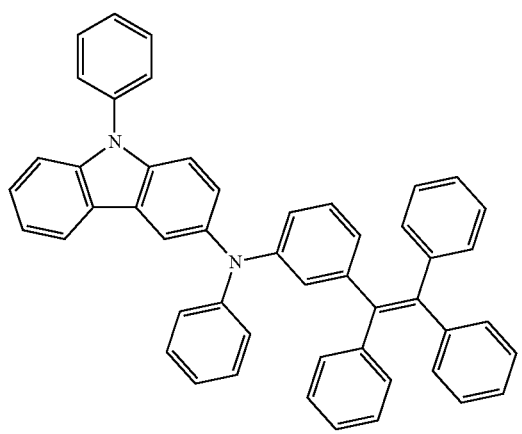
30
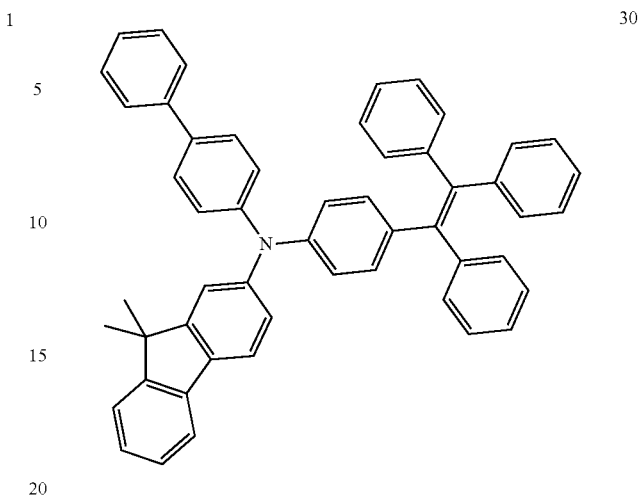
43
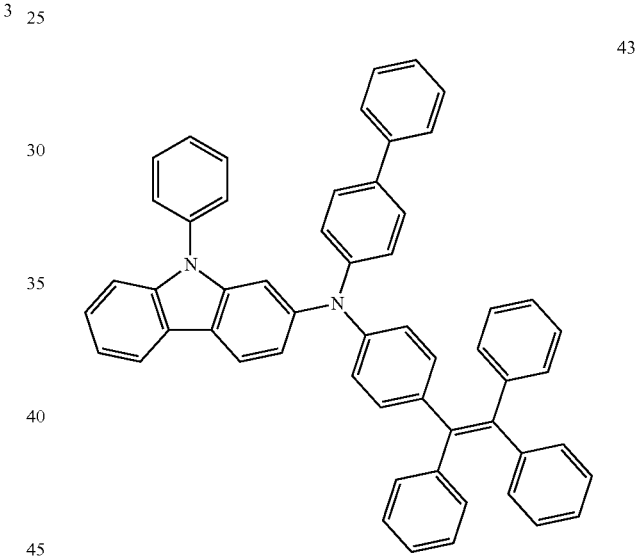
82
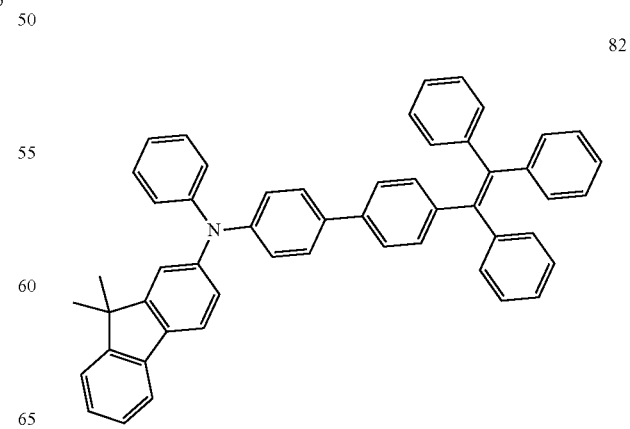

83

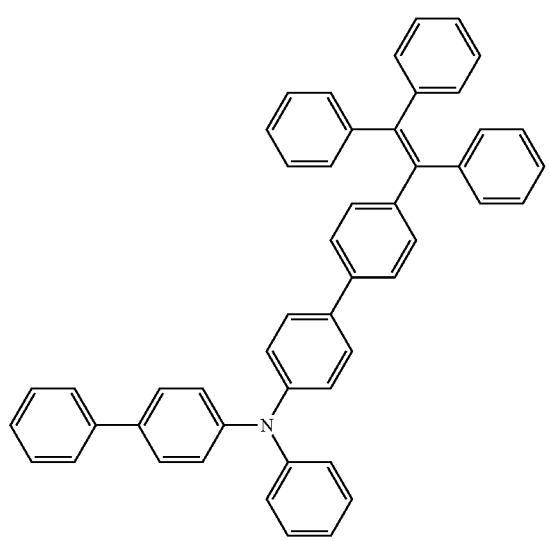

C1

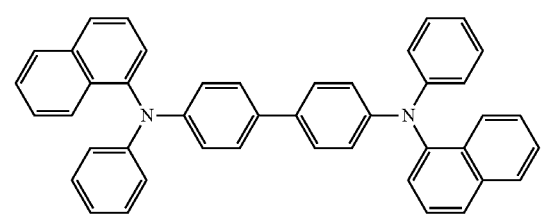

C2

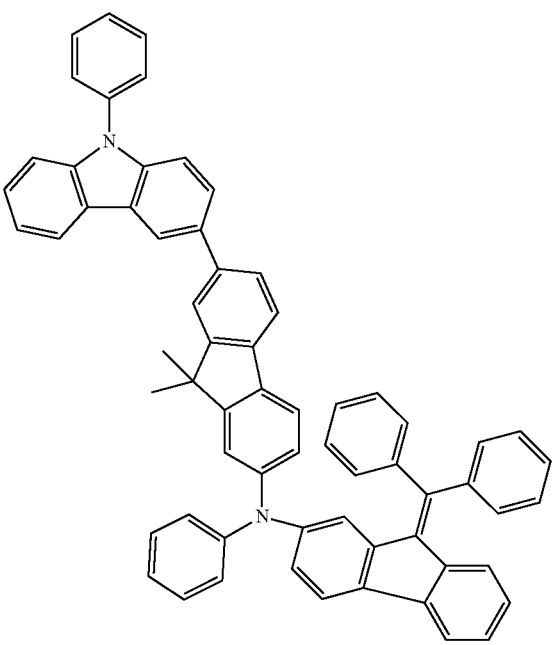

C3

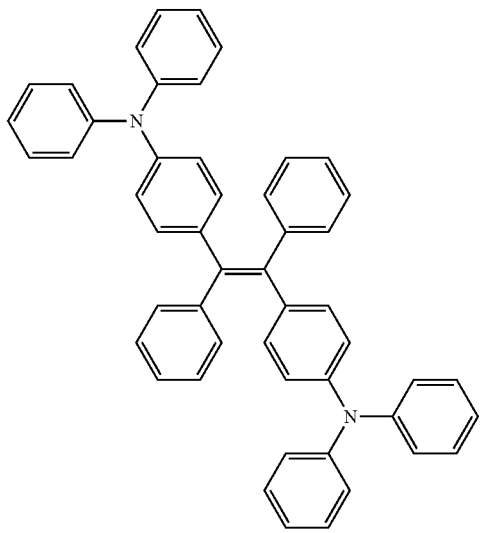

C4

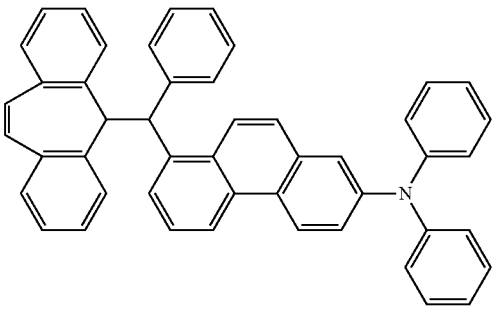

3. Manufacture and Evaluation of Organic Electroluminescence Devices Including Amine Compounds (Manufacture of Organic Electroluminescence Devices)

Organic electroluminescence devices of embodiments each including an amine compound of an embodiment in a hole transport layer were manufactured by the following method. The organic electroluminescence devices of Examples 1 to 7 were manufactured utilizing the amine compounds of Compounds 1, 3, 6, 30, 43, 82, and 83, which are the above-described Example Compounds, as hole transport layer materials respectively. Comparative Examples 1 to 4 are organic electroluminescence devices manufactured utilizing Comparative Example Compounds C1 to C4 as hole transport layer materials respectively.

An ITO glass substrate (Corning, 150/cm² (1200 Å)) was cut to a size of about 50 mm×50 mm×0.7 mm, washed by isopropyl alcohol and distilled water, washed by ultrasonic waves for about 5 minutes, irradiated with ultraviolet rays for about 30 minutes, and then ozone-treated. Thereafter, 4,4',4''-tris{N,-(2-naphthyl)-N-phenylamino}-triphenylamine (2-TNATA) was vacuum-deposited to form a hole injection layer having a thickness of about 600 Å, and then an Example Compound or a Comparative Example Compound was vacuum-deposited to form a hole transport layer having a thickness of about 300 Å.

On the hole transport layer, the blue fluorescent dopants, 9,10-di(naphthalen-2-yl)anthracene (DNA) and 4,4'-bis[2-(4-(N,N-diphenylamino)phenyl)vinyl] biphenyl (DPAVBi) were co-deposited at 98: 2 to form an emission layer having a thickness of about 300 Å.

An electron transport layer having a thickness of about 300 Å was formed of Alq$_3$ on the emission layer, and then LiF was deposited to form an electron injection layer having a thickness of about 10 Å. A second electrode EL2 having a thickness of about 3000 Å was formed of Al on the electron injection layer.

The compounds utilized in the manufacture of the organic electroluminescence devices of Examples and Comparative Examples are as follows.

(Evaluation of Organic Electroluminescence Device Characteristics)

Table 1 shows the evaluation results on the organic electroluminescence devices of Examples 1 to 7 and Comparative Examples 1 to 4. Table 1 compares and shows the driving voltage, luminance, luminous efficiency, and half-life of each of the manufactured organic electroluminescence devices.

In the evaluation results of the characteristics of the Examples and Comparative Examples shown in Table 1, voltage and current density were measured utilizing a source meter (Keithley Instrument, 2400 series), and external quantum efficiency (EQE) was measured utilizing an external quantum efficiency measuring apparatus (Hamamatsu Photonics, C9920-12). The luminous efficiency shows a current efficiency value for a current density of 50 mA/cm$^2$.

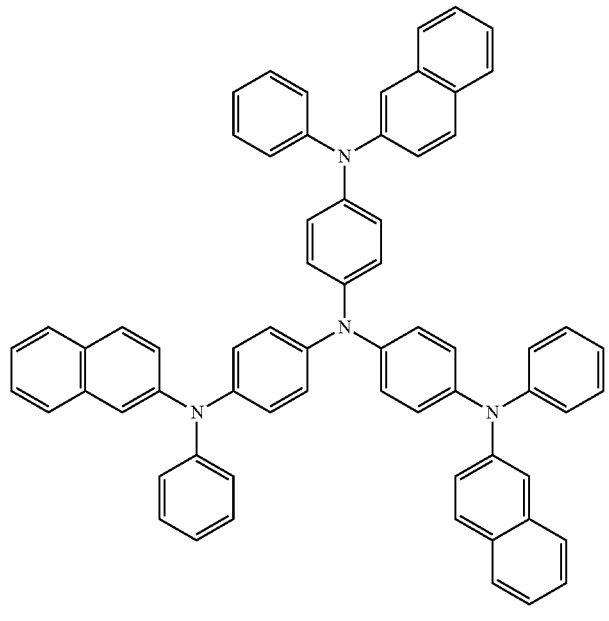

2-TNATA

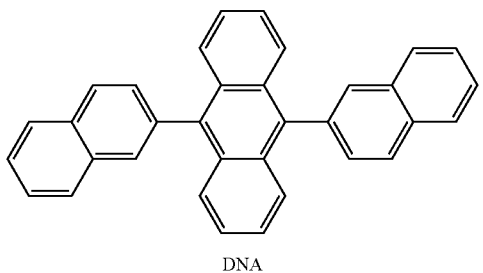

DNA

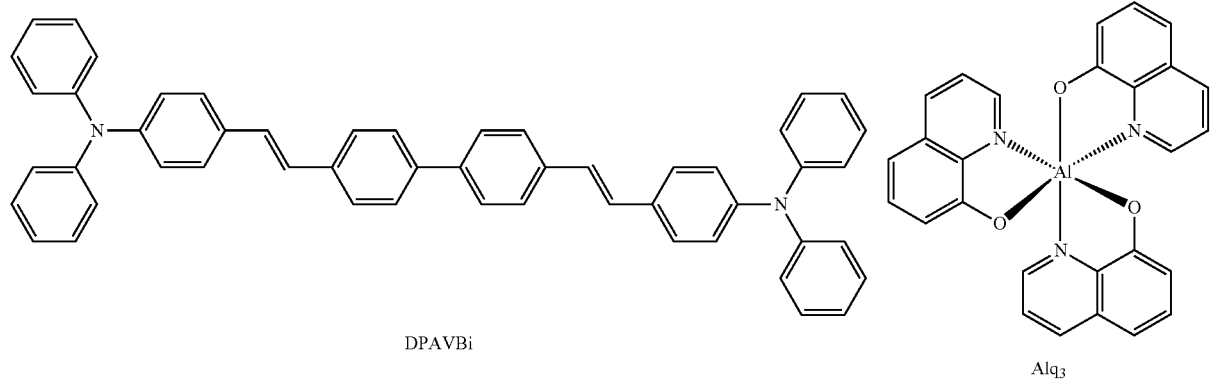

DPAVBi

Alq$_3$

TABLE 1

| Examples of manufactured devices | Hole transport layer material | Driving voltage (V) | Luminance (cd/m$^2$) | Luminous efficiency (cd/A) | Half-life (hr) (@50 mA/cm$^2$) | Emitted color |
|---|---|---|---|---|---|---|
| Example 1 | Compound 1 | 4.42 | 3190 | 7.7 | 322 | Blue |
| Example 2 | Compound 3 | 4.4 | 3272 | 7.0 | 332 | Blue |
| Example 3 | Compound 6 | 4.45 | 3064 | 7.2 | 333 | Blue |
| Example 4 | Compound 30 | 4.47 | 3095 | 7.3 | 302 | Blue |
| Example 5 | Compound 43 | 4.42 | 3030 | 7.6 | 354 | Blue |
| Example 6 | Compound 82 | 4.41 | 3094 | 7.1 | 346 | Blue |
| Example 7 | Compound 83 | 4.52 | 3030 | 7.2 | 351 | Blue |
| Comparative Example 1 | Comparative Compound C1 | 7.01 | 2645 | 5.29 | 258 | Blue |
| Comparative Example 2 | Comparative Compound C2 | 6.42 | 2945 | 6.75 | 287 | Blue |
| Comparative Example 3 | Comparative Compound C3 | 5.15 | 2873 | 6.82 | 294 | Blue |
| Comparative Example 4 | Comparative Compound C4 | 5.33 | 2848 | 6.61 | 298 | Blue |

Referring to the results of Table 1, Examples 1 to 7 of the organic electroluminescence devices each utilizing the amine compound according to an embodiment of the present disclosure as a hole transport layer material emit the same blue light as Comparative Examples 1 to 4, yet each having a lower driving voltage value, relatively higher luminance, higher luminous efficiency, and higher external quantum efficiency. In terms of the Example Compounds, as an arylamine-based hole transport material, the amine compound of the Examples has a high stability due to the tetraphenylethenyl group substituted in the amine group. Accordingly, compared with the Comparative Example Compounds, each of the Example Compounds may have a high hole transport property, and thus the organic electroluminescence devices of each of the Examples may have improved luminous efficiency and a long life as compared to the organic electroluminescence devices of the Comparative Examples. In particular, the organic electroluminescence device of an embodiment includes the amine compound of an embodiment as a hole transport material to achieve high luminous efficiency and a long life in the blue light wavelength region.

Comparative Example Compound C1 includes a diamine compound and does not include a tetraphenylethenyl group substituted in an amine group, thereby having reduced stability and hole transporting properties when compared to the amine compounds of the Examples, and accordingly, it is confirmed that the device of Comparative Example 1 has reduced luminous efficiency and lifetime, and a higher driving voltage when compared to the devices of the Examples. Comparative Example Compounds C2 and C4 each include a tetraphenylethenyl group-like structure substituted with an amine group, but have a form in which the tetraphenylethenyl group forms an additional ring, thereby having reduced stability and hole transport properties when compared to the amine compounds of the Examples, and thus, it is confirmed that the devices of Comparative Examples 2 and 4 have reduced luminous efficiency and lifetime, and higher driving voltage when compared to the devices of the Examples. Comparative Example Compound C3 includes a tetraphenylethenyl group substituted in an amine group, but is a diamine compound, thereby having reduced hole transport properties when compared to the Example Compounds, and thus it is confirmed that the device of Comparative Example 3 has reduced luminous efficiency and lifetime, and higher driving voltage when compared to the devices of the Examples.

An organic electroluminescence device of an embodiment may have improved device characteristics such as a low driving voltage, high efficiency, and a long life.

An amine compound of an embodiment may be included in a hole transport region of an organic electroluminescence device, thereby contributing to high efficiency and a long life of the organic electroluminescence device.

Expressions such as "at least one of" or "at least one selected from" when preceding a list of elements, modify the entire list of elements and do not modify the individual elements of the list. Further, the use of "may" when describing embodiments of the present invention refers to "one or more embodiments of the present invention." Also, the term "exemplary" is intended to refer to an example or illustration. As used herein, the term "substantially," "about," and similar terms are used as terms of approximation and not as terms of degree, and are intended to account for the inherent deviations in measured or calculated values that would be recognized by those of ordinary skill in the art. Moreover, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a), and 35 U.S.C. § 132(a).

Although the present disclosure has been described with reference to preferred embodiments of the present disclosure, it will be understood that the present disclosure should not be limited to these preferred embodiments but various suitable changes and modifications can be made by those skilled in the art without departing from the spirit and scope of the present disclosure.

Accordingly, the technical scope of the present disclosure is not intended to be limited to the contents set forth in the detailed description of the specification, but is intended to be defined by the appended claims, and equivalents thereof.

What is claimed is:

1. An organic electroluminescence device, comprising:
a first electrode;
a second electrode facing the first electrode; and
a plurality of organic layers between the first electrode and the second electrode,
wherein at least one organic layer of the plurality of organic layers comprises an amine compound,
the amine compound comprises an amine group and a tetraphenylethylene group substituted in the amine group,
the amine group is linked to one phenyl group contained in the tetraphenylethylene group and two other groups,
the two other groups are each independently a substituted or unsubstituted aryl group having 6 to 30 ring-forming carbon atoms, or a substituted or unsubstituted heteroaryl group selected from the group consisting of a thiophene group, a furan group, a pyrrole group, an imidazole group, an oxadiazole group, a triazole group, a pyridine group, a bipyridine group, a pyrimidine group, a triazine group, an acridyl group, a pyridazine group, a pyrazinyl group, a quinoline group, a quinazoline group, a quinoxaline group, a phenoxazine group, a phthalazine group, a pyrido pyrimidine group, a pyrido pyrazine group, a pyrazino pyrazine group, an isoquinoline group, an indole group, a carbazole group, an N-arylcarbazole group, an N-heteroarylcarbazole group, an N-alkylcarbazole group, a benzoxazole group, a benzimidazole group, a benzothiazole group, a benzocarbazole group, a benzothiophene group, a dibenzothiophene group, a thienothiophene group, a benzofuran group, a phenanthroline group, a thiazole group, an isoxazole group, an oxazole group, an oxadiazole group, a phenothiazine group, a dibenzosilole group, and a dibenzofuran group,
wherein each substituent of the substituted aryl group is selected from the group consisting of a deuterium atom, a halogen atom, a cyano group, a nitro group, a silyl group, an oxy group, a sulfinyl group, a sulfonyl group, a carbonyl group, a boron group, a phosphine oxide group, a phosphine sulfide group, an alkyl group, an alkenyl group, an alkoxy group, a hydrocarbon ring group, an aryl group, and a heterocyclic group, the heterocyclic group being selected from the group consisting of a thiophene group, a furan group, a pyrrole group, an imidazole group, a thiazole group, an oxazole group, an oxadiazole group, a pyridine group, a bipyridine group, a pyrimidine group, a triazine group, a triazole group, an acridyl group, a pyridazine group, a pyrazinyl group, a quinoline group, a quinazoline group, a quinoxaline group, a phenoxazine group, a phthalazine group, a pyrido pyrimidine group, a pyrido pyrazine group, a pyrazino pyrazine group, an isoquinoline group, an indole group, a carbazole group, an N-arylcarbazole group, an N-heteroarylcarbazole group, an N-alkylcarbazole group, a benzoxazole group, a benzothiazole group, a benzocarbazole group, a benzothiophene group, a dibenzothiophene group, a benzofuran group, a phenanthroline group, a thiazole group, an isoxazole group, an oxazole group, an oxadiazole group, a thiadiazole group, a phenothiazine group, a dibenzosilole group, and a dibenzofuran group, and
wherein the amine compound is a monoamine compound, in which only one amine group exists in its molecular structure without forming a ring,
when one of the two other groups is an unsubstituted phenyl group, then the two other groups are different from each other, and
when the amine group is directly linked to the one phenyl group contained in the tetraphenylethylene group and one or both of the two other groups are each an unsubstituted aryl group, then the unsubstituted aryl group has 6 to 13 ring-forming carbon atoms.

2. The organic electroluminescence device of claim 1, wherein the tetraphenylethylene group is bonded through a linker or directly to the amine group.

3. The organic electroluminescence device of claim 1, wherein the plurality of organic layers comprise:
a hole transport region on the first electrode;
an emission layer on the hole transport region; and
an electron transport region on the emission layer, and
wherein the hole transport region comprises the amine compound.

4. The organic electroluminescence device of claim 3, wherein the hole transport region comprises:
a hole injection layer on the first electrode; and
a hole transport layer on the hole injection layer, and
wherein the hole transport layer comprises the amine compound.

5. The organic electroluminescence device of claim 3, wherein the hole transport region comprises a plurality of organic layers, and
an organic layer adjacent to the emission layer from among the plurality of organic layers comprised in the hole transport region comprises the amine compound.

6. An organic electroluminescence device, comprising:
a first electrode;
a second electrode facing the first electrode; and
a plurality of organic layers between the first electrode and the second electrode,
wherein at least one organic layer of the plurality of organic layers comprises an amine compound represented by Formula 1:

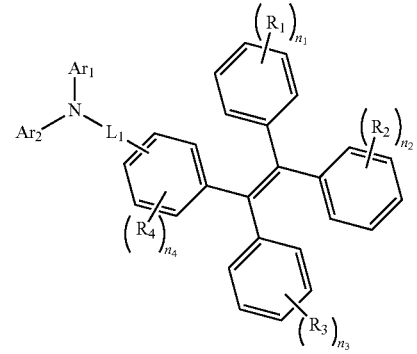

Formula 1 wherein in Formula 1,
$Ar_1$ and $Ar_2$ are each independently a substituted or unsubstituted aryl group having 6 to 30 ring-forming carbon atoms, or a substituted or unsubstituted heteroaryl group selected from the group consisting of a thiophene group, a furan group, a pyrrole group, an imidazole group, an oxadiazole group, a triazole group, a pyridine group, a bipyridine group, a pyrimidine group, a triazine group, an acridyl group, a pyridazine group, a pyrazinyl group, a quinoline group, a quinazoline group, a quinoxaline group, a phenoxazine group, a phthalazine group, a pyrido pyrimidine group, a pyrido pyrazine group, a pyrazino pyrazine group, an isoquinoline group, an indole group, a carbazole group, an N-arylcarbazole group, an N-heteroarylcarbazole group, an N-alkylcarbazole group, a benzoxazole group, a benzimidazole group, a benzothiazole group, a benzocarbazole group, a benzothiophene group, a dibenzothiophene group, a thienothiophene group, a benzofuran group, a phenanthroline group, a thiazole group, an isoxazole group, an oxazole group, an oxadiazole group, a phenothiazine group, a dibenzosilole group, and a dibenzofuran group, and wherein each substituent of the substituted aryl group is selected from the group consisting of a deuterium atom, a halogen atom, a cyano group, a nitro group, a silyl group, an oxy group, a sulfinyl group, a sulfonyl group, a carbonyl group, a boron group, a phosphine oxide group, a phosphine sulfide group, an alkyl group, an alkenyl group, an alkoxy group, a hydrocarbon ring group, an aryl group, and a heterocyclic group, the heterocyclic group being selected from the group consisting of a thiophene group, a furan group, a pyrrole group, an imidazole group, a thiazole group, an oxazole group, an oxadiazole group, a pyridine group, a bipyridine group, a pyrimidine group, a triazine group, a triazole group, an acridyl group, a pyridazine group, a pyrazinyl group, a quinoline group, a quinazoline group, a quinoxaline group, a phenoxazine group, a phthalazine group, a pyrido pyrimidine group, a pyrido pyrazine group, a pyrazino pyrazine group, an isoquinoline group, an indole group, a carbazole group, an N-arylcarbazole group, an N-heteroarylcarbazole group, an N-alkylcarbazole group, a benzoxazole group, a benzothiazole group, a benzocarbazole group, a benzothiophene group, a dibenzothiophene group, a benzofuran group, a phenanthroline group, a thiazole group, an isoxazole group, an oxazole group, an oxadiazole group, a thiadiazole group, a phenothiazine group, a dibenzosilole group, and a dibenzofuran group, $L_1$ is a direct linkage, a substituted or unsubstituted arylene group having 6 to 30 ring-forming carbon atoms, or a substituted or unsubstituted heteroarylene group having 2 to 30 ring-forming carbon atoms, $R_1$ to $R_4$ are each independently a hydrogen atom, a deuterium atom, a halogen atom, a substituted or unsubstituted alkyl group having 1 to 20 carbon atoms, a substituted or unsubstituted aryl group having 6 to 60 ring-forming carbon atoms, or a substituted or unsubstituted heteroaryl group having 2 to 60 ring-forming carbon atoms, $n_1$ to $n_3$ are each independently an integer of 0 to 5, $n_4$ is an integer of 0 to 4, wherein the amine compound is a monoamine compound, in which only one amine group exists in its molecular structure without forming a ring, when one of $Ar_1$ or $Ar_2$ is an unsubstituted phenyl group, then $Ar_1$ and $Ar_2$ are different from each other, and when $L_1$ is a direct linkage, and $Ar_1$ and/or $Ar_2$ is an unsubstituted aryl group, then the unsubstituted aryl group has 6 to 13 ring-forming carbon atoms.

7. The organic electroluminescence device of claim 6, wherein the amine compound represented by Formula 1 is represented by Formula 2-1 or Formula 2-2:

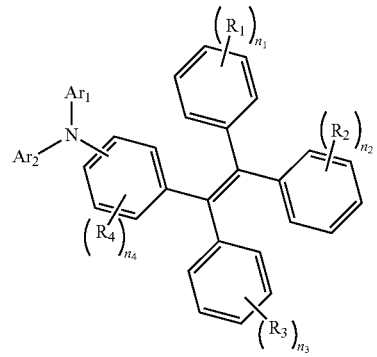

Formula 2-1

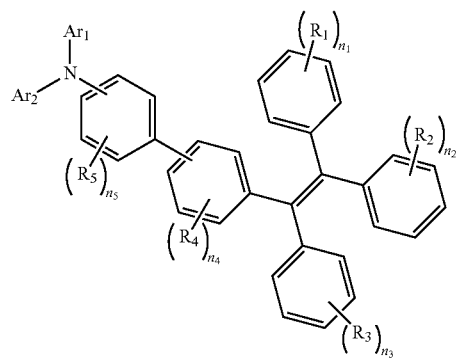

Formula 2-2 wherein in Formulas 2-1 and 2-2, $R_5$ is a hydrogen atom, a deuterium atom, a halogen atom, a substituted or unsubstituted alkyl group having 1 to 20 carbon atoms, a substituted or unsubstituted aryl group having 6 to 60 ring-forming carbon atoms, or a substituted or unsubstituted heteroaryl group having 2 to 60 ring-forming carbon atoms, $n_5$ is an integer of 0 to 4, and $Ar_1$ and $Ar_2$, $R_1$ to $R_4$, and $n_1$ to $n_4$ are the same as respectively defined in Formula 1.

8. The organic electroluminescence device of claim 6, wherein the amine compound represented by Formula 1 is represented by any one of Formulas 3-1 to 3-3:

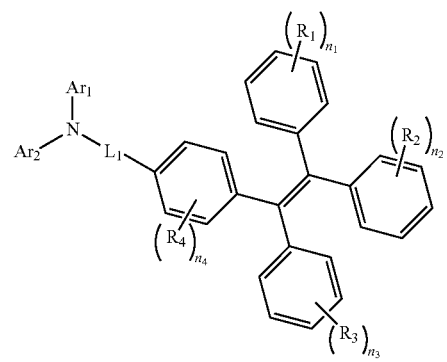

Formula 3-1

-continued

Formula 3-2

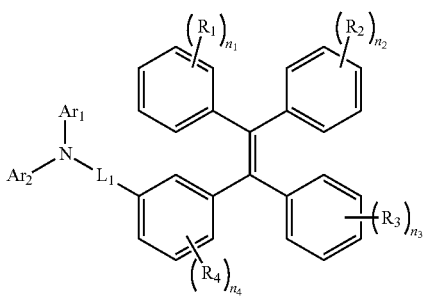

Formula 3-3 wherein in Formulas 3-1 to 3-3, Ar$_1$ and Ar$_2$, R$_1$ to R$_4$, and n$_1$ to n$_4$ are the same as respectively defined in Formula 1.

9. The organic electroluminescence device of claim 6, wherein Ar$_1$ and Ar$_2$ are each independently a substituted or unsubstituted phenyl group, a substituted or unsubstituted biphenyl group, a substituted or unsubstituted naphthyl group, a substituted or unsubstituted fluorenyl group, a substituted or unsubstituted carbazole group, or a substituted or unsubstituted dibenzofuran group, and wherein each substituent of the substituted phenyl group, the substituted biphenyl group, the substituted naphthyl group, and the substituted fluorenyl group is selected from the group consisting of a deuterium atom, a halogen atom, a cyano group, a nitro group, a silyl group, an oxy group, a sulfinyl group, a sulfonyl group, a carbonyl group, a boron group, a phosphine oxide group, a phosphine sulfide group, an alkyl group, an alkenyl group, an alkoxy group, a hydrocarbon ring group, an aryl group, and a heterocyclic group, the heterocyclic group being selected from the group consisting of a thiophene group, a furan group, a pyrrole group, an imidazole group, a thiazole group, an oxazole group, an oxadiazole group, a pyridine group, a bipyridine group, a pyrimidine group, a triazine group, a triazole group, an acridyl group, a pyridazine group, a pyrazinyl group, a quinoline group, a quinazoline group, a quinoxaline group, a phenoxazine group, a phthalazine group, a pyrido pyrimidine group, a pyrido pyrazine group, a pyrazino pyrazine group, an isoquinoline group, an indole group, a carbazole group, an N-arylcarbazole group, an N-heteroarylcarbazole group, an N-alkylcarbazole group, a benzoxazole group, a a benzothiazole group, a benzocarbazole group, a benzothiophene group, a dibenzothiophene group, a benzofuran group, a phenanthroline group, a thiazole group, an isoxazole group, an oxazole group, an oxadiazole group, a thiadiazole group, a phenothiazine group, a dibenzosilole group, and a dibenzofuran group, and when one of Ar$_1$ or Ar$_2$ is an unsubstituted phenyl group, Ar$_1$ and Ar$_2$ are different from each other.

10. The organic electroluminescence device of claim 6, wherein Ar$_1$ and Ar$_2$ are different from each other.

11. The organic electroluminescence device of claim 6, wherein:

Ar$_1$ is a substituted or unsubstituted aryl group having 6 to 12 ring-forming carbon atoms, and Ar$_2$ is a substituted or unsubstituted aryl group in which two or more rings are condensed, or a substituted or unsubstituted heteroaryl group selected from the group consisting of an acridyl group, a quinoline group, a quinazoline group, a quinoxaline group, a phenoxazine group, a phthalazine group, a pyrido pyrimidine group, a pyrido pyrazine group, a pyrazino pyrazine group, an isoquinoline group, an indole group, a carbazole group, an N-arylcarbazole group, an N-heteroarylcarbazole group, an N-alkylcarbazole group, a benzoxazole group, a benzimidazole group, a benzothiazole group, a benzocarbazole group, a benzothiophene group, a dibenzothiophene group, a thienothiophene group, a benzofuran group, a phenanthroline group, a phenothiazine group, a dibenzosilole group, and a dibenzofuran group, and each substituent of the substituted aryl group having 6 to 12 ring-forming carbon atoms and the substituted aryl group in which two or more rings are condensed is selected from the group consisting of a deuterium atom, a halogen atom, a cyano group, a nitro group, a silyl group, an oxy group, a sulfinyl group, a sulfonyl group, a carbonyl group, a boron group, a phosphine oxide group, a phosphine sulfide group, an alkyl group, an alkenyl group, an alkoxy group, a hydrocarbon ring group, an aryl group, and a heterocyclic group.

12. The organic electroluminescence device of claim 6, wherein the amine compound is one of the compounds represented by Compound Group 1:

Compound Group 1

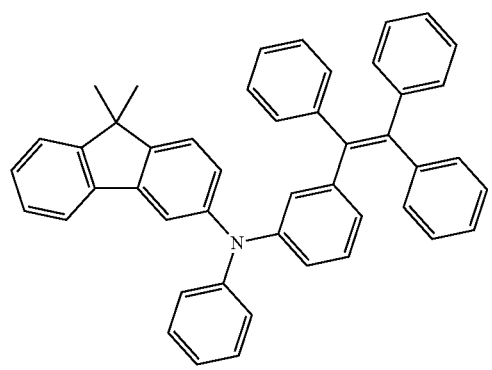

1

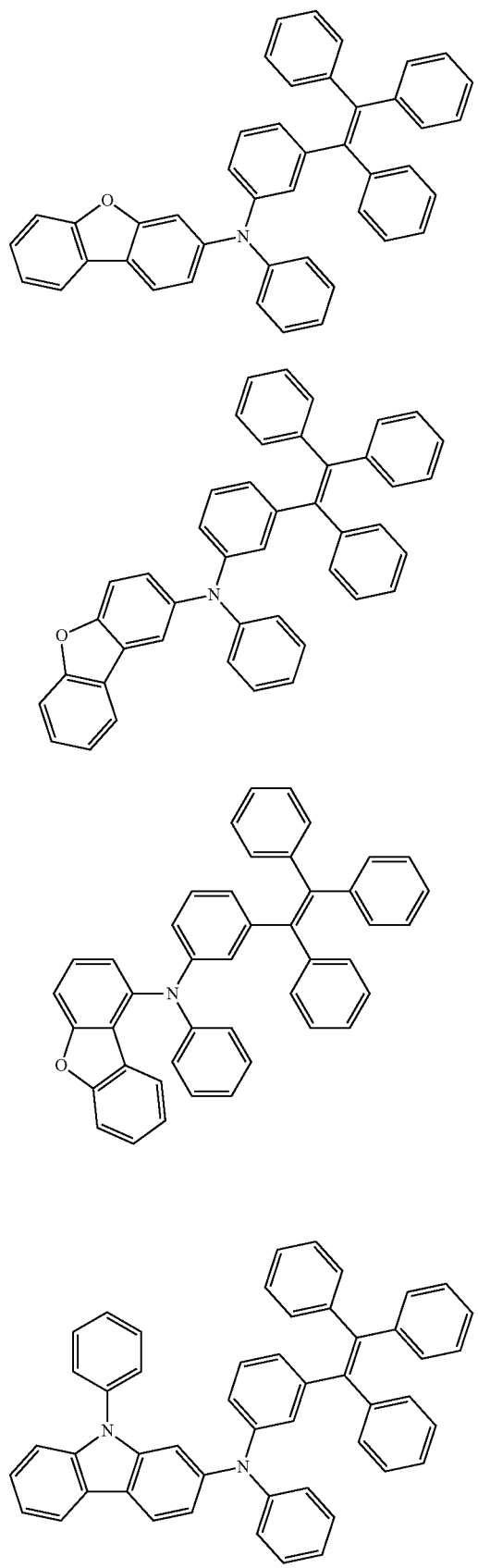
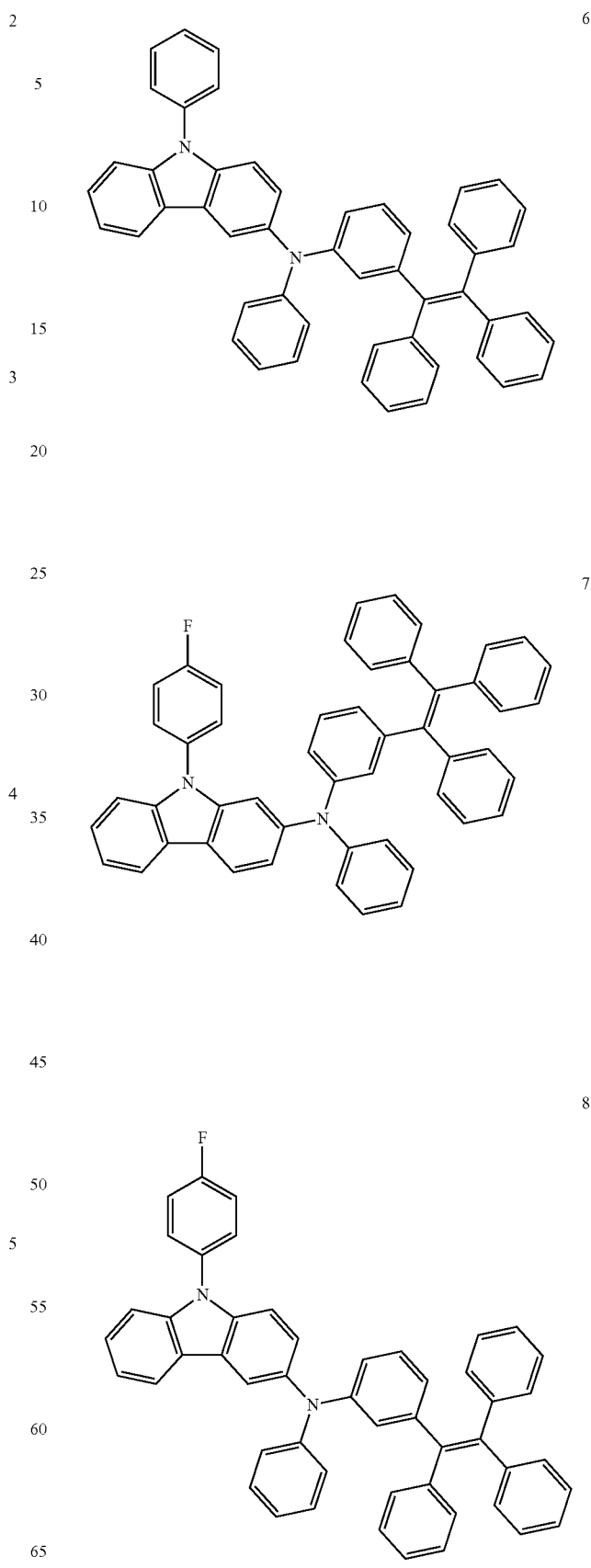

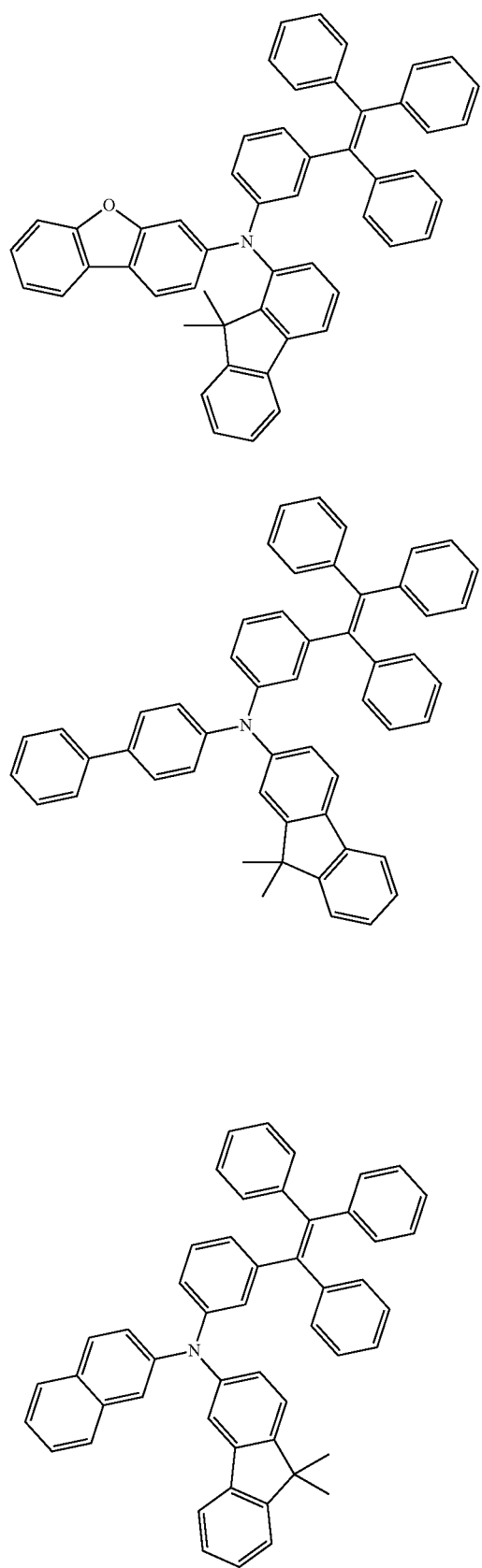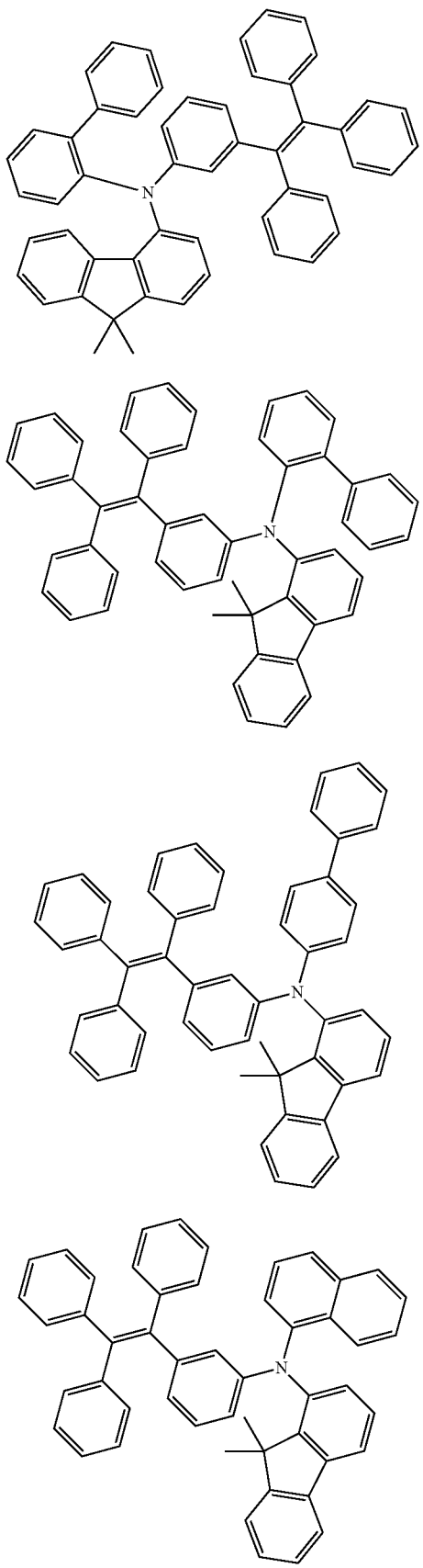

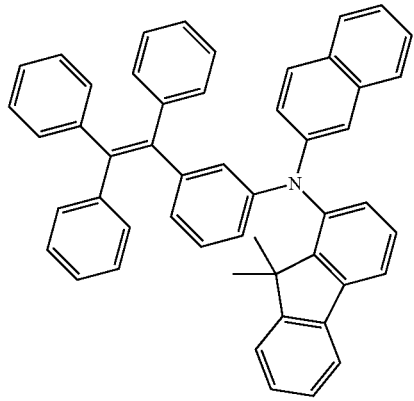
16
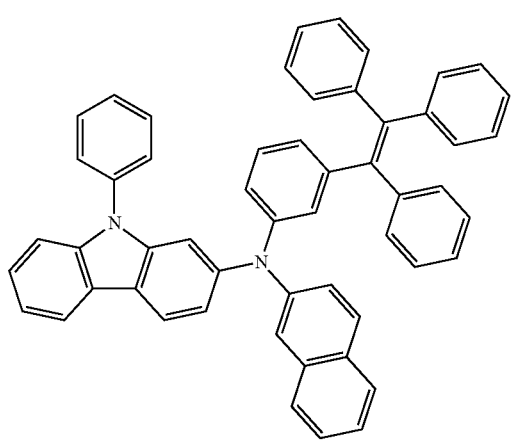
17
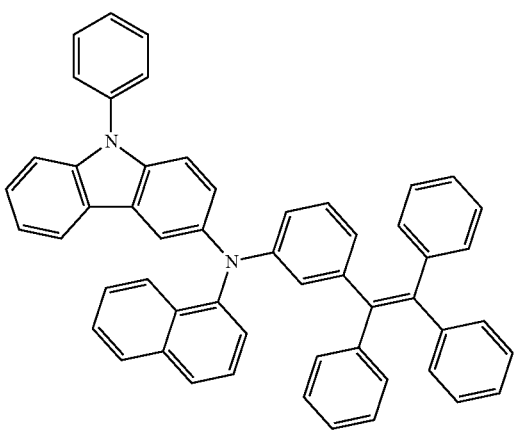
18
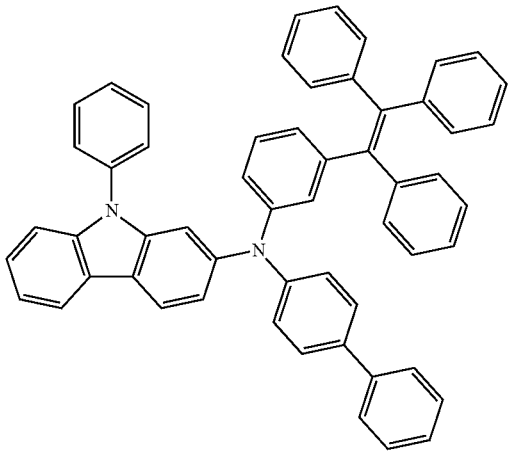
19
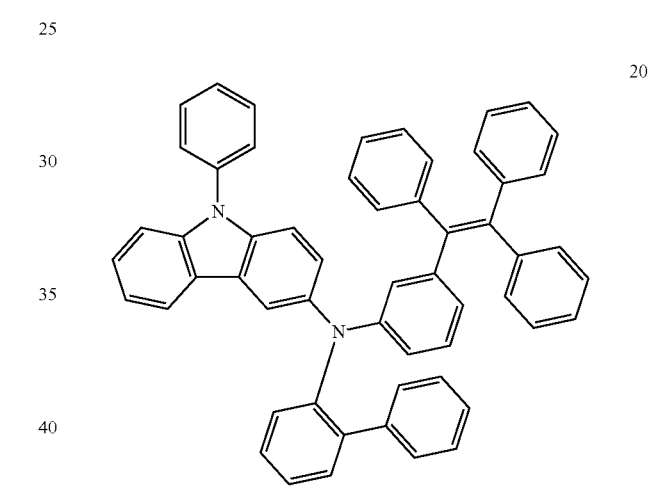
20
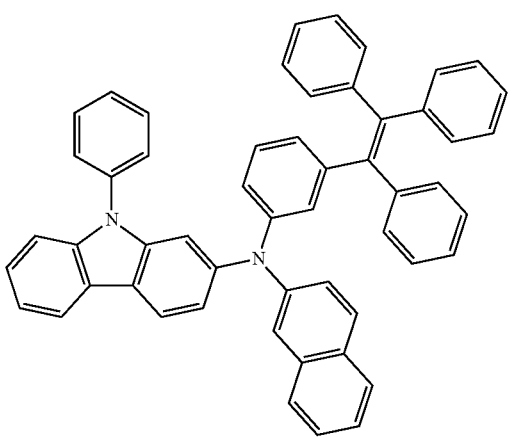
21

22
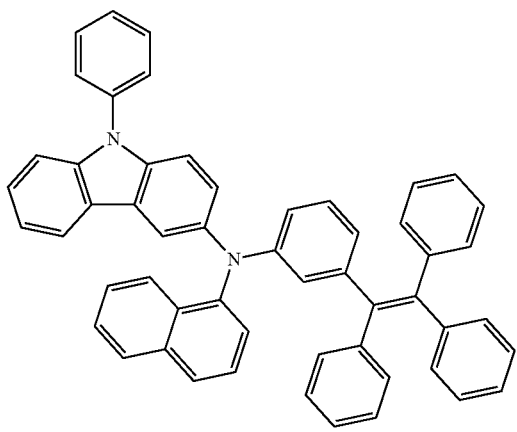
23
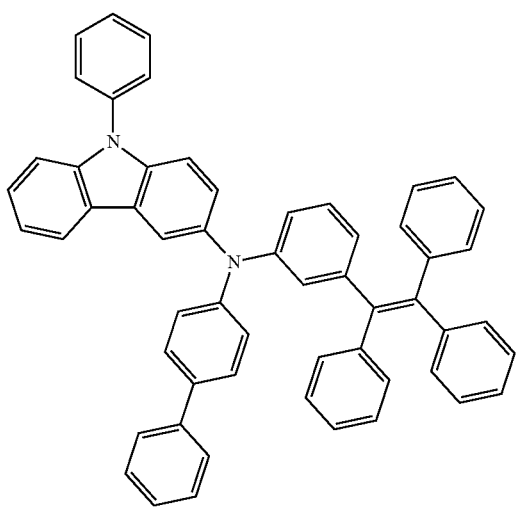
24
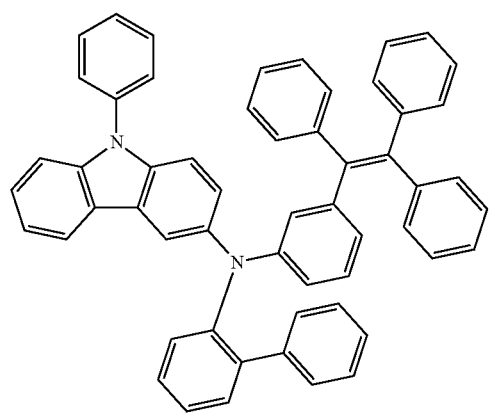
25
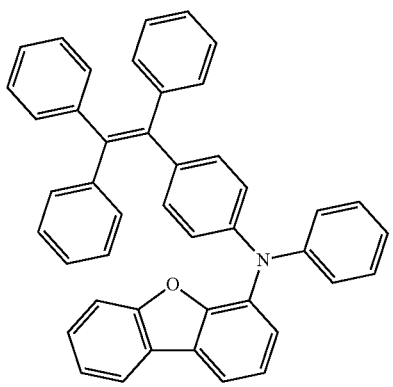
26
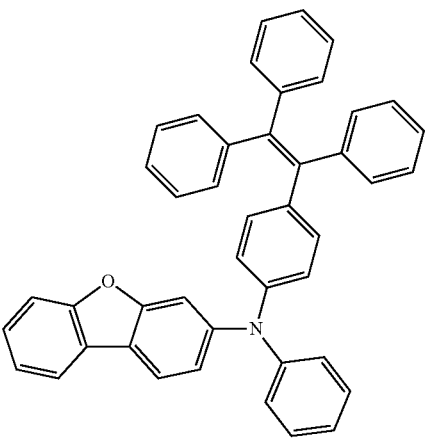
27
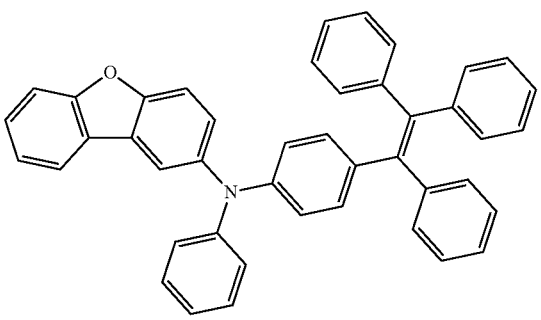
28
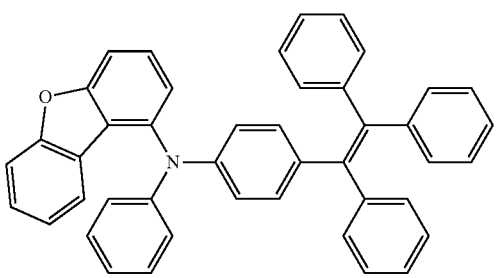

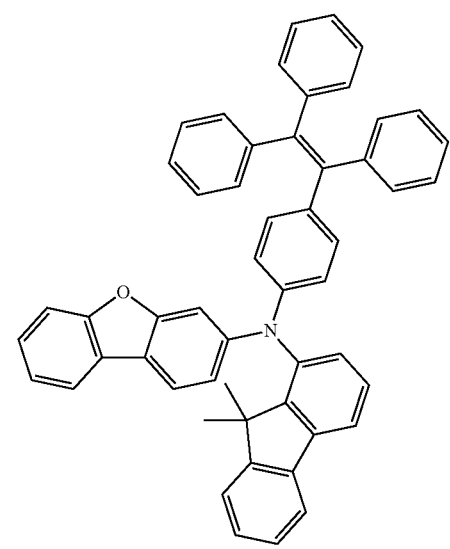
29
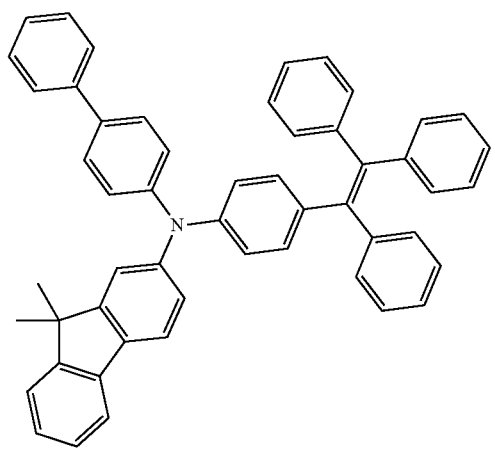
30
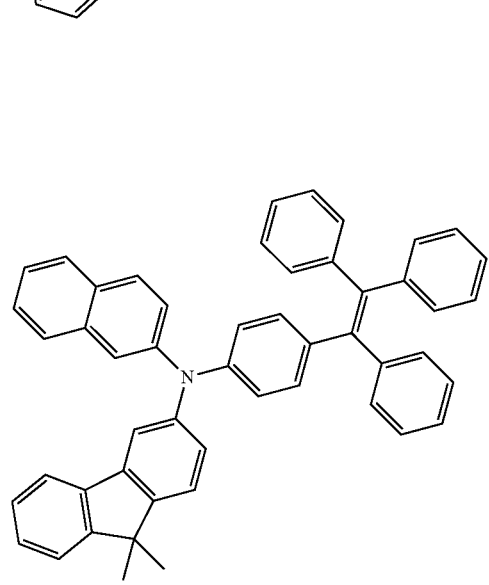
31
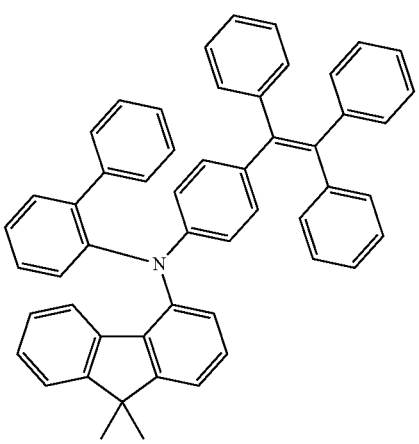
32
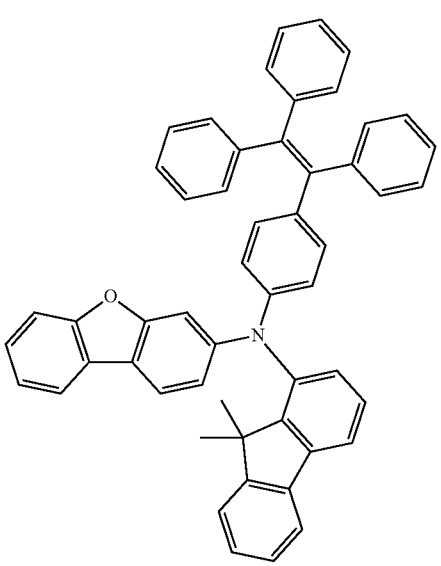
33
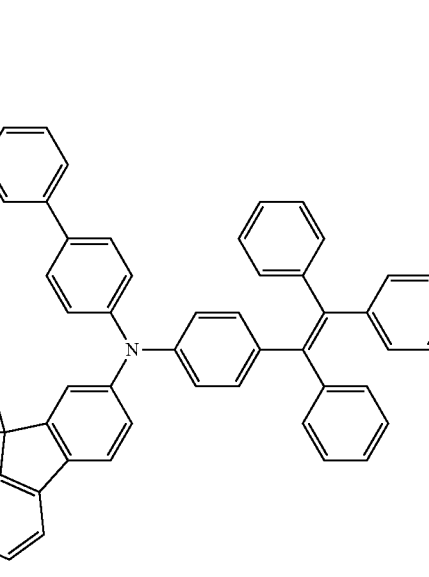
34

35
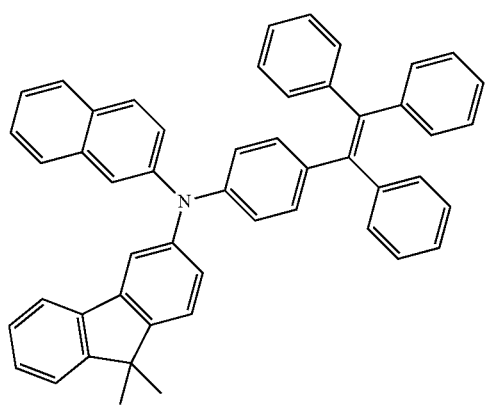
36
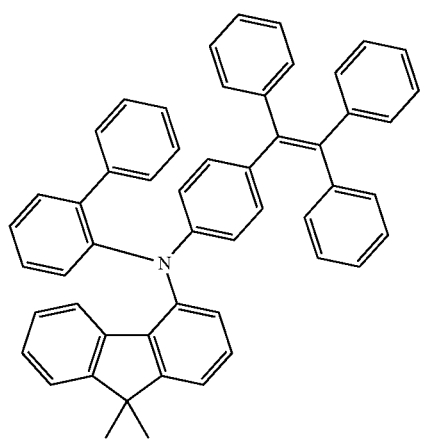
37
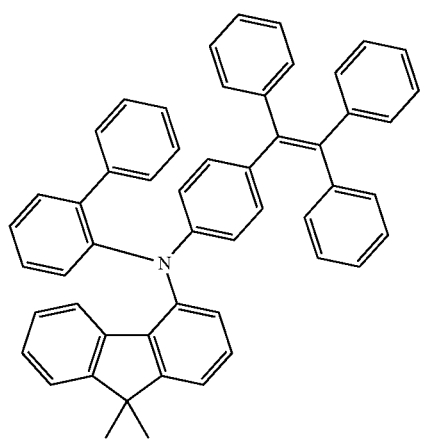
38
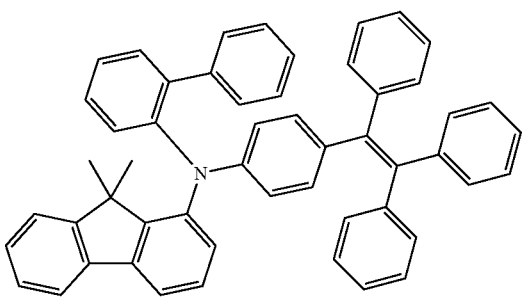
39
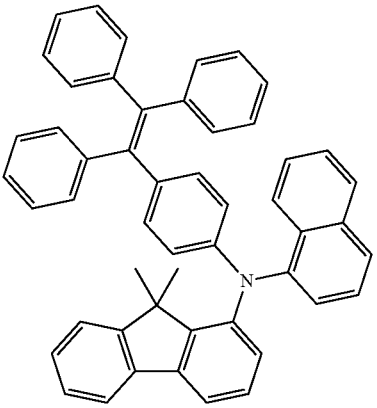
40
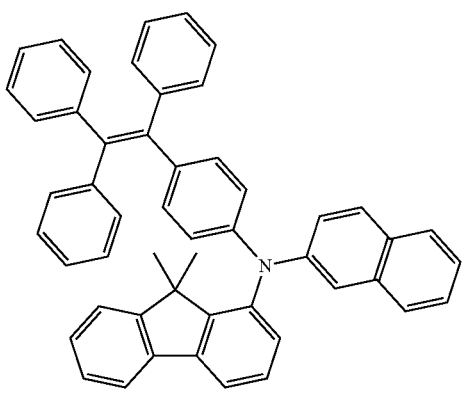
41
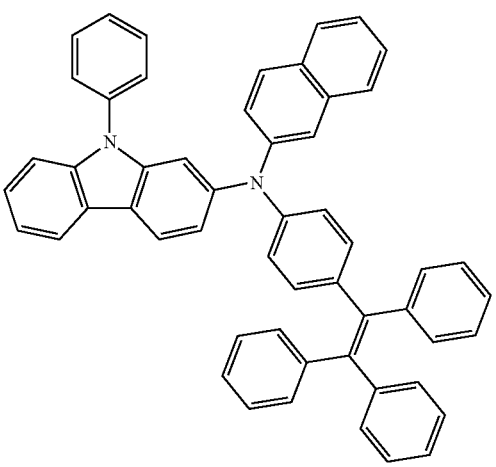

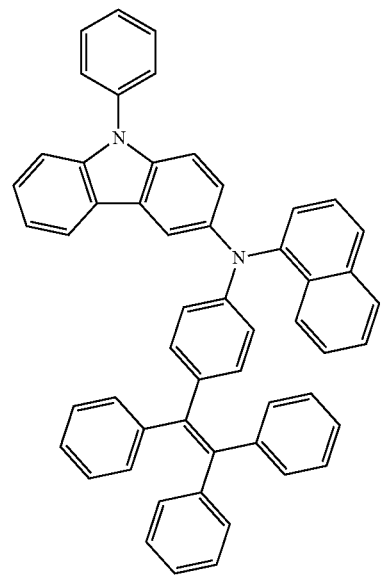
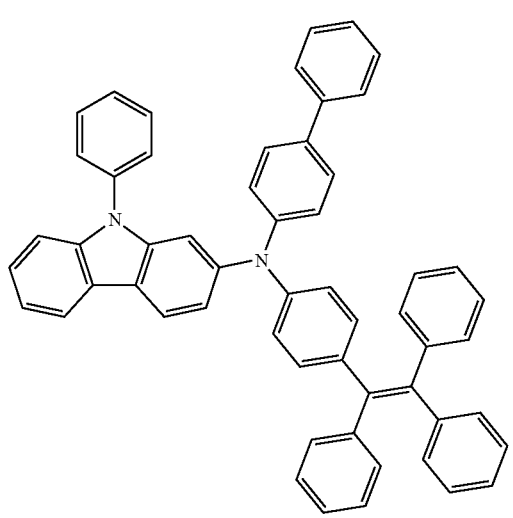
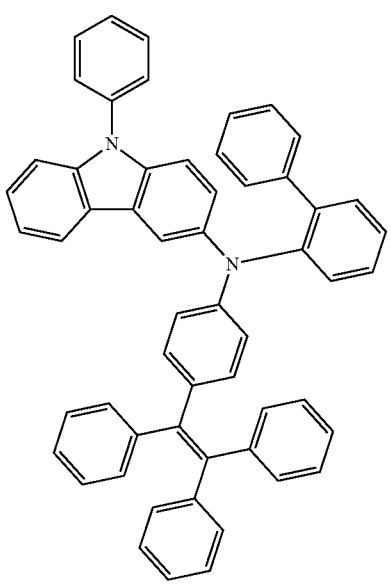
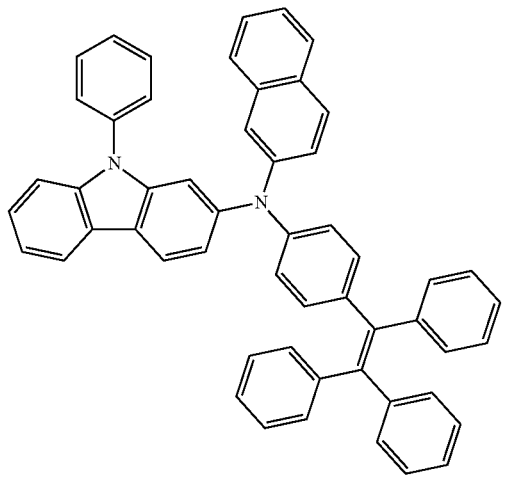
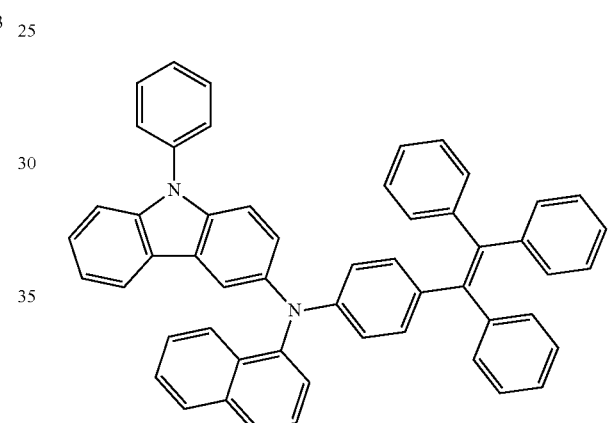
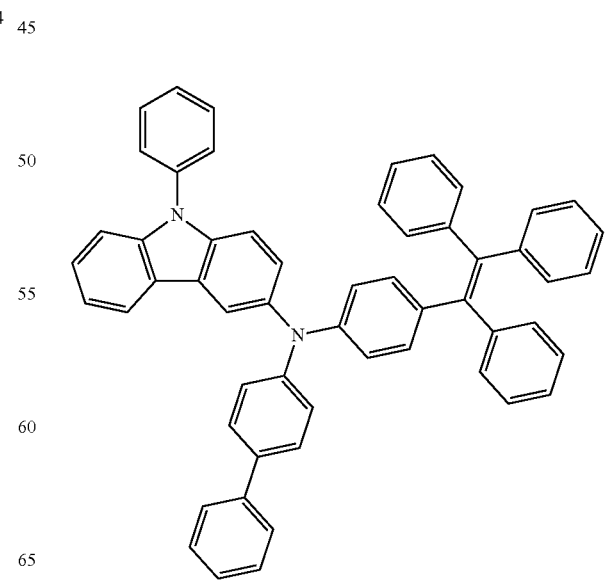

101
-continued
102
-continued
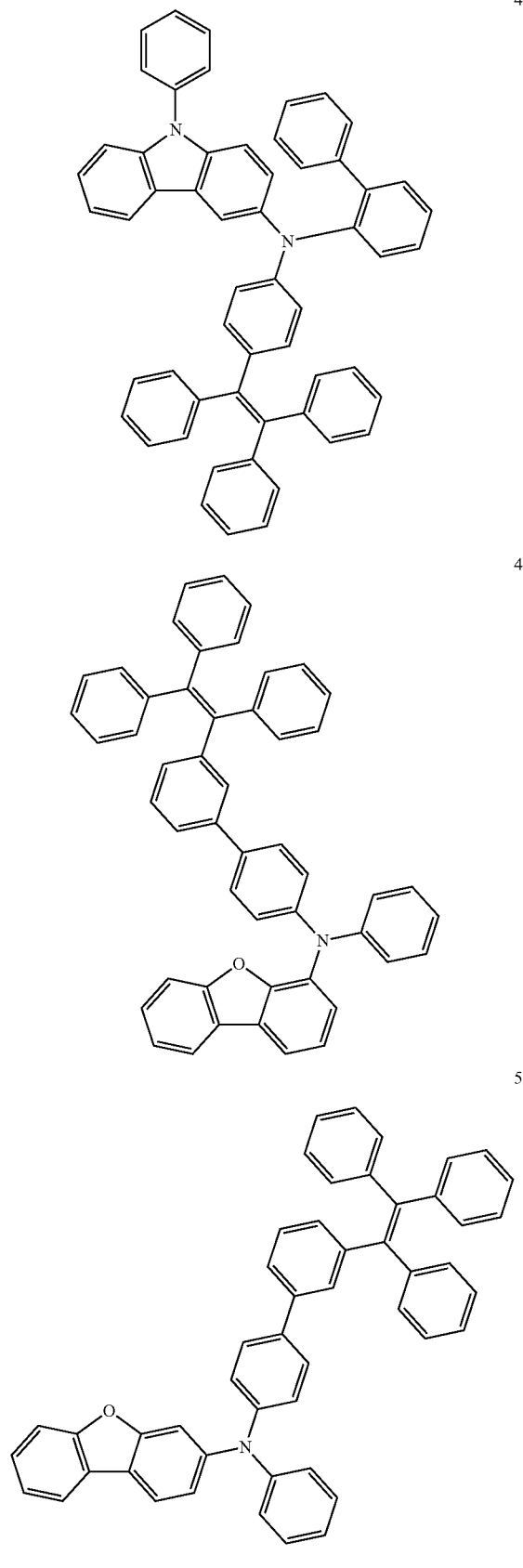
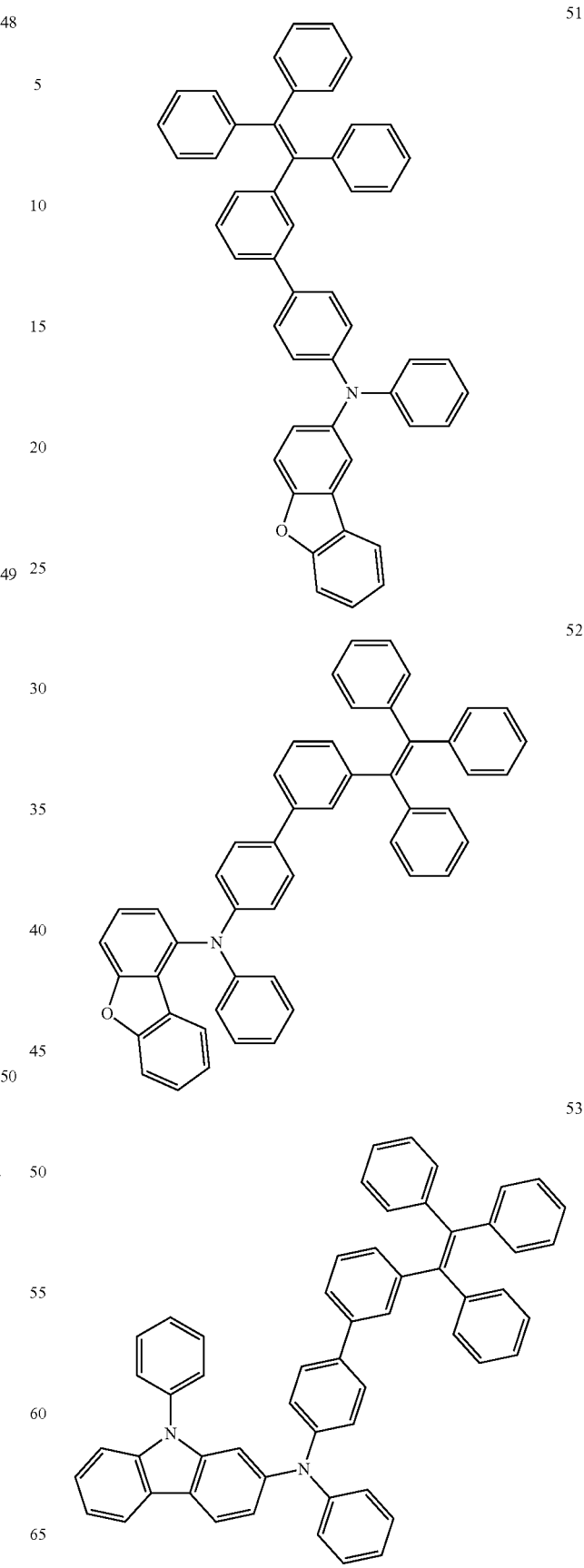

54
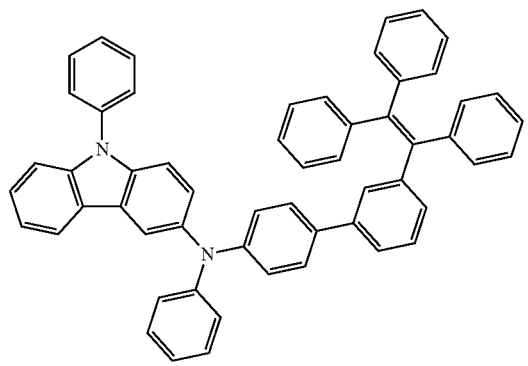
55
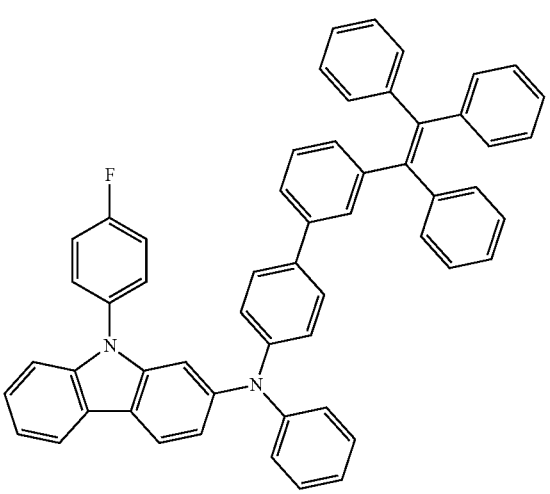
56
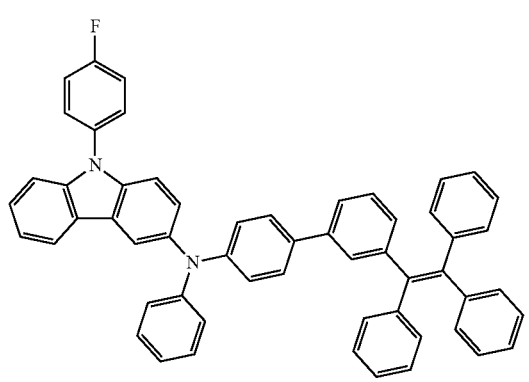
57
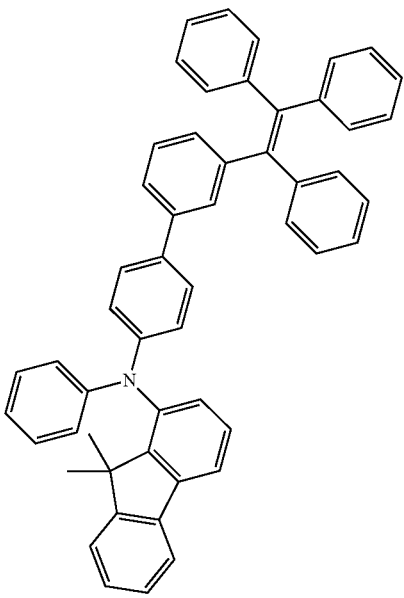
58
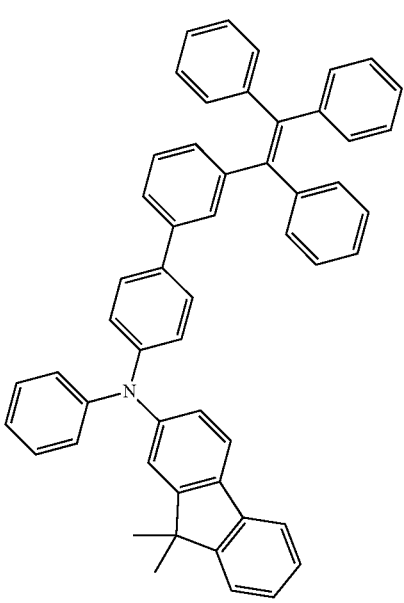
59
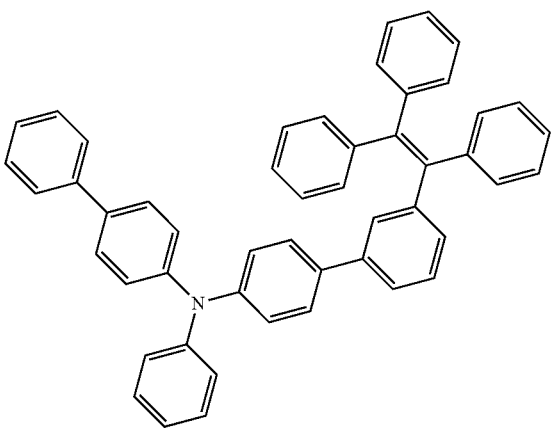

60
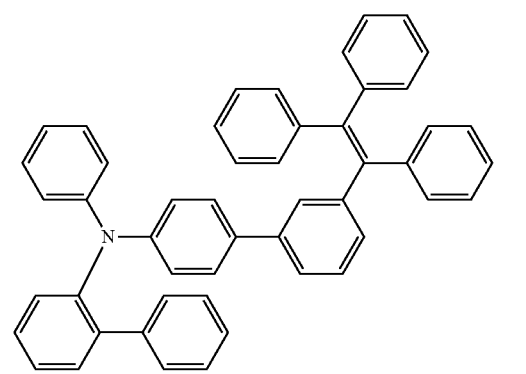
61
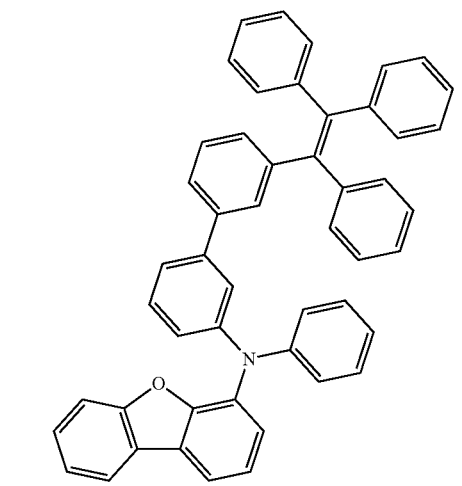
62
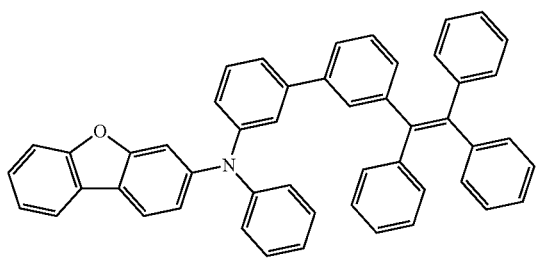
63
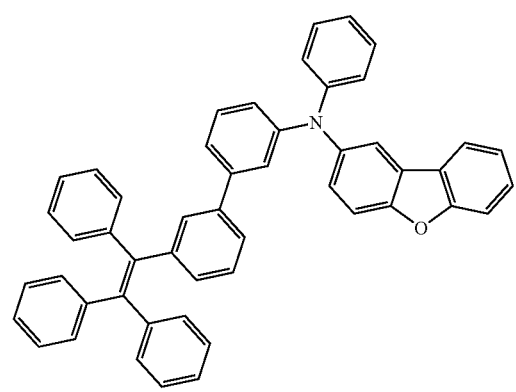
64
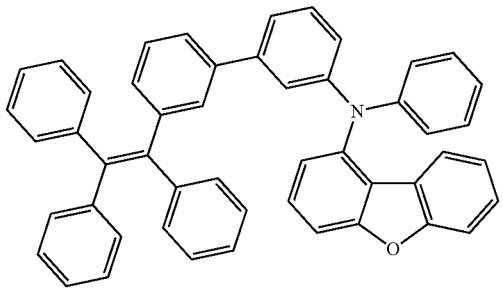
65
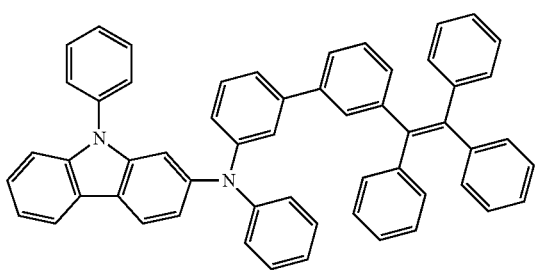
66
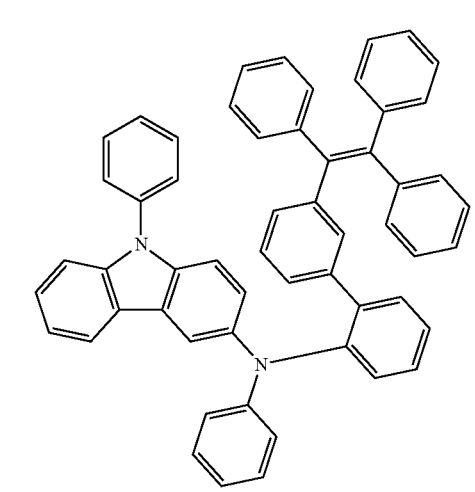
67
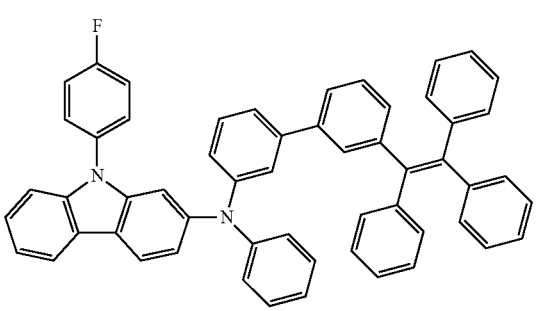

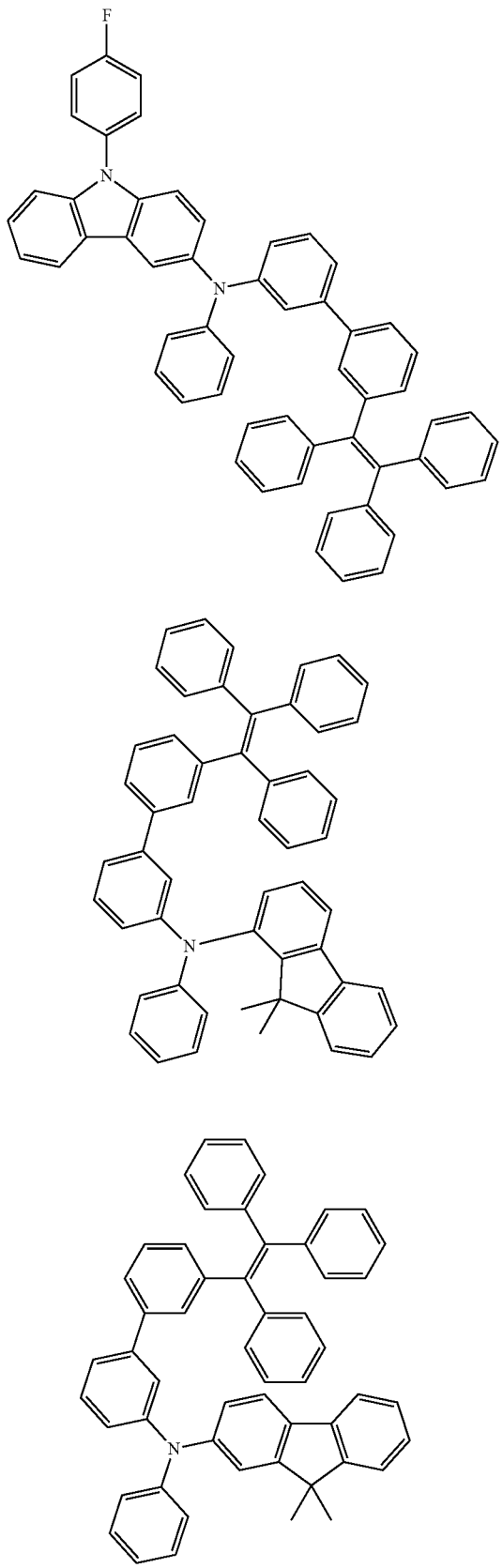
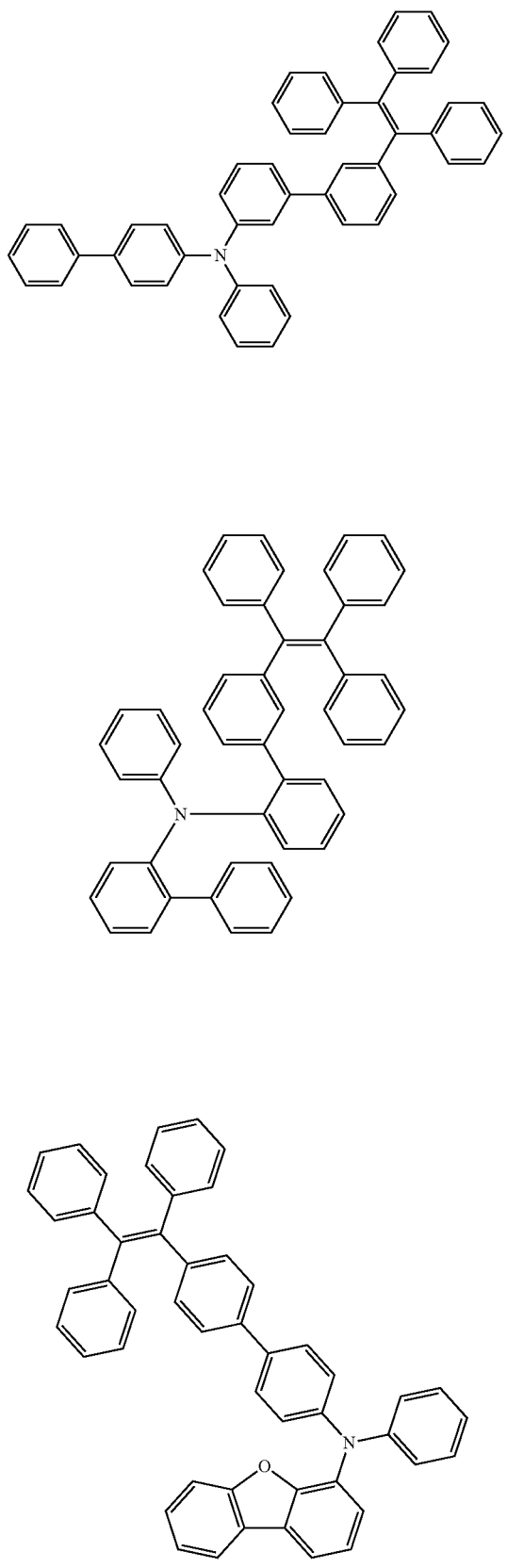

74
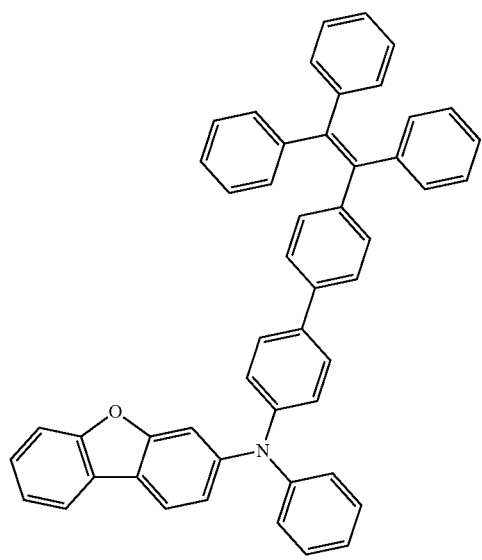
75
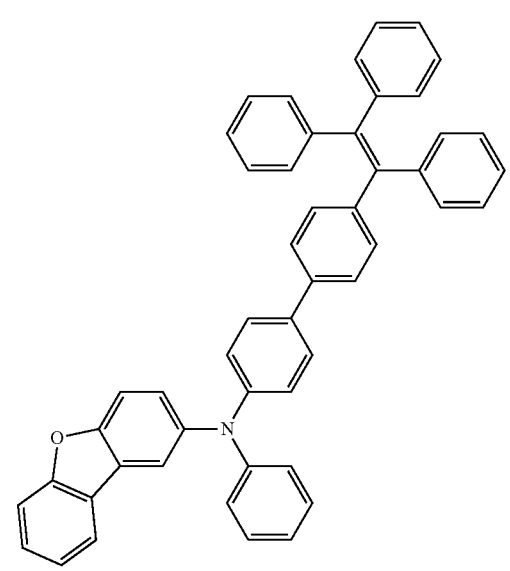
76
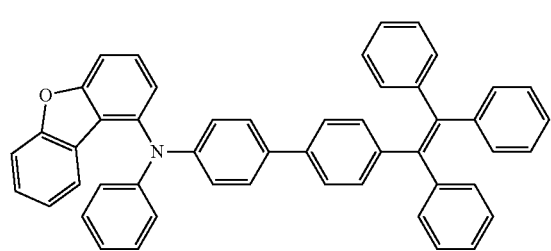
77
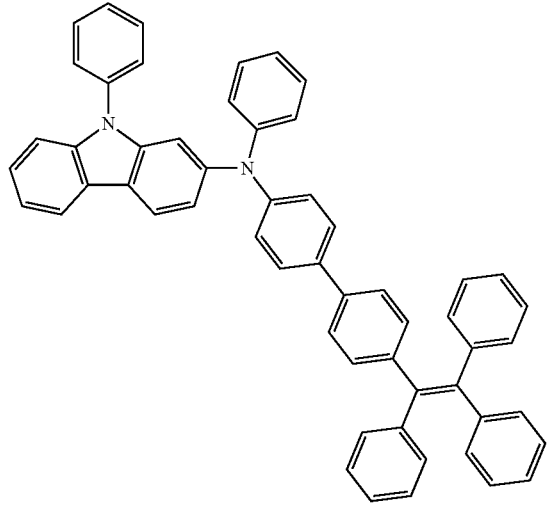
78
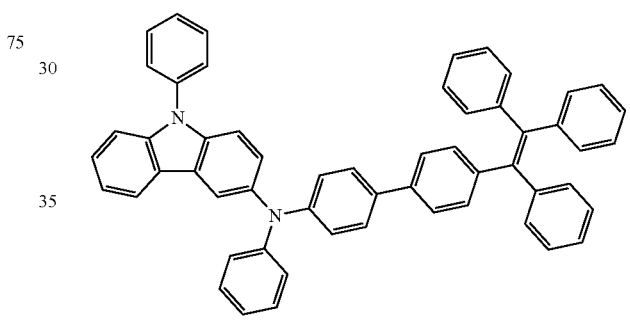
79
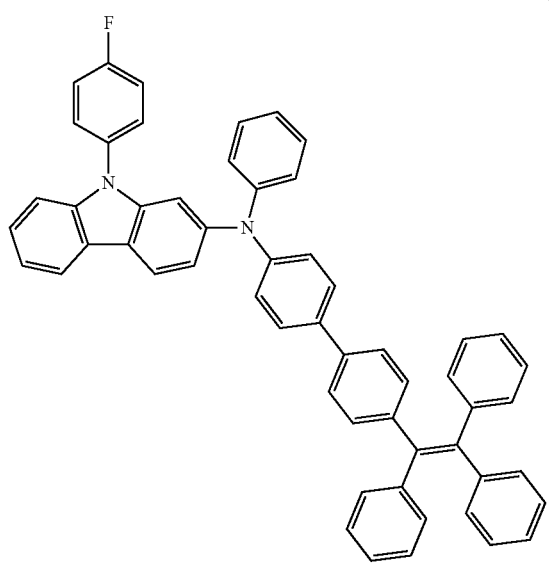

111
-continued
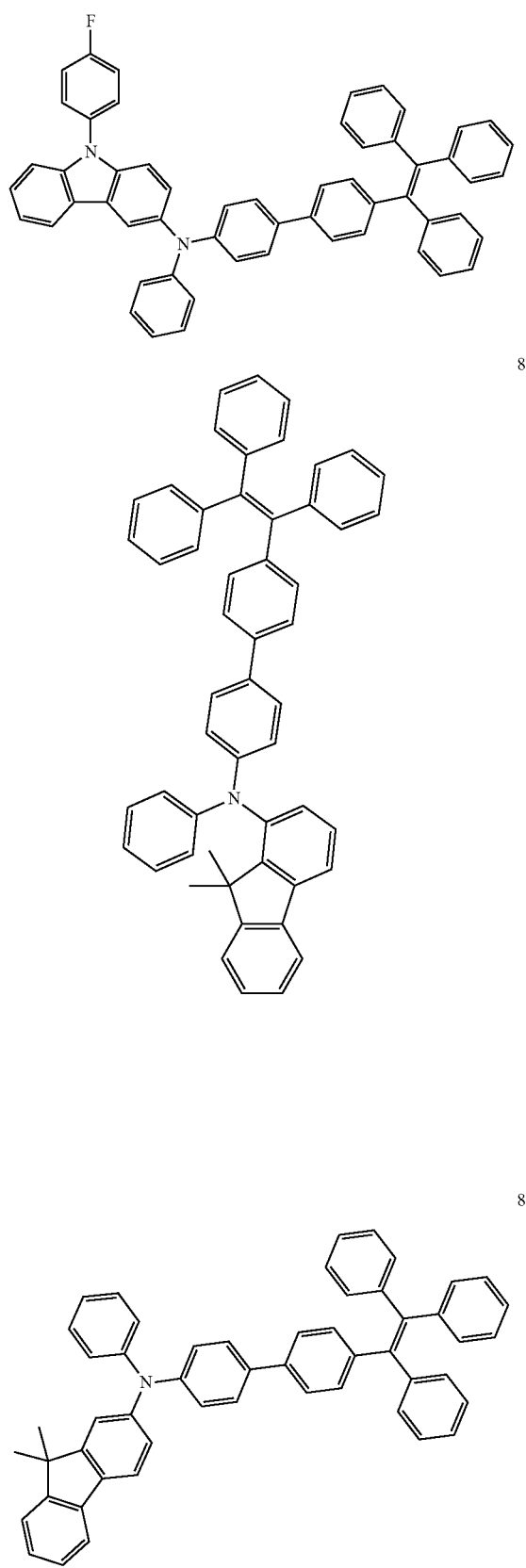
112
-continued
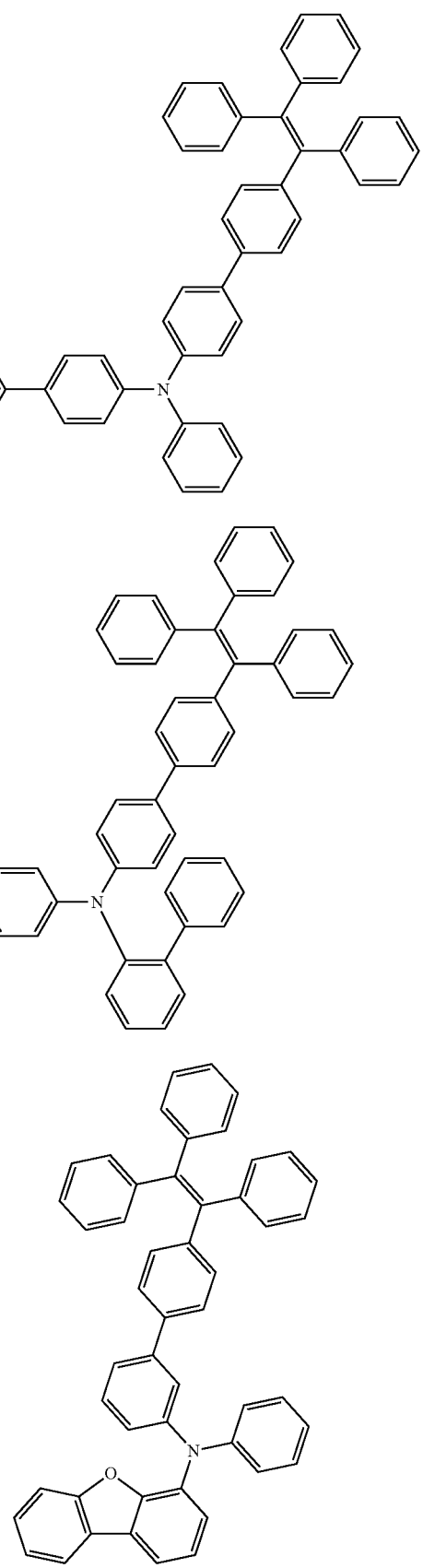

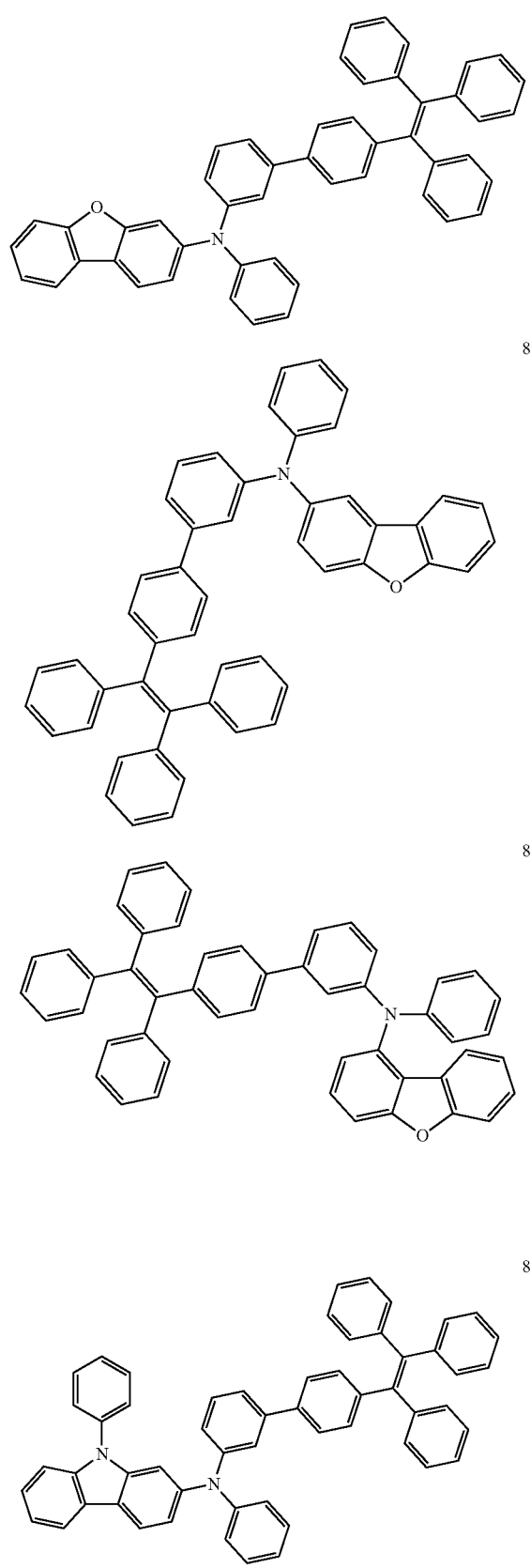
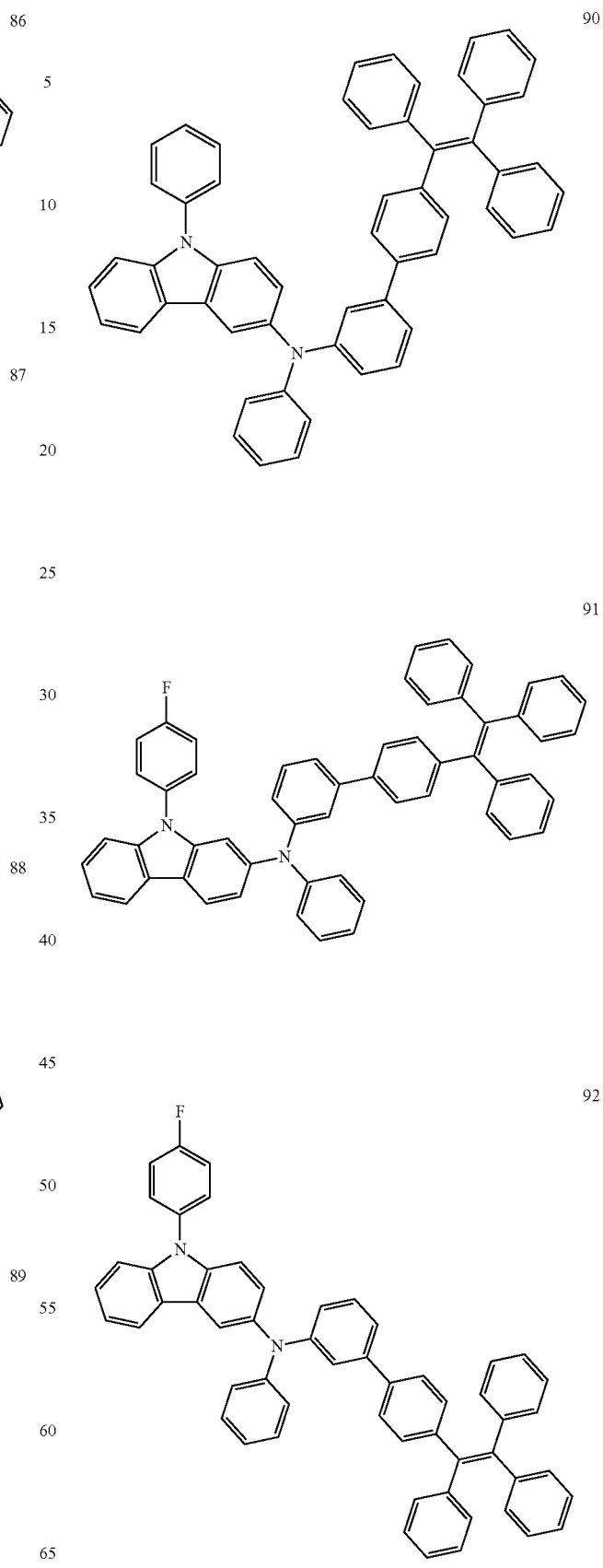

93
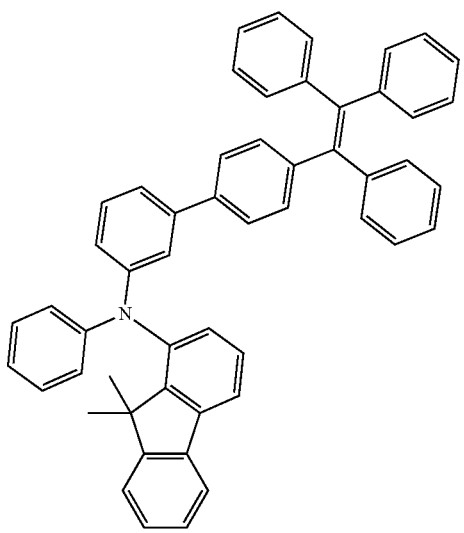
94
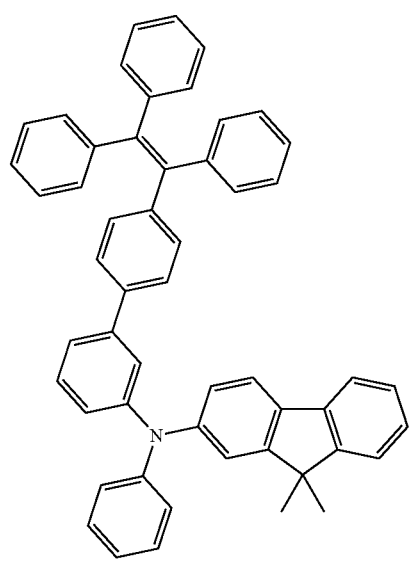
95
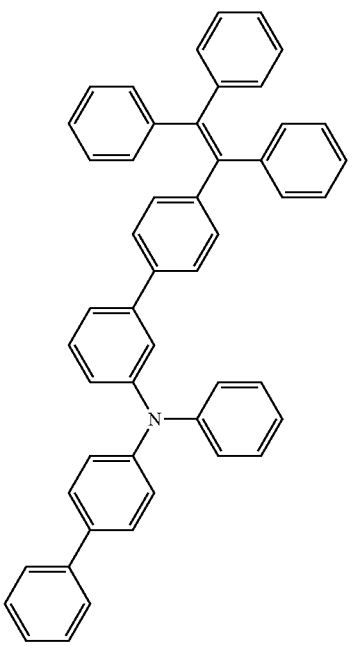
96
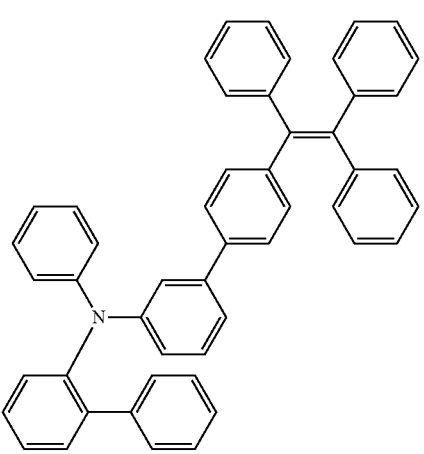
97
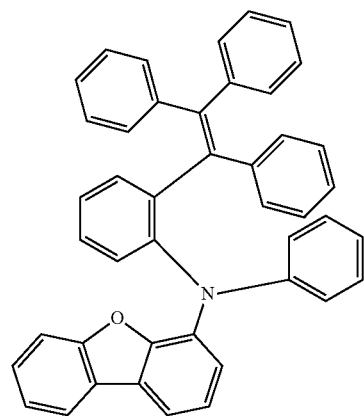

98
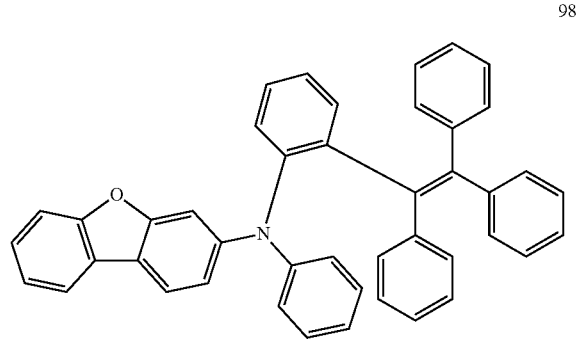
99
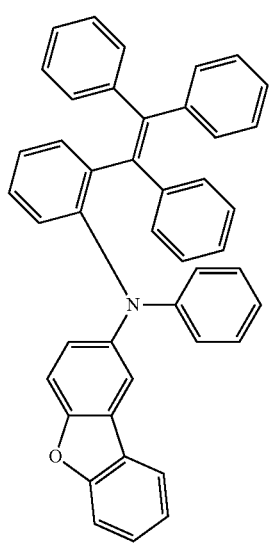
100
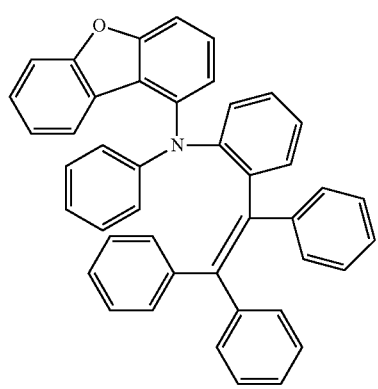
101
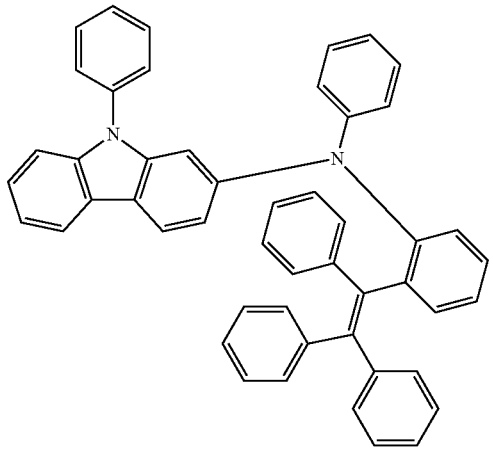
102
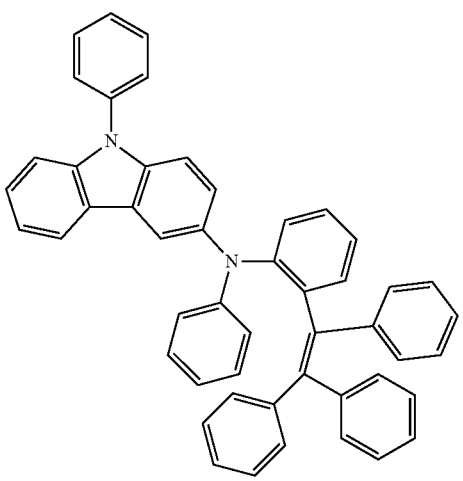
103

104
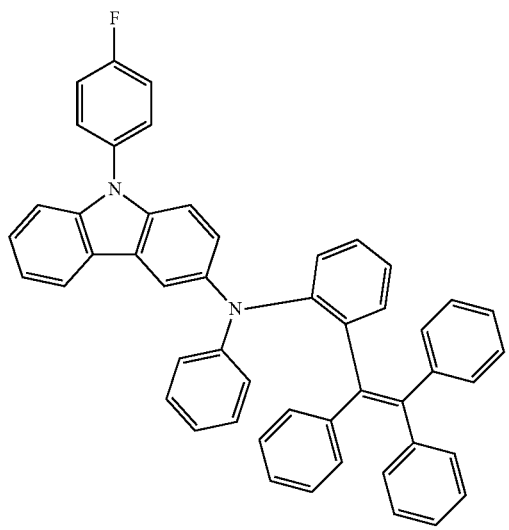
105
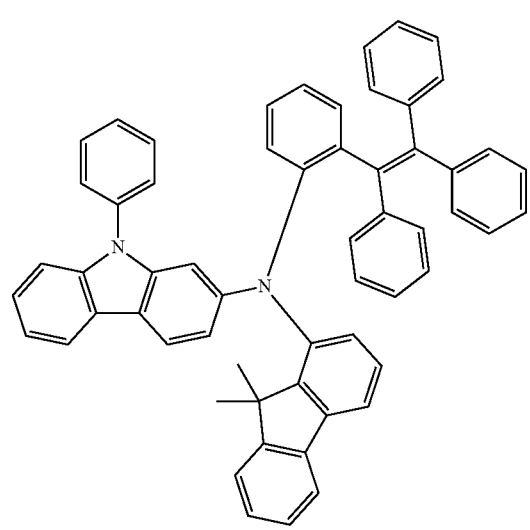
106
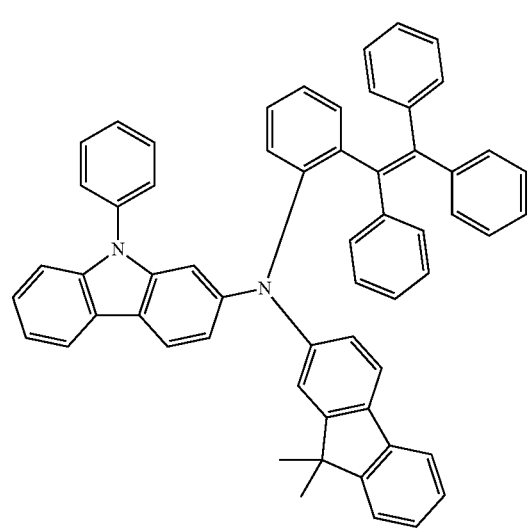
107
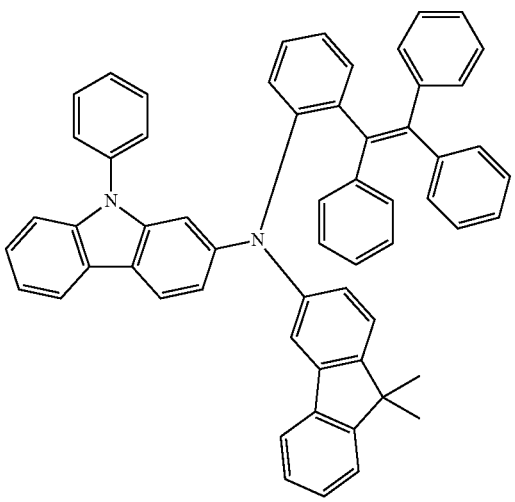
108
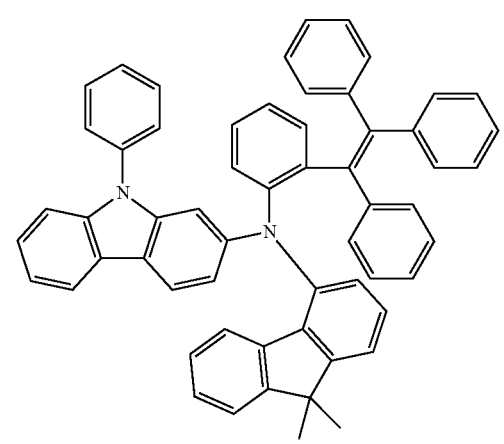
109
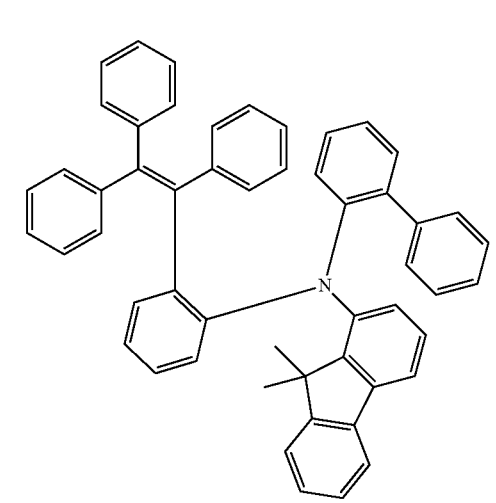

121
-continued
110
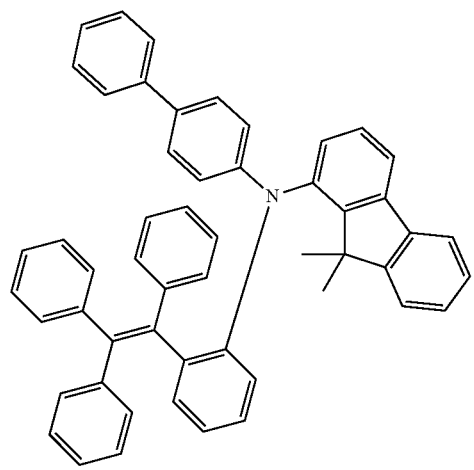
111
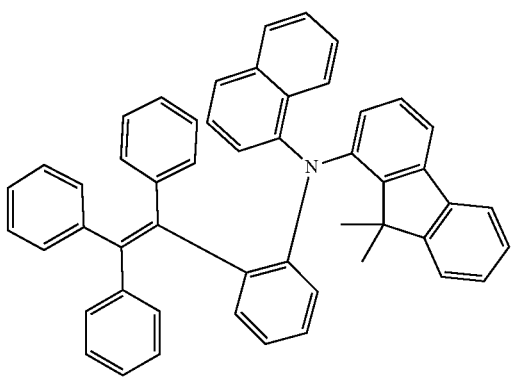
112
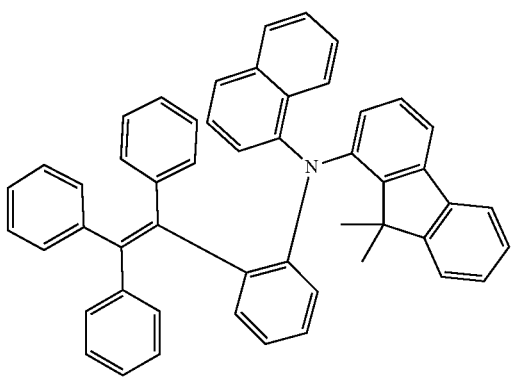
122
-continued
113
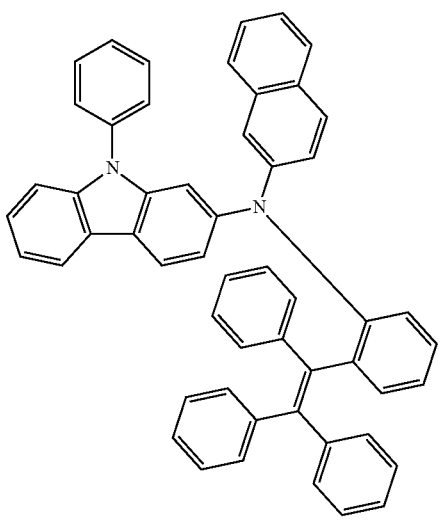
114
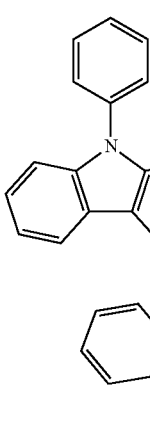
115
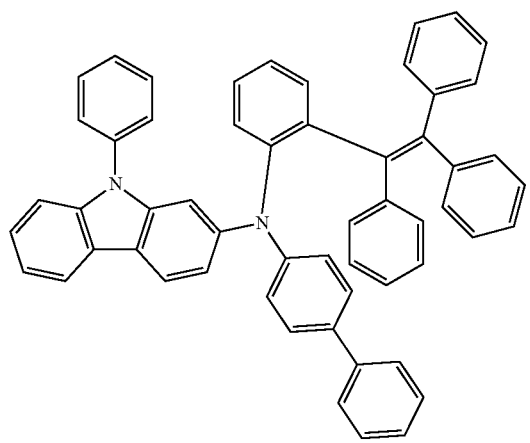

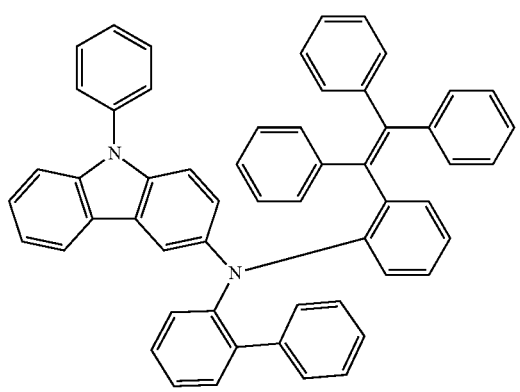

116

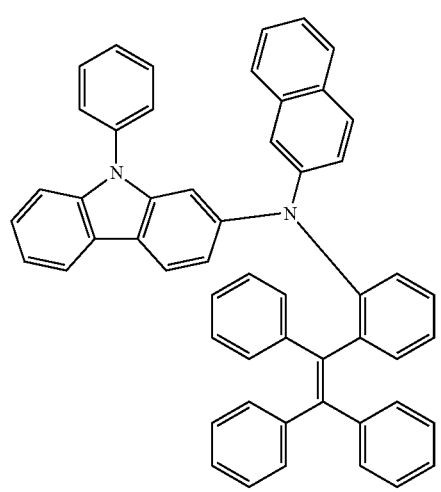

117

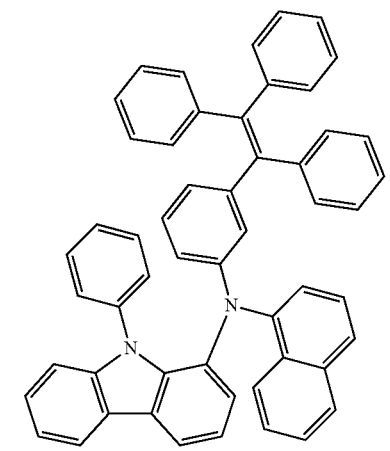

118

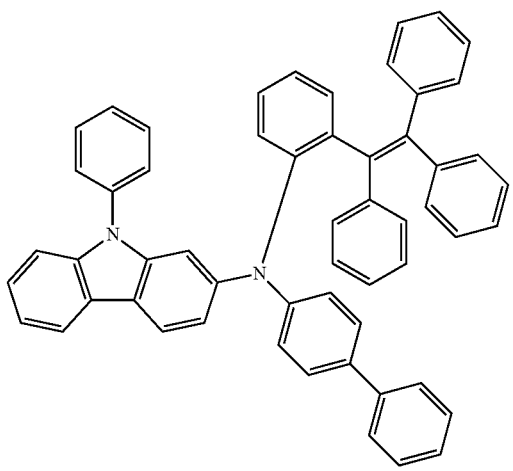

119

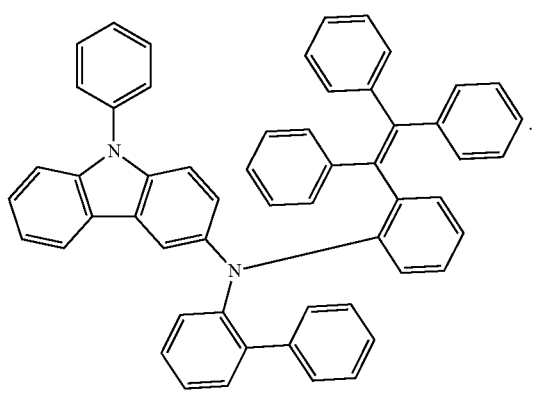

120

13. An amine compound represented by Formula 1:

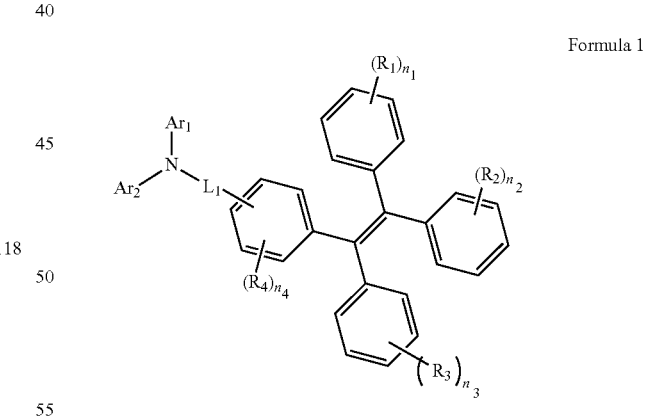

Formula 1 wherein in Formula 1, $Ar_1$ and $Ar_2$ are each independently a substituted or unsubstituted aryl group having 6 to 30 ring-forming carbon atoms, or a substituted or unsubstituted heteroaryl group having 2 to 30 ring-forming carbon atoms selected from the group consisting of a thiophene group, a furan group, a pyrrole group, an imidazole group, an oxadiazole group, a triazole group, a pyridine group, a bipyridine group, a pyrimidine group, a triazine group, an acridyl group, a pyridazine group, a pyrazinyl group, a quinoline group, a quinazoline group, a quinoxaline group, a phenoxazine group, a phthalazine group, a pyrido pyrimidine group, a pyrido pyrazine group, a pyrazino pyrazine group, an isoquinoline group, an indole group, a carbazole group, an N-arylcarbazole group, an N-heteroarylcarbazole group, an N-alkylcarbazole group, a benzoxazole group, a benzimidazole group, a benzothiazole group, a benzocarbazole group, a benzothiophene group, a dibenzothiophene group, a thienothiophene group, a benzofuran group, a phenanthroline group, a thiazole group, an isoxazole group, an oxazole group, an oxadiazole group, a phenothiazine group, a dibenzosilole group, and a dibenzofuran group, and wherein each substituent of the substituted aryl group is selected from the group consisting of a deuterium atom, a halogen atom, a cyano group, a nitro group, a silyl group, an oxy group, a sulfinyl group, a sulfonyl group, a carbonyl group, a boron group, a phosphine oxide group, a phosphine sulfide group, an alkyl group, an alkenyl group, an alkoxy group, a hydrocarbon ring group, an aryl group, and a heterocyclic group, the heterocyclic group being selected from the group consisting of a thiophene group, a furan group, a pyrrole group, an imidazole group, a thiazole group, an oxazole group, an oxadiazole group, a pyridine group, a bipyridine group, a pyrimidine group, a triazine group, a triazole group, an acridyl group, a pyridazine group, a pyrazinyl group, a quinoline group, a quinazoline group, a quinoxaline group, a phenoxazine group, a phthalazine group, a pyrido pyrimidine group, a pyrido pyrazine group, a pyrazino pyrazine group, an isoquinoline group, an indole group, a carbazole group, an N-arylcarbazole group, an N-heteroarylcarbazole group, an N-alkylcarbazole group, a benzoxazole group, a benzothiazole group, a benzocarbazole group, a benzothiophene group, a dibenzothiophene group, a benzofuran group, a phenanthroline group, a thiazole group, an isoxazole group, an oxazole group, an oxadiazole group, a thiadiazole group, a phenothiazine group, a dibenzosilole group, and a dibenzofuran group, $L_1$ is a direct linkage, a substituted or unsubstituted arylene group having 6 to 30 ring-forming carbon atoms, or a substituted or unsubstituted heteroarylene group having 2 to 30 ring-forming carbon atoms, $R_1$ to $R_4$ are each independently a hydrogen atom, a deuterium atom, a halogen atom, a substituted or unsubstituted alkyl group having 1 to 20 carbon atoms, a substituted or unsubstituted aryl group having 6 to 60 ring-forming carbon atoms, or a substituted or unsubstituted heteroaryl group having 2 to 60 ring-forming carbon atoms, $n_1$ to $n_3$ are each independently an integer of 0 to 5, $n_4$ is an integer of 0 to 4, wherein the amine compound is a monoamine compound, in which only one amine group exists in its molecular structure without forming a ring, when one of $Ar_1$ or $Ar_2$ is an unsubstituted phenyl group, then $Ar_1$ and $Ar_2$ are different from each other, and when $L_1$ is a direct linkage, and $Ar_1$ and/or $Ar_2$ is an unsubstituted aryl group, then the unsubstituted aryl group has 6 to 13 ring-forming carbon atoms.

14. The amine compound of claim 13, wherein the amine compound represented by Formula 1 is represented by Formula 2-1 or Formula 2-2:

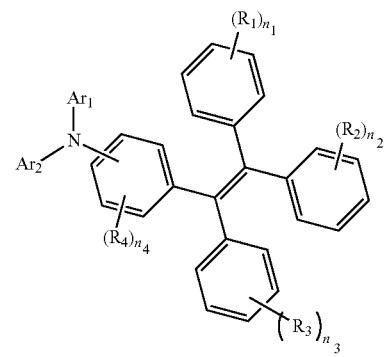

Formula 2-1

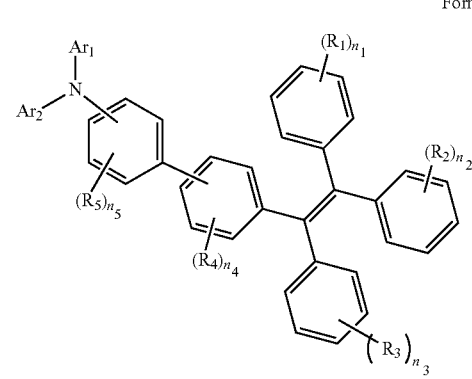

Formula 2-2 wherein in Formulas 2-1 and 2-2, $R_5$ is a hydrogen atom, a deuterium atom, a halogen atom, a substituted or unsubstituted alkyl group having 1 to 20 carbon atoms, a substituted or unsubstituted aryl group having 6 to 60 ring-forming carbon atoms, or a substituted or unsubstituted heteroaryl group having 2 to 60 ring-forming carbon atoms, $n_5$ is an integer of 0 to 4, and $Ar_1$ and $Ar_2$, $R_1$ to $R_4$, and $n_1$ to $n_4$ are the same as respectively defined in Formula 1.

15. The amine compound of claim 13, wherein the amine compound represented by Formula 1 is represented by any one of Formulas 3-1 to 3-3:

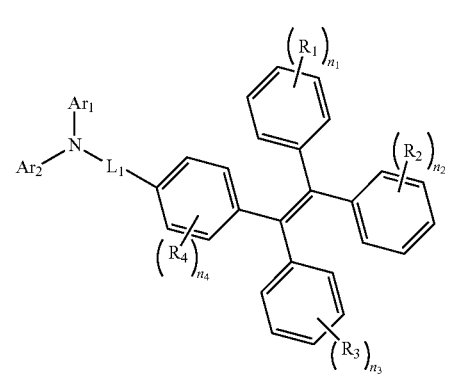

Formula 3-1

Formula 3-2

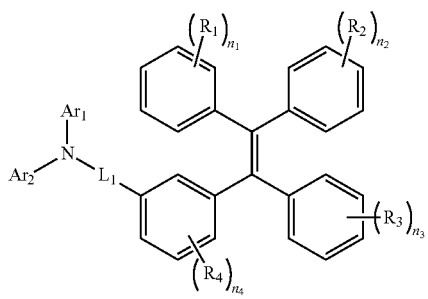

Formula 3-3

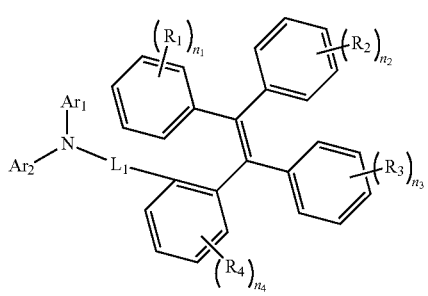

wherein in Formulas 3-1 to 3-3, $Ar_1$ and $Ar_2$, $R_1$ to $R_4$, and $n_1$ to $n_4$ are the same as respectively defined in Formula 1.

16. The amine compound of claim 13, wherein in Formula 1, $Ar_1$ and $Ar_2$ are each independently a substituted or unsubstituted phenyl group, a substituted or unsubstituted biphenyl group, a substituted or unsubstituted naphthyl group, a substituted or unsubstituted fluorenyl group, a substituted or unsubstituted carbazole group, or a substituted or unsubstituted dibenzofuran group, and when one of $Ar_1$ or $Ar_2$ is an unsubstituted phenyl group, $Ar_1$ and $Ar_2$ are different from each other.

17. The amine compound of claim 13, wherein in Formula 1, $Ar_1$ and $Ar_2$ are different from each other.

18. The amine compound of claim 13, wherein the amine compound is one of the compounds represented by Compound Group 1:

Compound Group 1

1

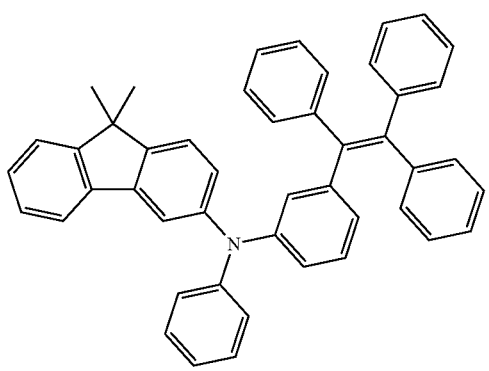

2

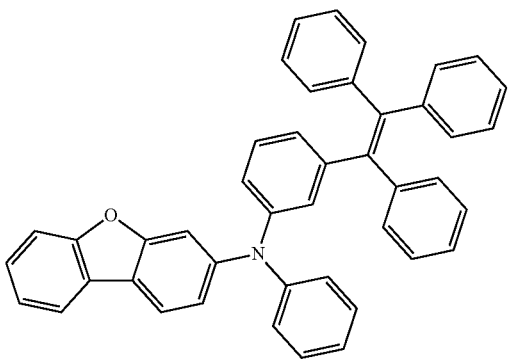

3

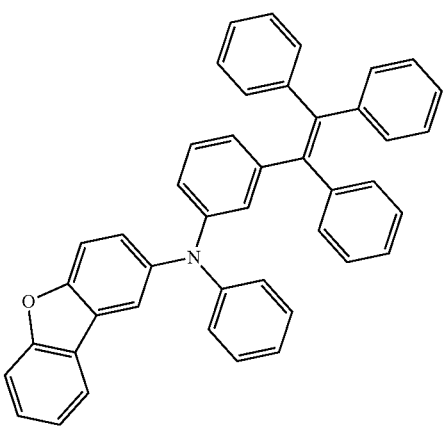

4

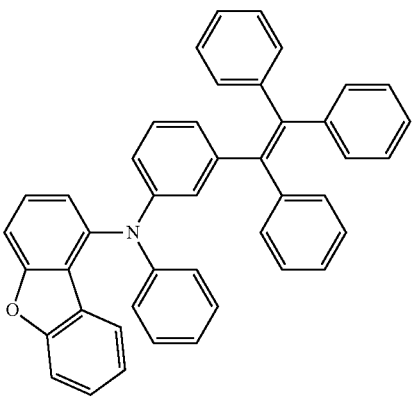

5

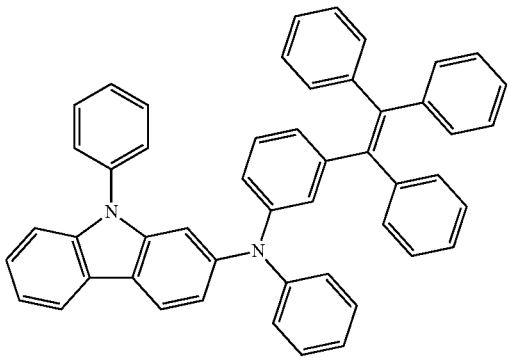

6
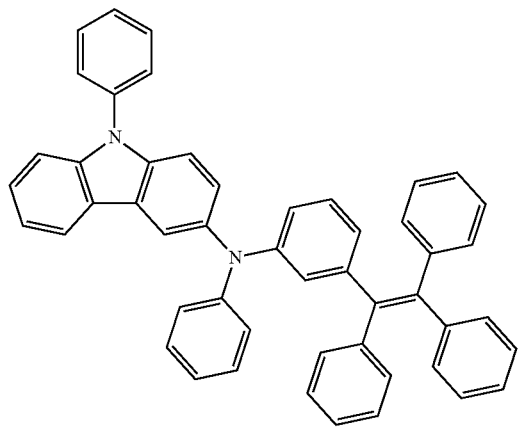
7
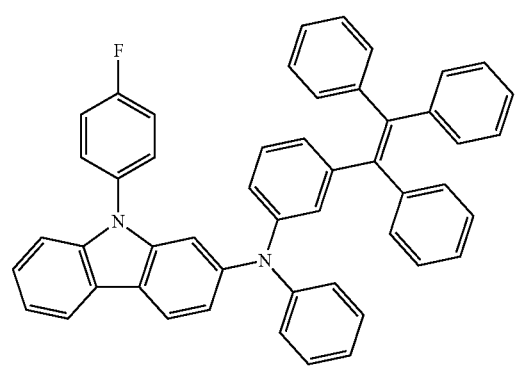
8
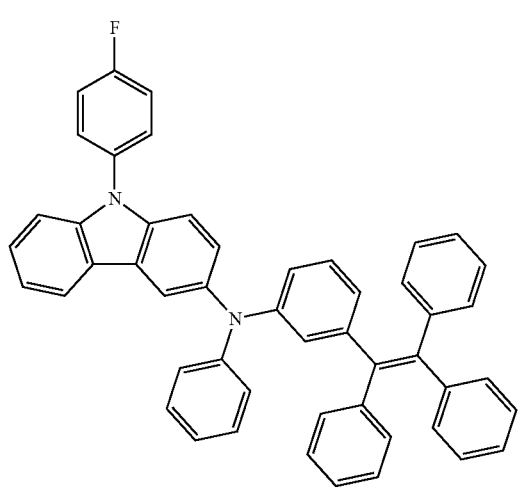
9
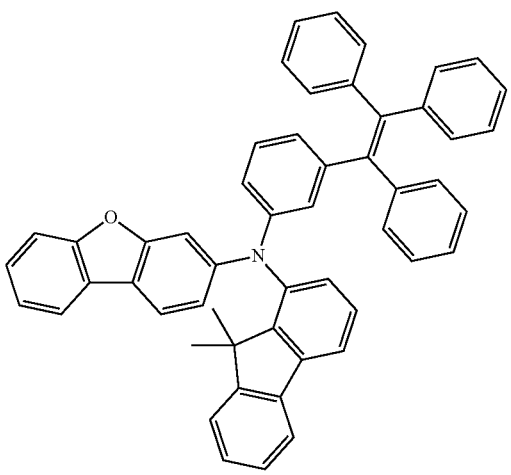
10
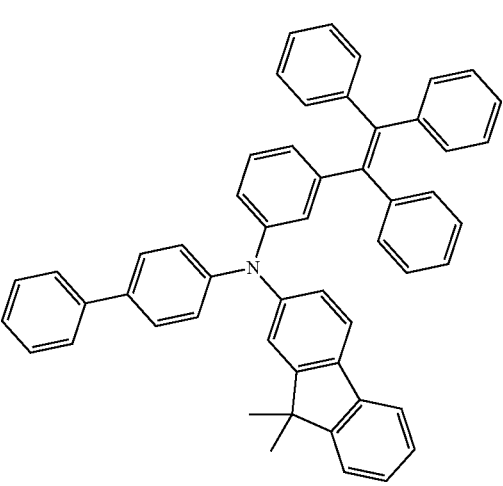
11
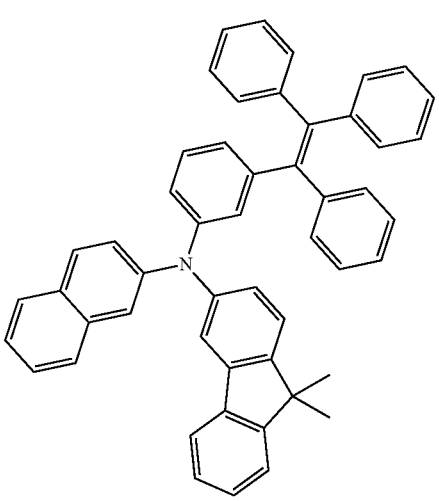

12
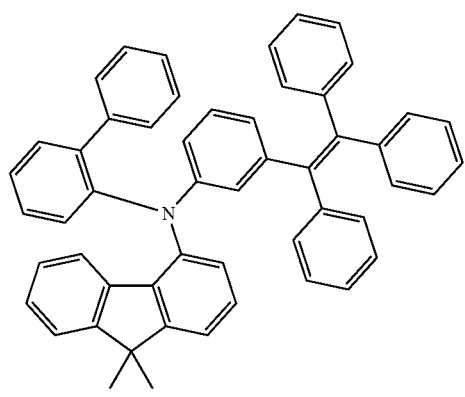
13
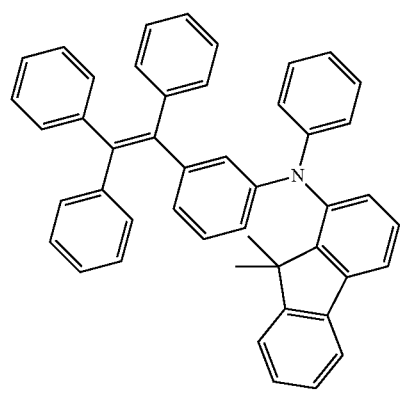
14
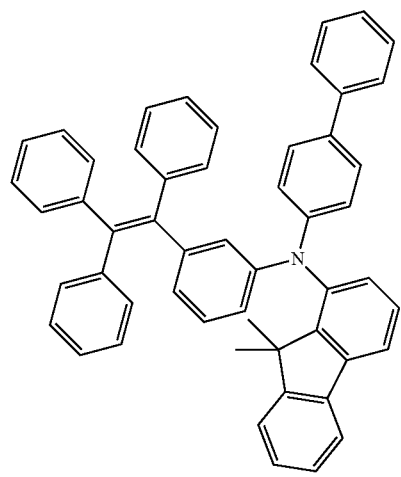
15
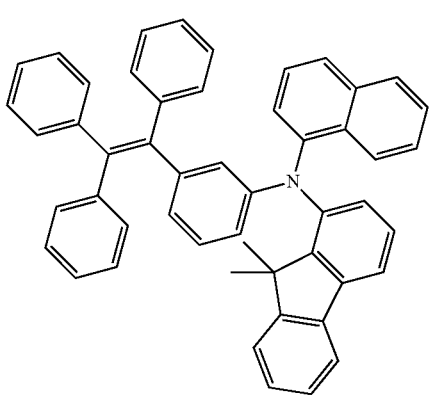
16
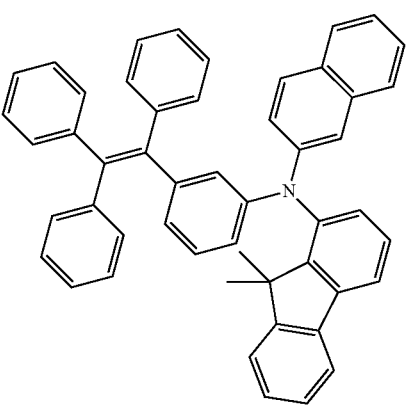
17
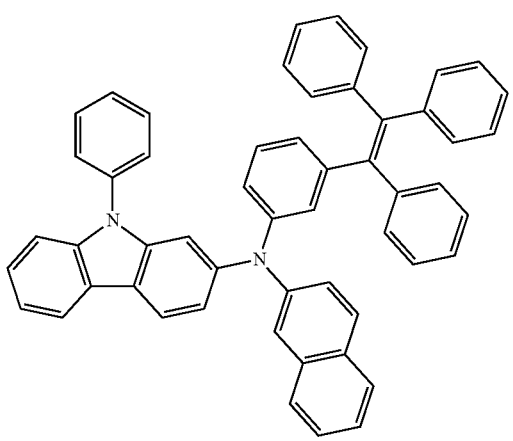
18
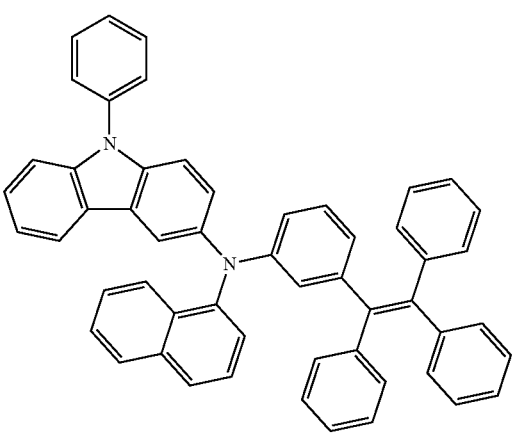

19
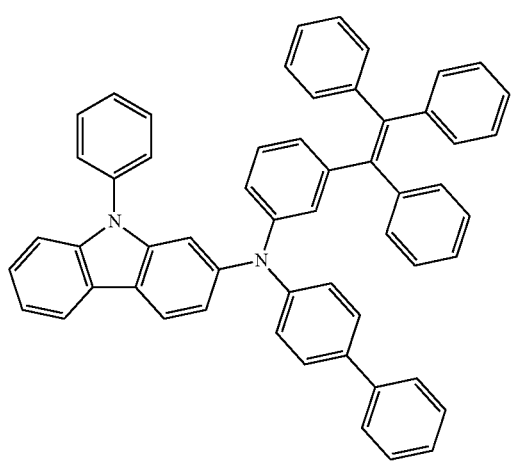
20
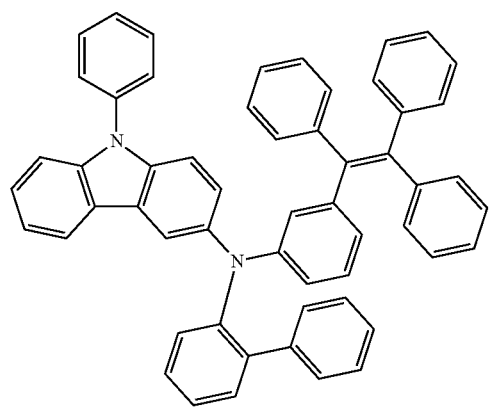
21
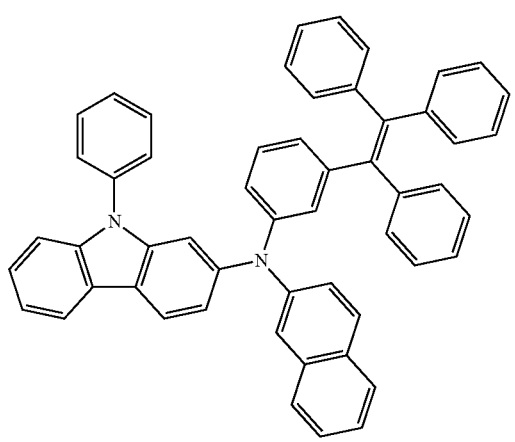
22
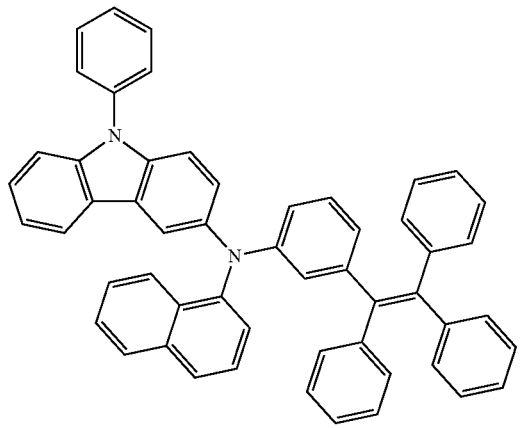
23
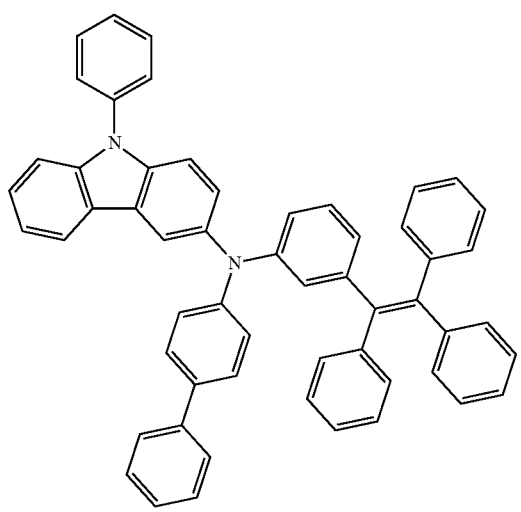
24
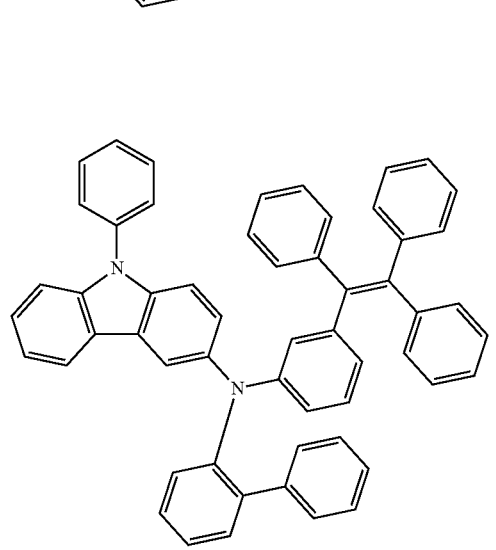

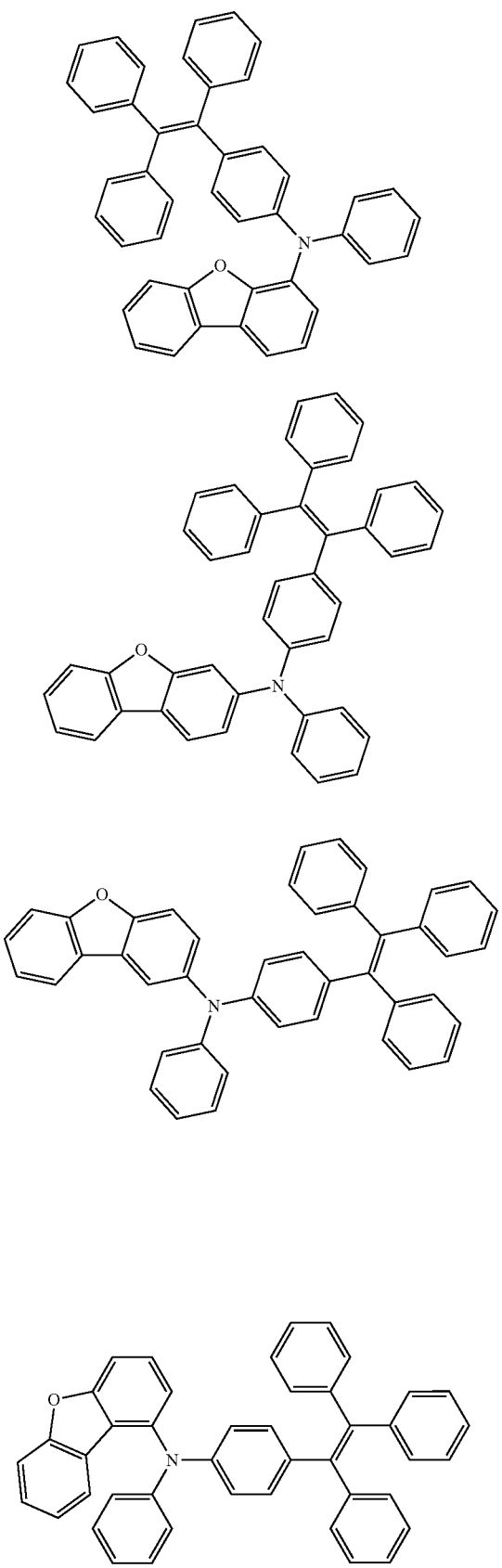
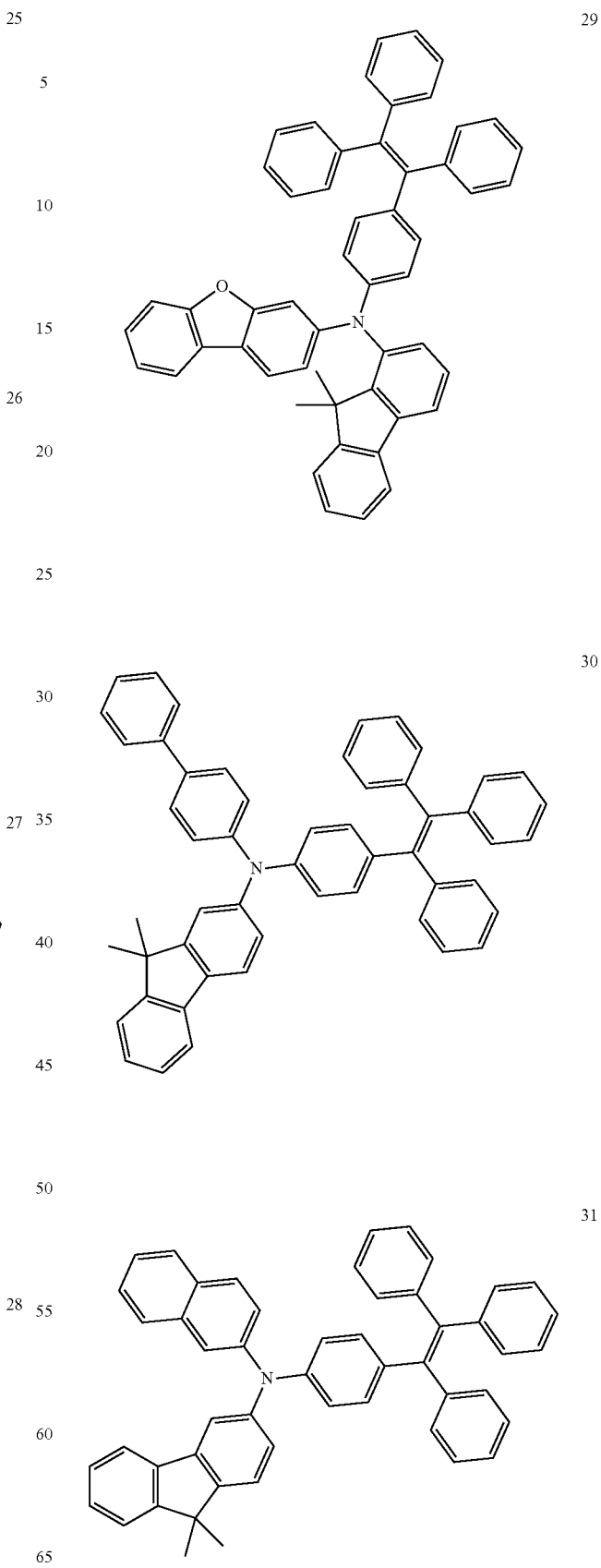

32
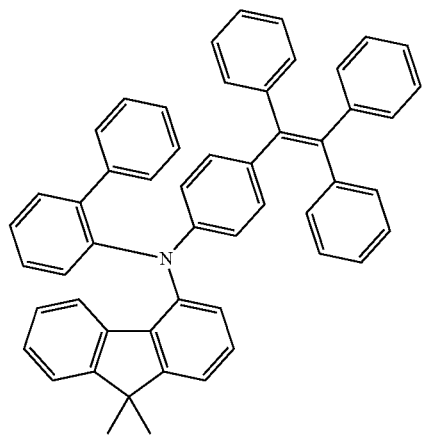
33
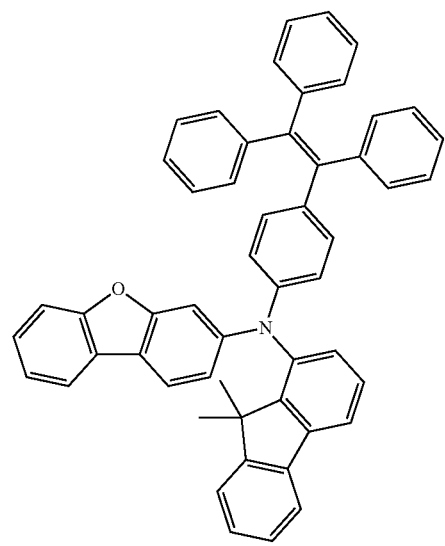
34
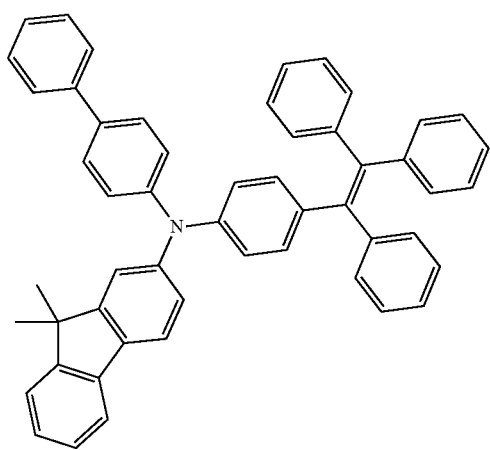
35
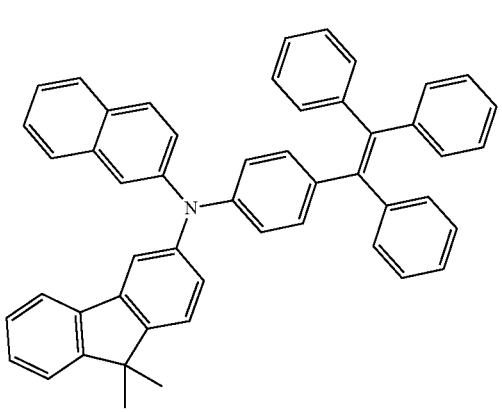
36
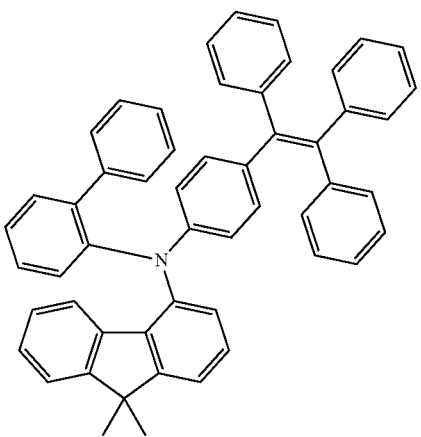
37
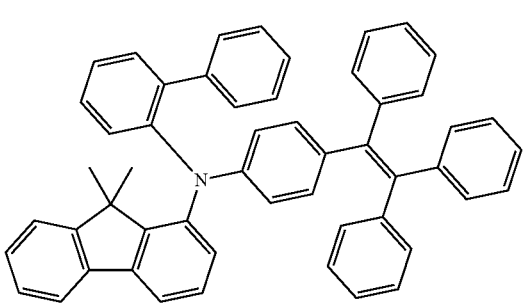
38
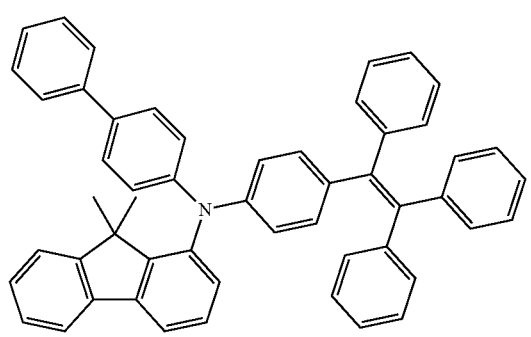

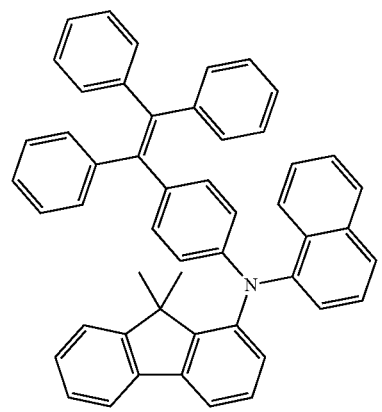
39
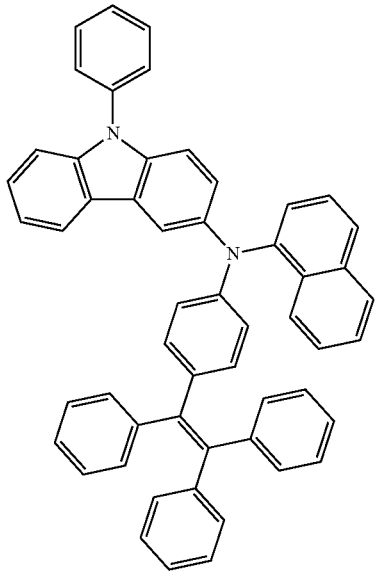
42
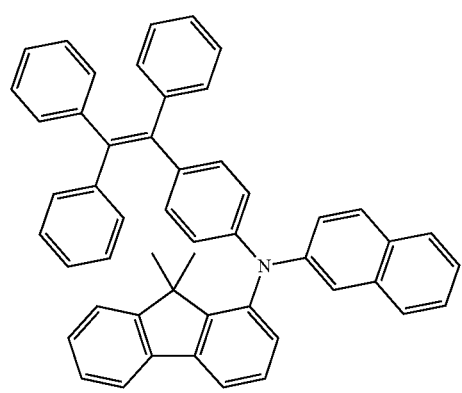
40
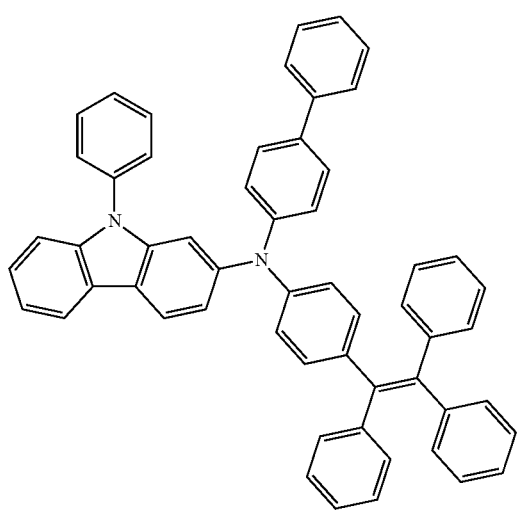
43
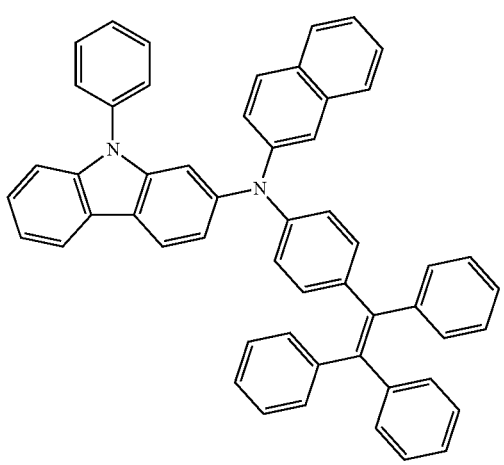
41
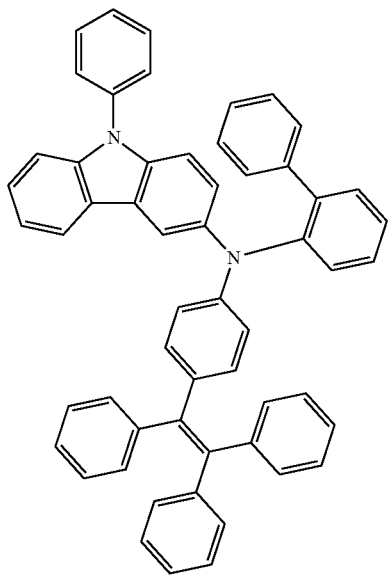
44

45
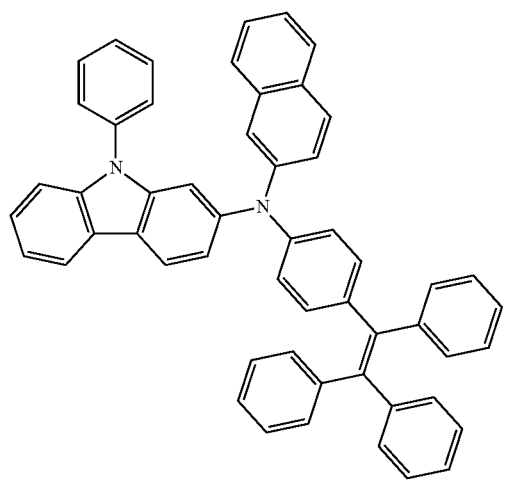
46
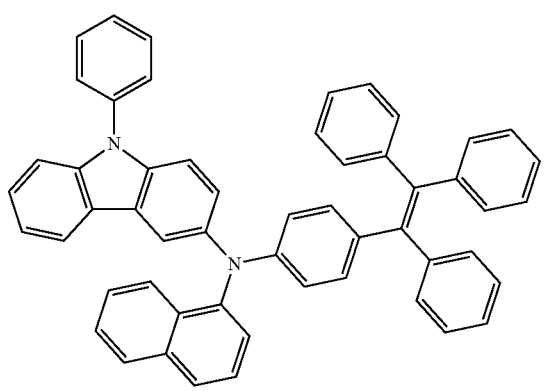
47
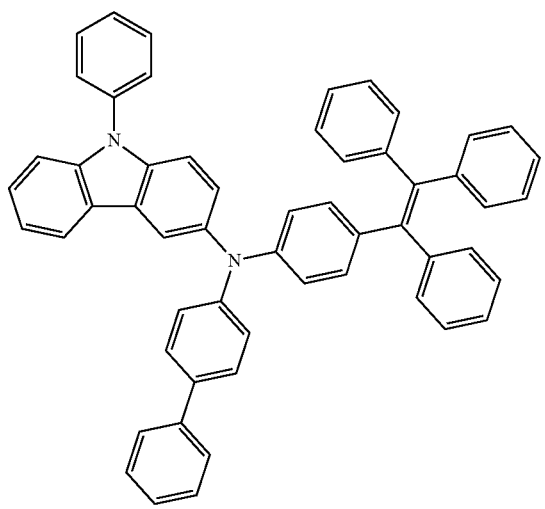
48
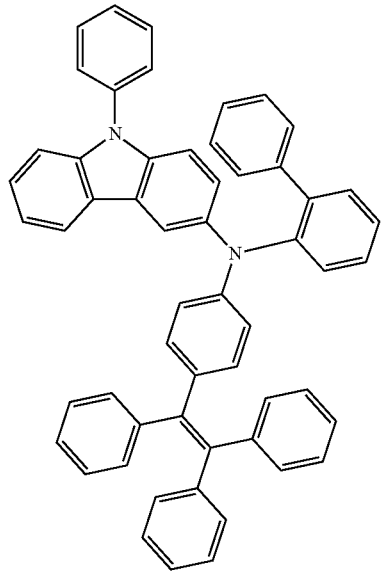
49
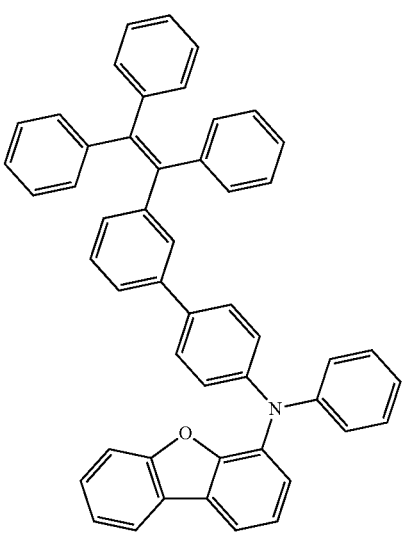
50
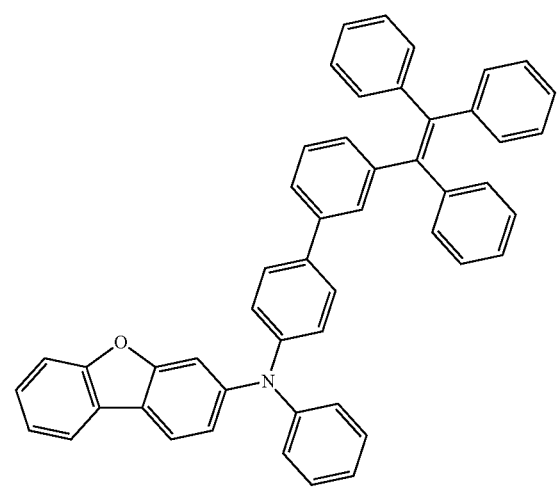

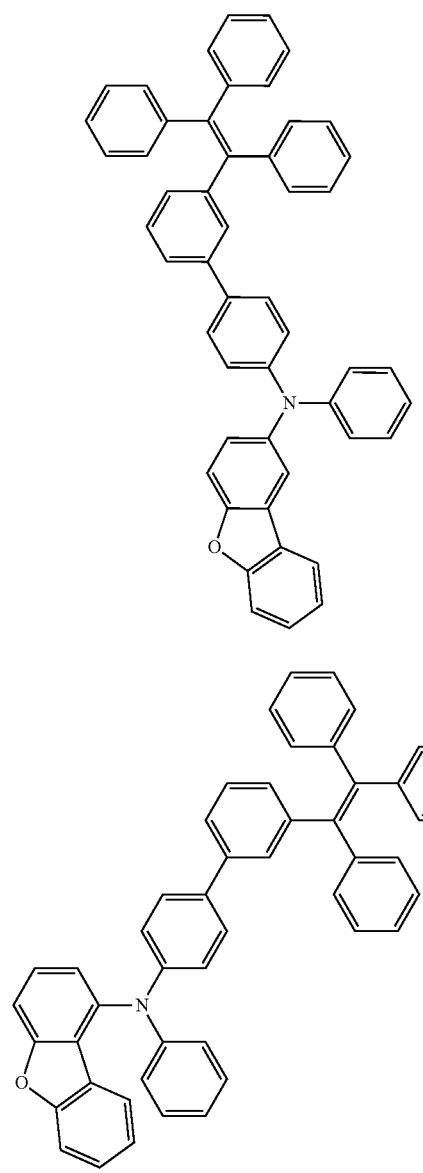
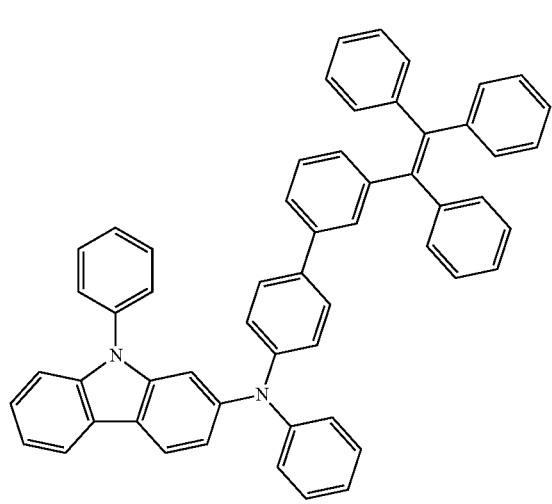
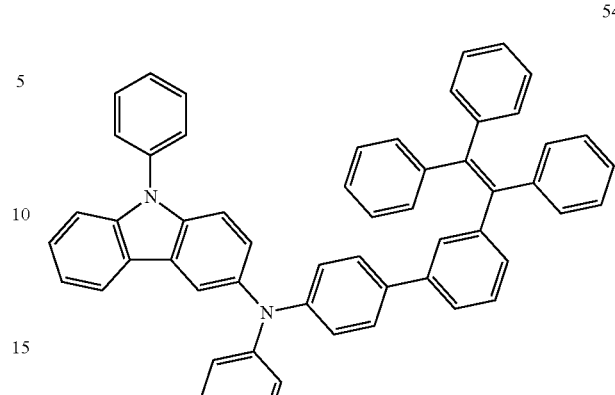

57
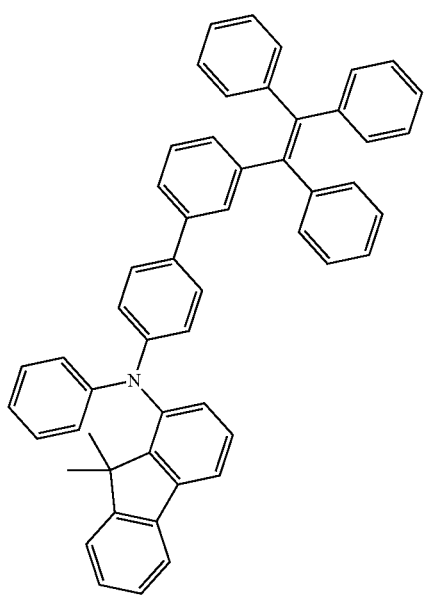
58
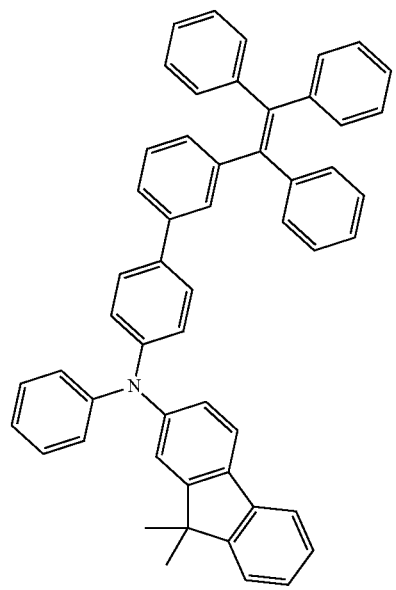
59
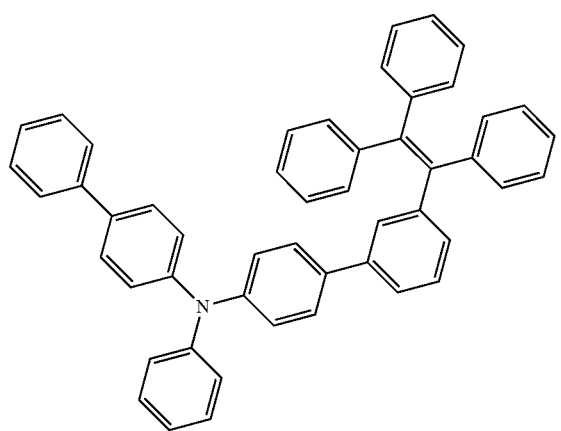
60
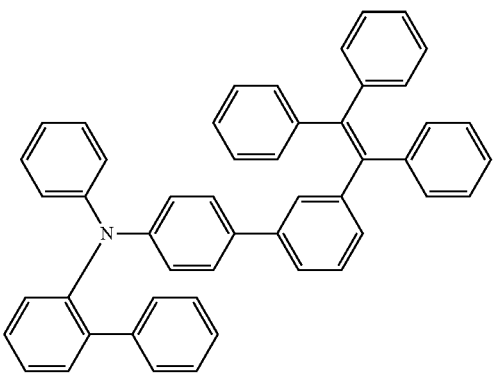
61
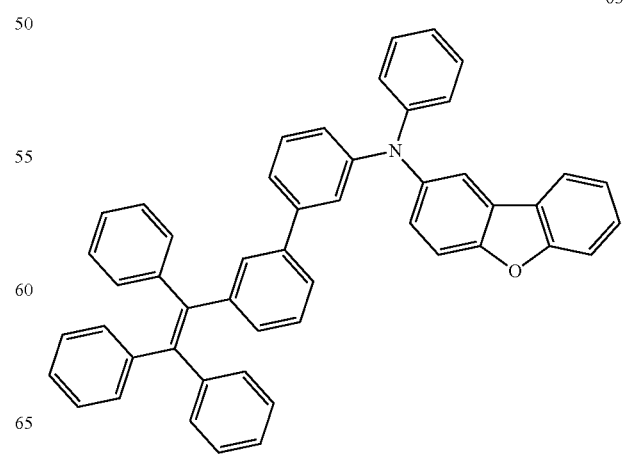

64
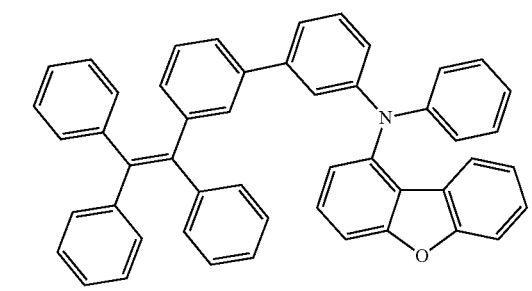
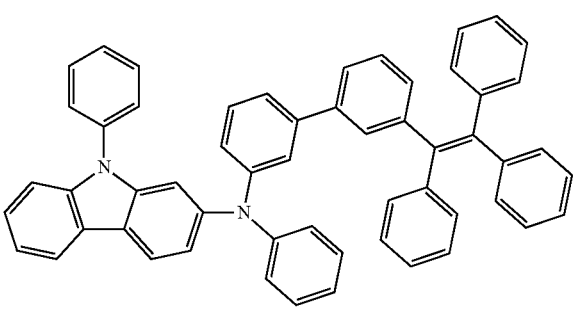
65
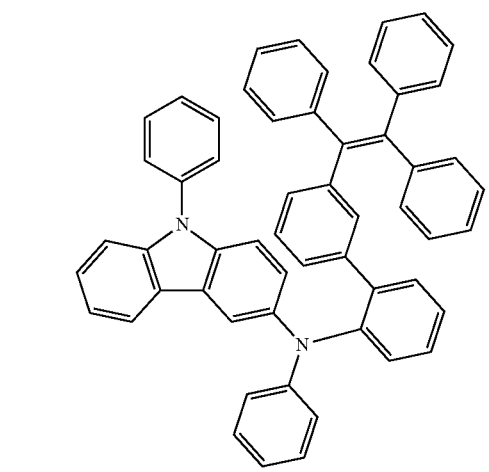
66
67
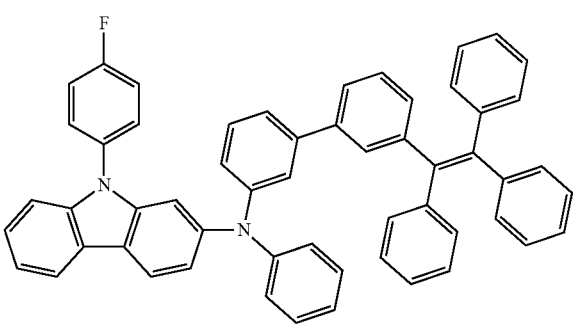
68
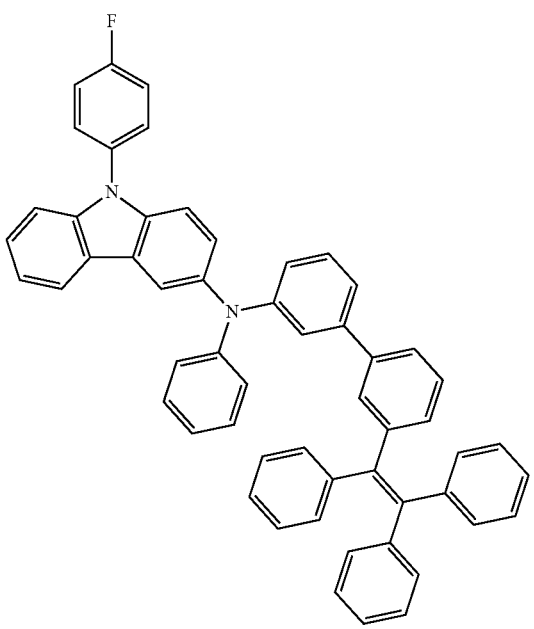
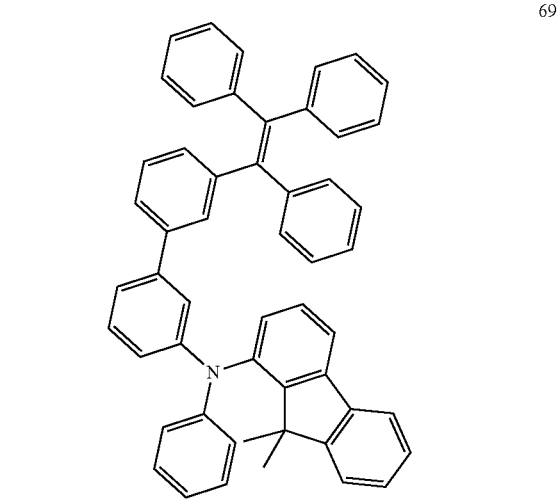
69
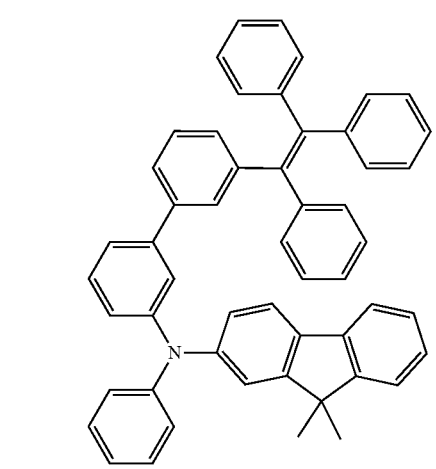
70

149
-continued
150
-continued
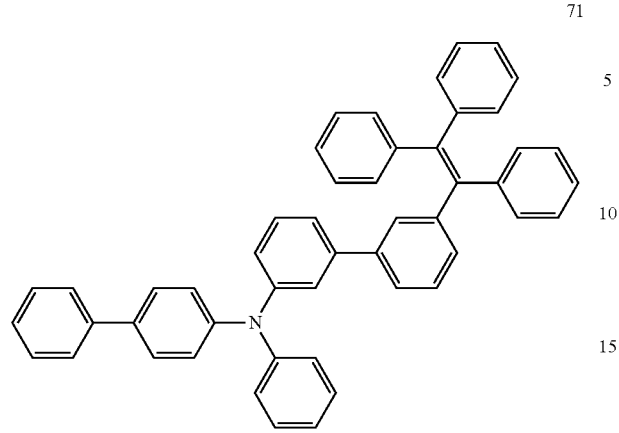
71
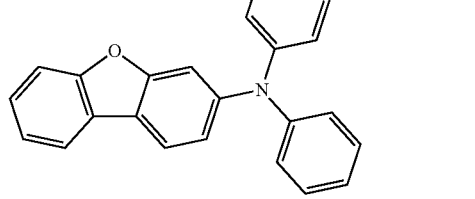
74
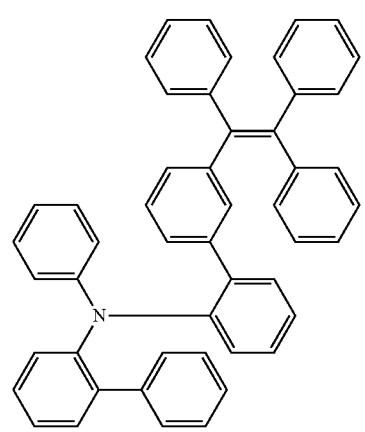
72
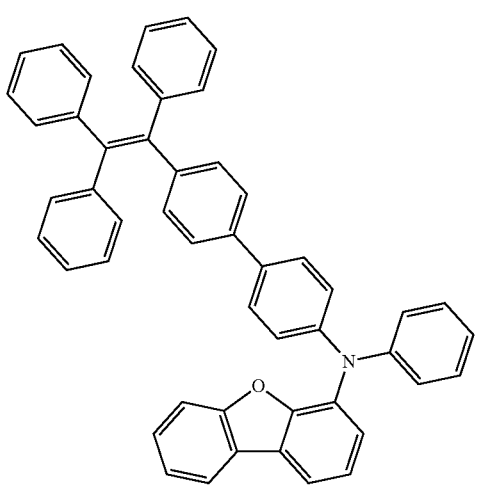
73
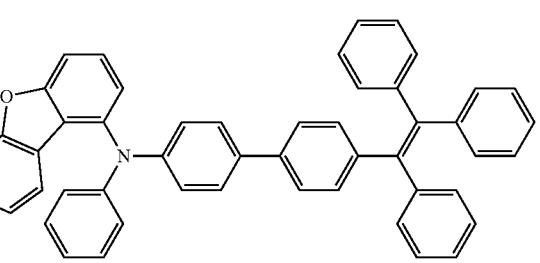
75
76

77
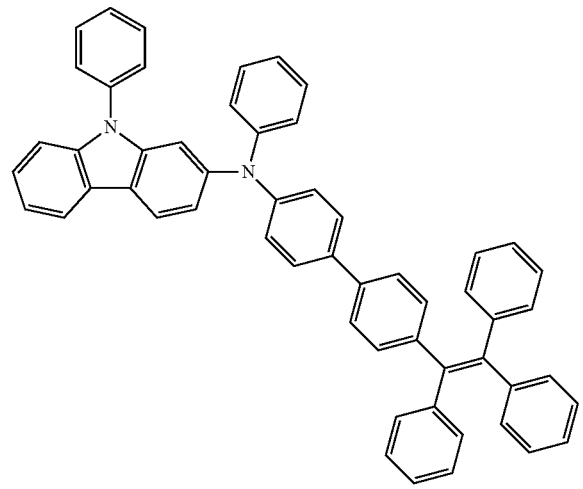
78
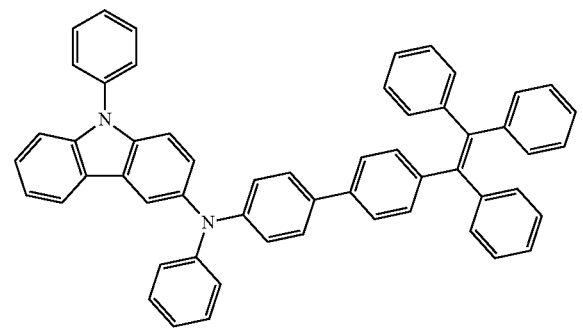
79
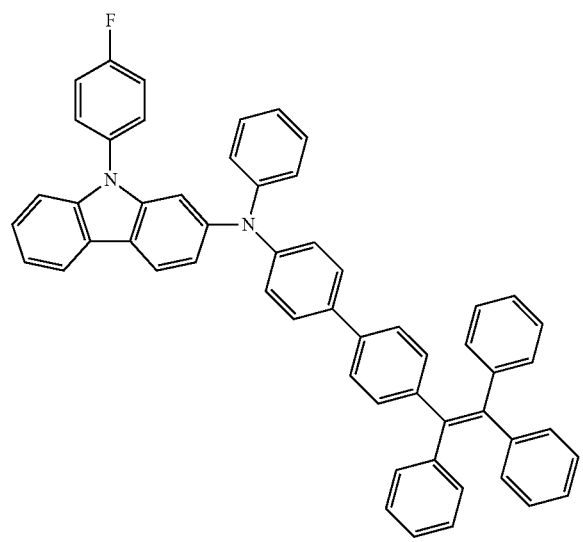
80
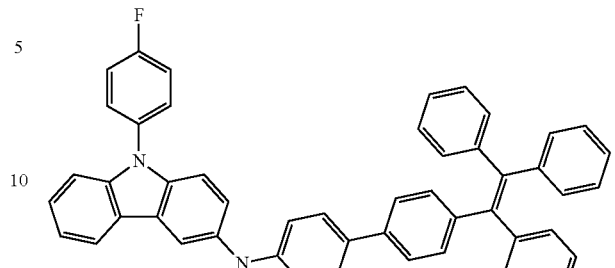
81
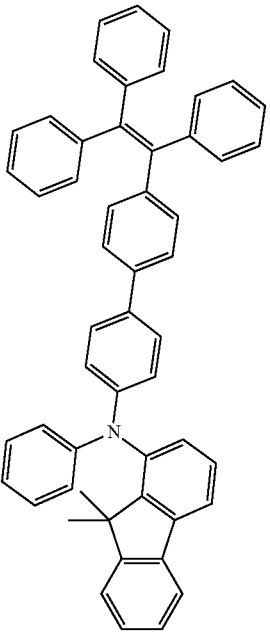
82
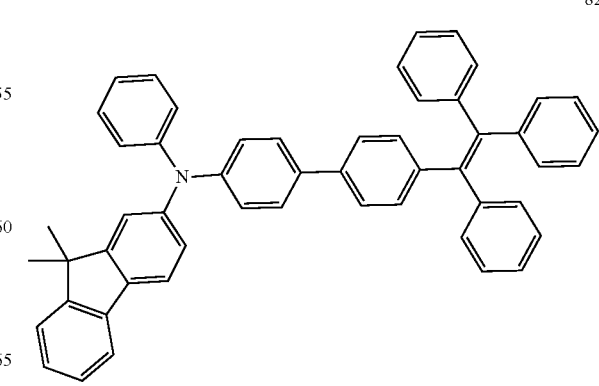

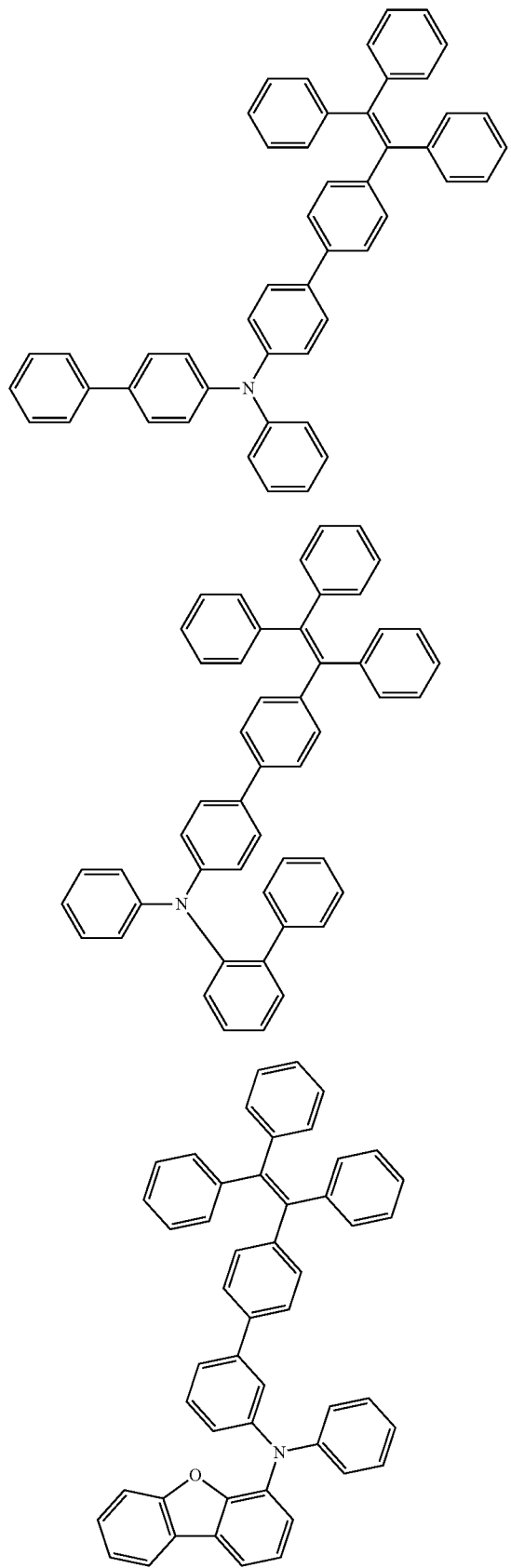
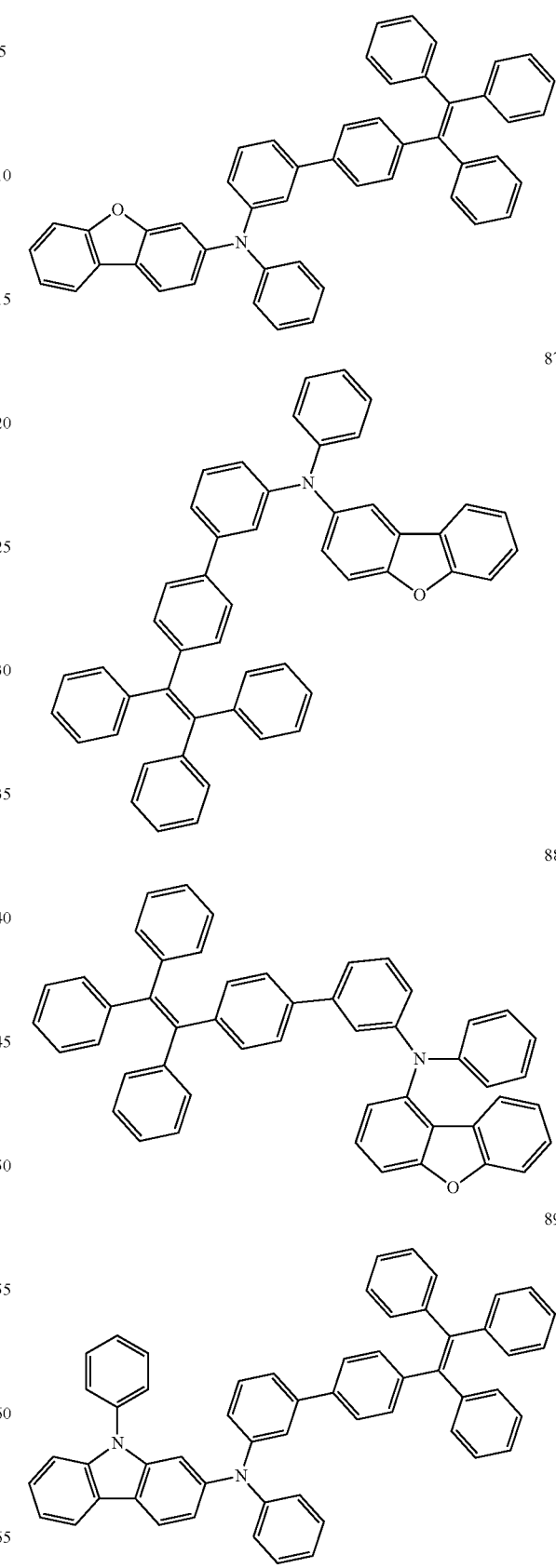

90
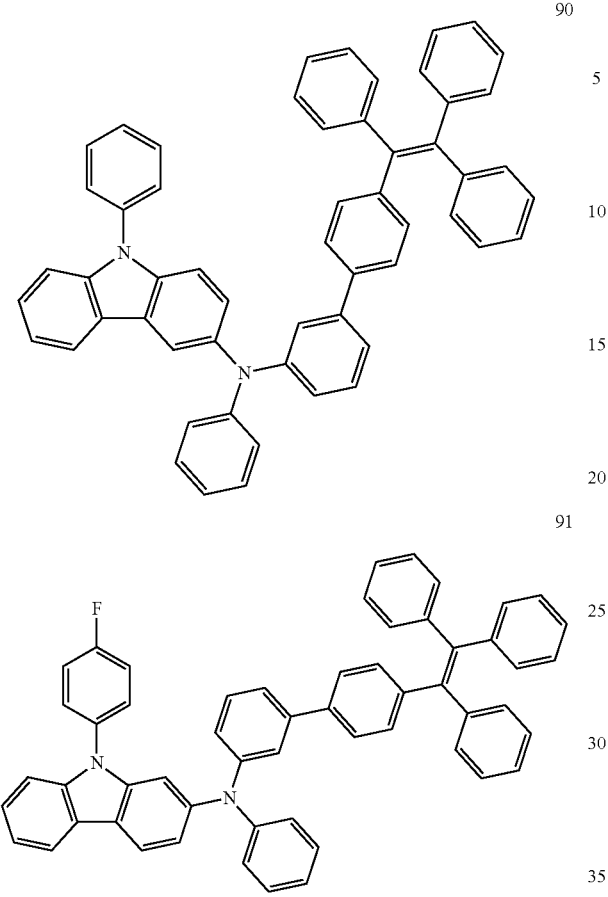
91
92
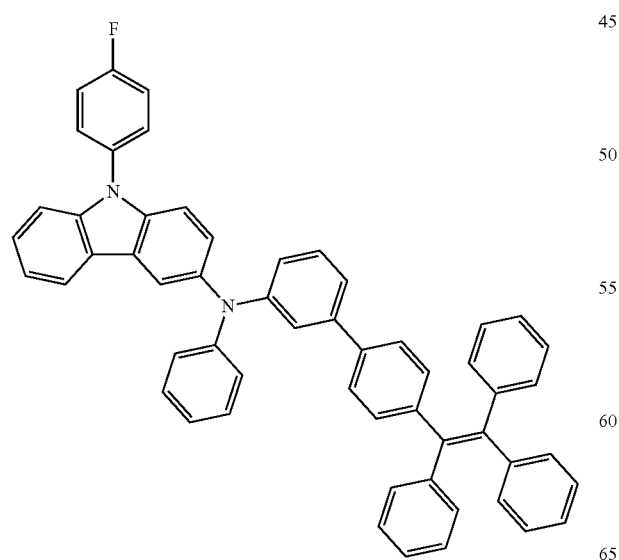
93
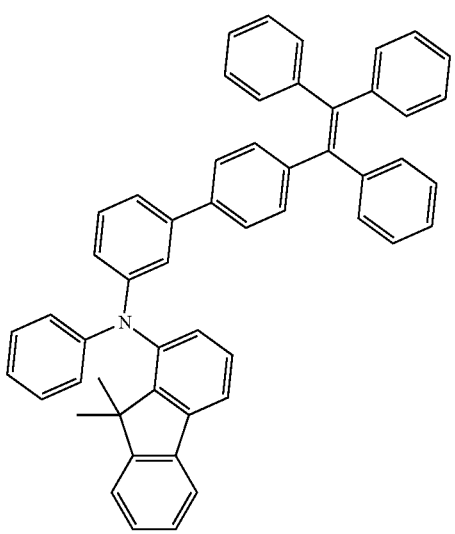
94
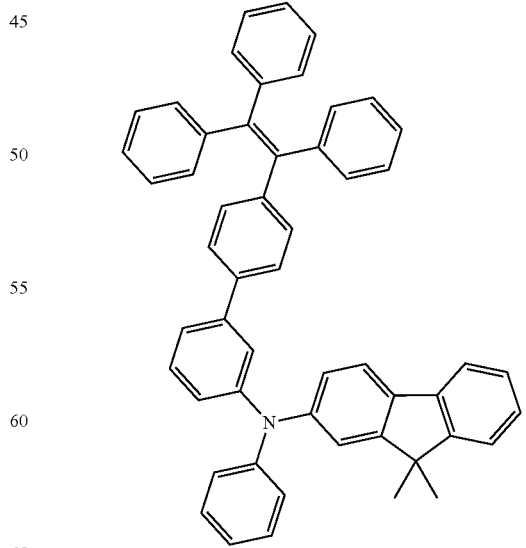

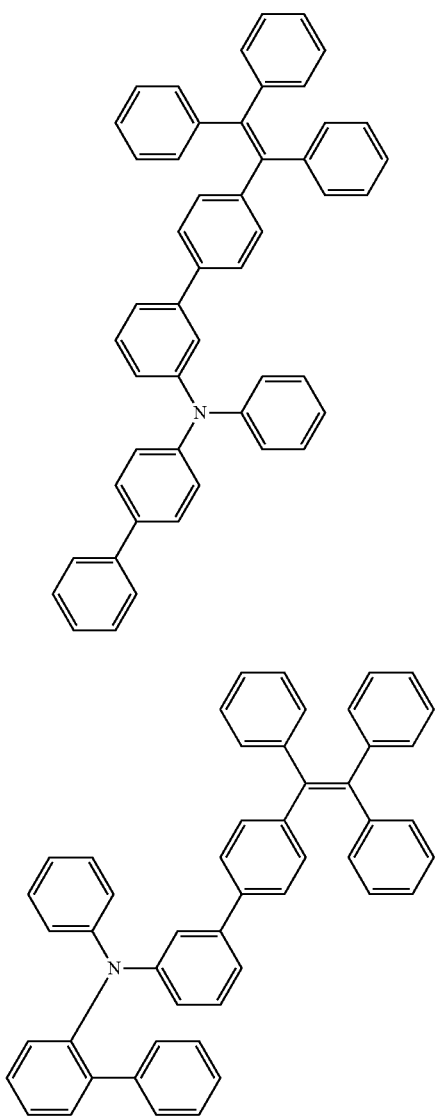
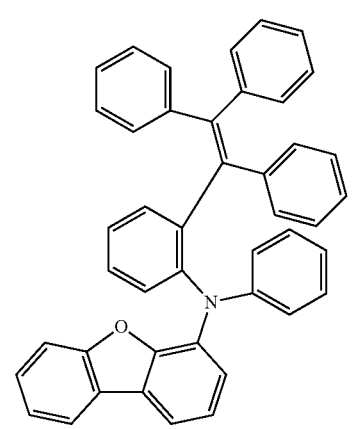
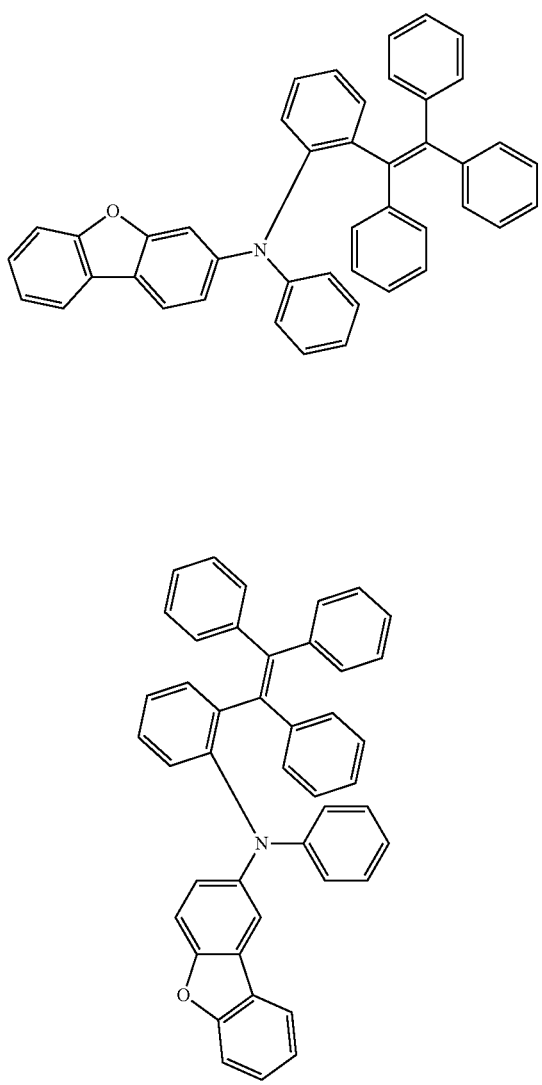

101
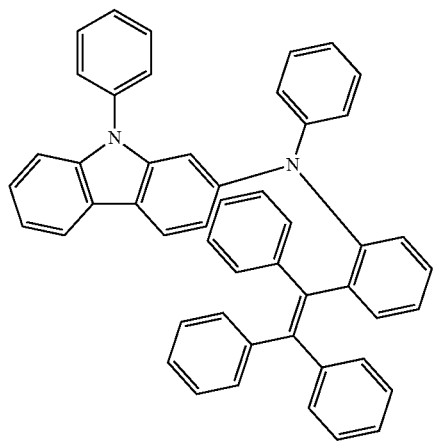
102
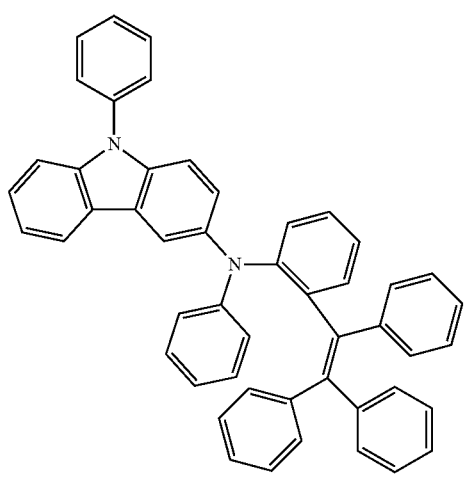
103
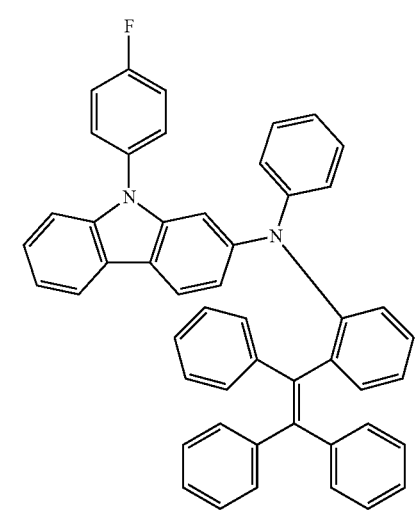
104
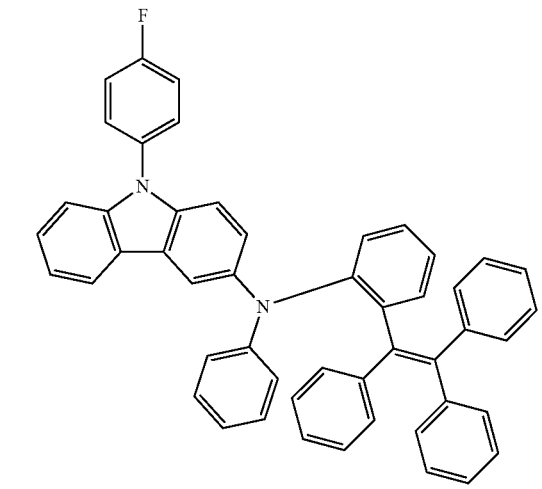
105
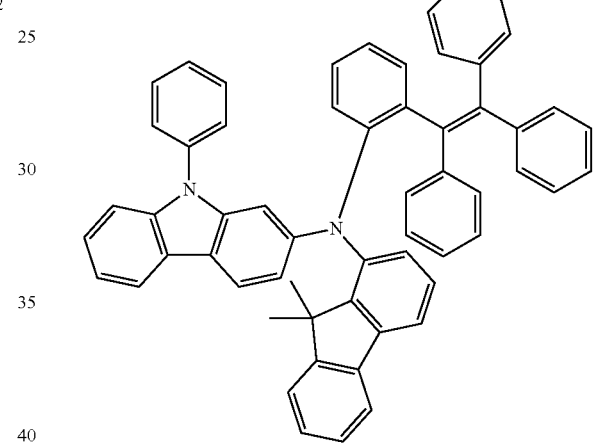
106
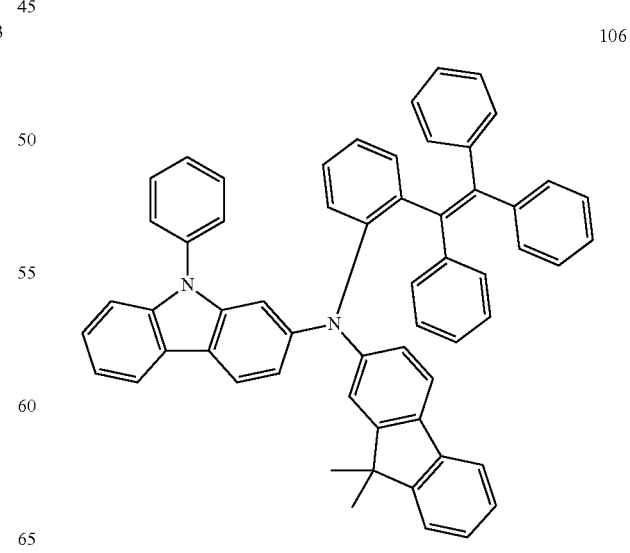

-continued
107
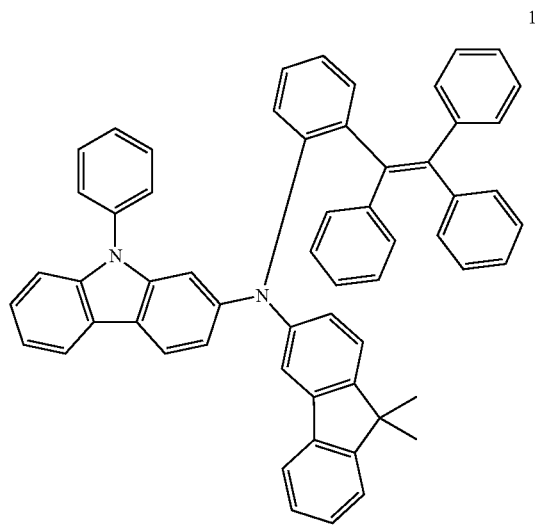
108
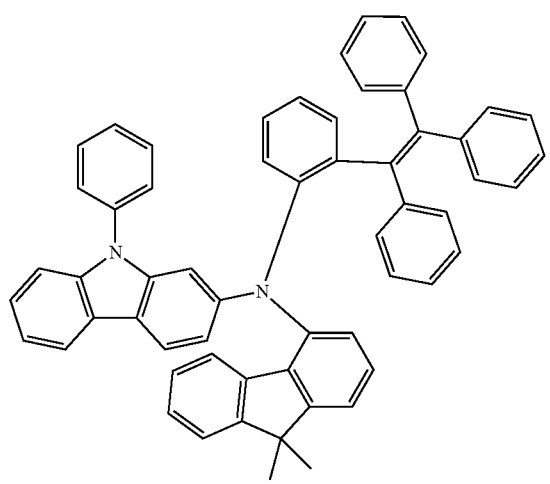
109
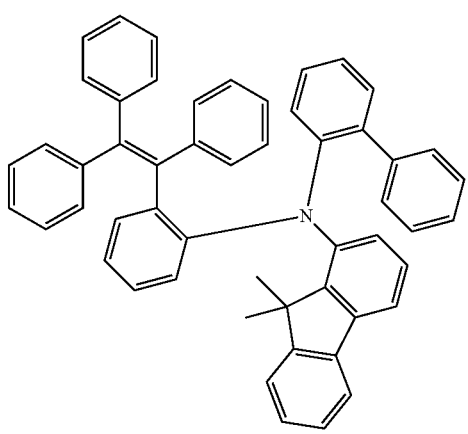
-continued
110
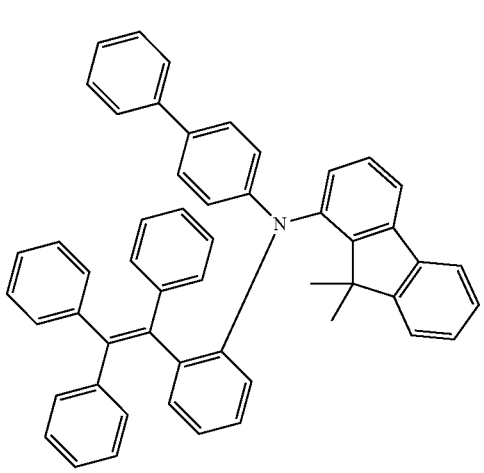
111
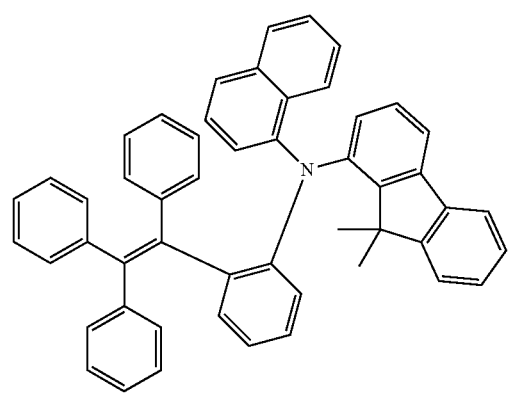
112
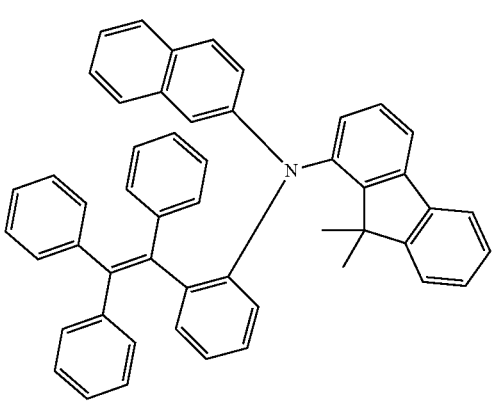

113
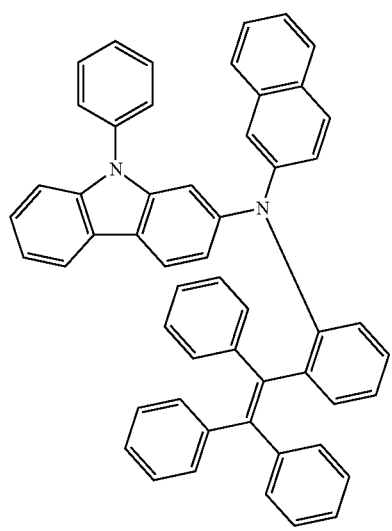
114
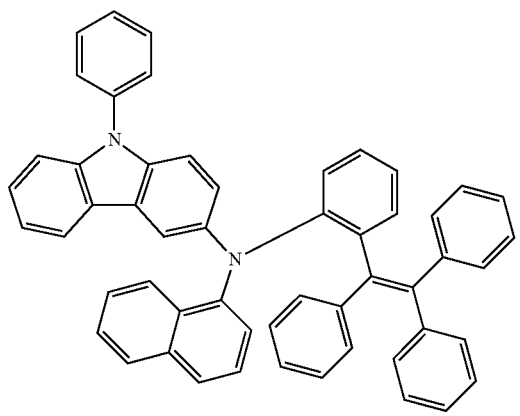
115
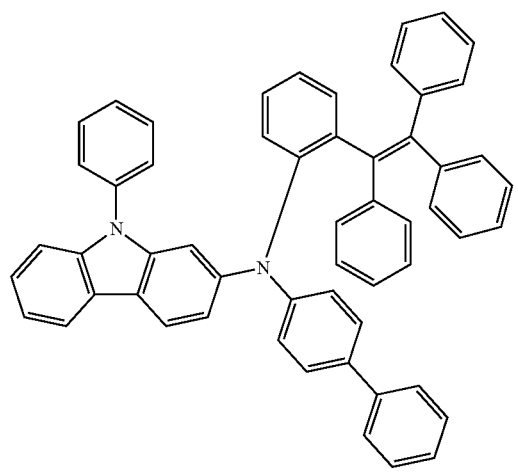
116
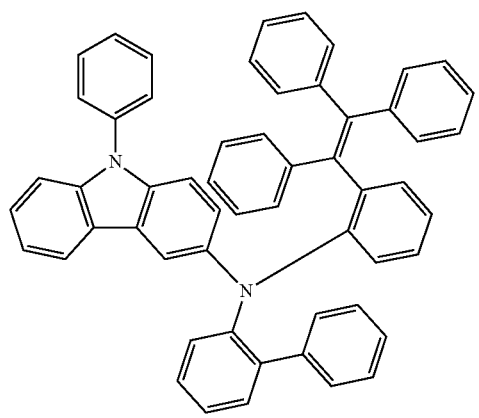
117
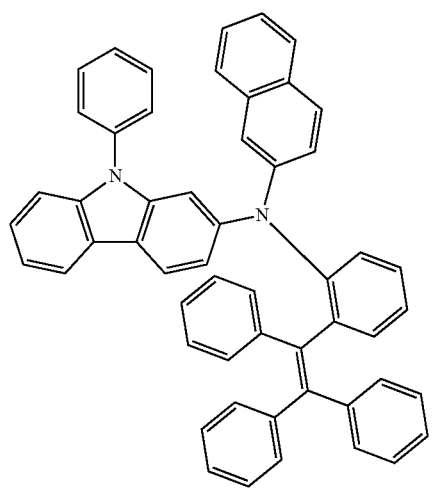
118
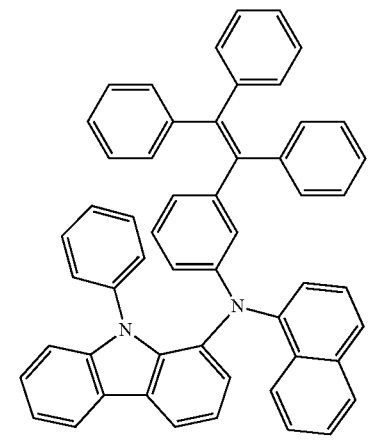

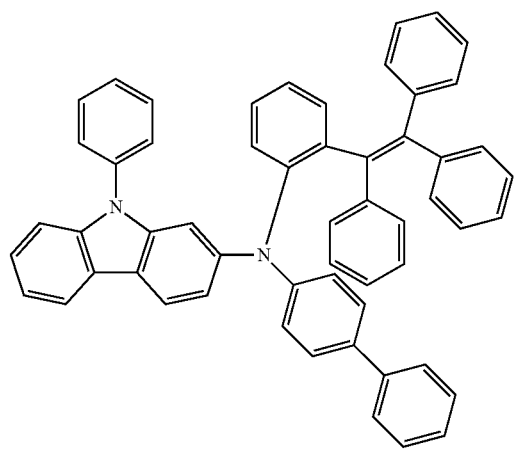
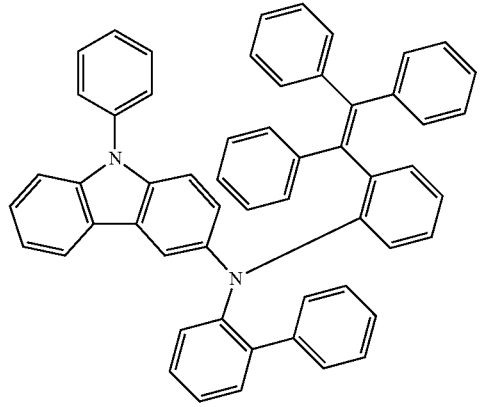
* * * * *